(12) United States Patent
Lee et al.

(10) Patent No.: US 7,298,648 B2
(45) Date of Patent: Nov. 20, 2007

(54) PAGE BUFFER AND MULTI-STATE NONVOLATILE MEMORY DEVICE INCLUDING THE SAME

(75) Inventors: Sung-Soo Lee, Sungnam-si (KR); Young-Ho Lim, Yongin-si (KR); Hyun-Chul Cho, Yongin-si (KR); Dong-Hyuk Chae, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 110 days.

(21) Appl. No.: 11/228,194

(22) Filed: Sep. 19, 2005

(65) Prior Publication Data

US 2006/0120152 A1    Jun. 8, 2006

(30) Foreign Application Priority Data

Nov. 19, 2004  (KR) ...................... 10-2004-0094888
Nov. 19, 2004  (KR) ...................... 10-2004-0094889

(51) Int. Cl.
    *G11C 16/04*    (2006.01)
(52) U.S. Cl. ........................... 365/185.03; 365/185.21; 365/185.17
(58) Field of Classification Search ........... 365/185.03, 365/185.21, 185.17
    See application file for complete search history.

(56) References Cited

U.S. PATENT DOCUMENTS 6,278,636 B1    8/2001    Lee
7,099,190 B2 *  8/2006    Noguchi et al. ....... 365/185.17
7,120,051 B2 * 10/2006    Gorobets et al. ...... 365/185.03
2003/0072175 A1  4/2003   Kawamura

FOREIGN PATENT DOCUMENTS

KR    1020030033679 A    5/2003

* cited by examiner

*Primary Examiner*—Huan Hoang
(74) *Attorney, Agent, or Firm*—Volentine & Whitt, PLLC

(57) ABSTRACT

According to one aspect, a memory cell array includes a bit line connected to a plurality of nonvolatile memory cells, where the nonvolatile memory cells are selectively programmable in any one of at least first, second, third and fourth threshold voltage states, and where the first, second, third and fourth threshold voltage states correspond to four different data values defined by first and second bits. A page buffer circuit stores a logic value as main latch data and is responsive to a main latch signal to selectively flip the logic value of the main latch data according to a voltage level of the bit line. A sub-latch circuit stores a logic value as sub-latch data and is responsive to a sub-latch signal to selectively flip the logic value of the sub-latch data according to the voltage level of the bit line. The memory device is operable in a read mode which reads the threshold voltage state of the non-volatile memory cells and a programming mode which programs the threshold voltage state of the non-volatile memory cells, wherein the page buffer circuit is selectively responsive to the sub-latch data to inhibit flipping of the logic value of the main latch data in the programming mode.

43 Claims, 30 Drawing Sheets

PAGE BUFFER AND MULTI-STATE NONVOLATILE MEMORY DEVICE INCLUDING THE SAME

BACKGROUND OF THE INVENTION

1. Field of the Invention

The present invention generally relates to semiconductor memory devices, and more particularly, the present invention relates to nonvolatile semiconductor memory devices and to methods of operating nonvolatile memory devices.

2. Description of the Related Art

The demand for electrically programmable and electrically erasable nonvolatile memory devices has increased dramatically in recent years. Such devices are at least partially characterized by the ability to maintain stored data even in the absence of supplied power. The use of so-called flash memories has become especially popular, particularly, but not exclusively, in the context of portable devices such as digital cameras, cell phones, personal data assistants (PDAs), and laptop computers. Flash memories, such as NAND-type flash memories, are capable of storing large amounts of data in a relatively small area.

As background discussion, the basic operating principles underlying flash memory cells and flash memory devices are presented below. However, it should be clearly understood that the discussion that follows is merely exemplary and does not in any way limit and/or define the scope of the present invention.

The operating principle of a flash memory cell will be described first with reference to FIGS. 1A through 1C. FIG. 1A illustrates a typical configuration in which a flash memory cell transistor is connected to word and bit lines of a memory device, FIG. 1B shows the circuit symbol of a flash memory cell transistor, and FIG. 1C shows the threshold voltage characteristics of a flash memory cell transistor.

Referring collectively to FIGS. 1A through 1C, a flash memory cell transistor includes a source region 4 and a drain region 5 located at the surface of a substrate 3. In this example, the substrate is P-type, and the source and drain regions 4 and 5 are N$^+$-type. A gate structure is aligned over a channel region defined between the source and drain regions 4 and 5. The gate structure includes a floating gate 1 and a control gate 2. Although not shown, a tunneling dielectric layer is interposed between the floating gate 1 and the surface of the substrate P-sub, and another thin oxide layer (or control dielectric) is interposed between the floating gate 1 and the control gate 2. In the illustrated example, the drain voltage Vd is supplied from a bit line BL, the control gate voltage Vcg is supplied from a word line WL, and the source voltage Vs is connected to a reference potential such as ground.

The threshold voltage (or voltages) of the flash memory cell transistor defines its stored logic value. That is, in the example of a single-bit cell transistor, when the flash memory cell transistor is in its initial state (also called an "erased" state), the threshold voltage Vth is relatively low as shown in FIG. 1C. In this state, the cell transistor is designated to have a logic value "1", which generally corresponds to the ON state of a conventional transistor device. On the other hand, when the cell transistor is in its "programmed" state (PGM), the threshold voltage Vth is relatively high. This high threshold voltage state is designated to have a logic value "0", which generally corresponds to the OFF state of a conventional transistor device.

In order to change (program) the cell transistor from its initial state to its programmed state, a process known as Fowler-Nordheim (FN) tunneling is utilized. Briefly, a relatively large positive potential difference is created between the control gate 2 and the substrate P-sub, and excited electrons within the channel on the surface of the substrate are caused to be pushed through and trapped in the floating gate 1. These negatively charged electrons act as a barrier between the control gate 2 and channel on the substrate, thus increasing the threshold voltage of the cell transistor as represented in FIG. 1C. The cell transistor can be brought back to its initial state by forming a large negative potential difference between the control gate 2 and the substrate P-sub, whereby resultant FN tunneling draws the trapped electrons back across the thin oxide layer between the floating gate 1 and substrate, thus removing the electron barrier and decreasing the threshold voltage Vth.

Multi-bit (or multi-state) nonvolatile memories are characterized by utilizing each cell transistor to store two or more bits of data simultaneously. FIG. 2 is a diagram for explaining the operation of an exemplary two-bit nonvolatile cell memory. The threshold voltages Vth of the large numbers of flash cell transistors found in flash memory devices generally exhibit bell curve distributions. In the example of FIG. 2, the cell transistor can be set in any one of four (4) different threshold distributions, i.e., a first state, a second state, a third state and a fourth state. Any cell transistor having a threshold voltage within the distribution defined by one of these four states is assigned a corresponding two-bit logic value, for example, "11", "10", "00" and "01" as shown in FIG. 2. The particular bit assignments illustrated in FIG. 2 are known in the art as "gray-coding."

As mentioned above, a cell transistor is said to be "programmed" when its threshold voltage is increased from its normally ON state (its erased state) to a threshold voltage of a higher state. In FIG. 2, the threshold voltage distribution to the far left of the diagram ("11") is the erased state. In two-bit programming of the cell transistor, two successive programming operations are executed, namely, a least significant bit (LSB) program mode, and a most significant bit (MSB) program mode. Examples of these LSB and MSB program modes are described below with reference to FIGS. 3-5.

Note first that the cell transistor is initially in its erased state, and accordingly, its initial logic value is "11" (FIG. 2). In this example, if the LSB of the data to be stored is "0", then a programming operation is executed to increase the threshold voltage of the cell transistor from the first state to the second state (FIG. 3). On the other hand, if the LSB of the data to be stored is "1", no programming is executed during the LSB program mode. Note here that the cell transistor is either in the first state or the second state after the LSB program mode.

Next the MSB of the data to be stored dictates operations in the MSB program mode. FIG. 4 illustrates the case where gray-coding has been adopted. Regardless of whether the cell transistor is in the first state or the second state after the LSB program mode, no programming is executed in the MSB program mode if the MSB of the data to be stored is "1". On the other hand, if the MSB of the data to be stored is "0", then programming occurs which is dependent on whether the cell transistor is in the first state or the second state after the LSB program mode. This is shown by the dashed lines appearing in FIG. 4. If the MSB of the data to be stored is "0", and if the cell transistor is in the first state after the LSB program mode, then programming is executed to bring the threshold voltage of the cell transistor from the first state to the fourth state. On the other hand, if the MSB of the data to be stored is "0", and if the cell transistor is in the second state after the LSB program mode, then programming is executed to bring the threshold voltage of the cell transistor from the second state to the third state.

FIG. 5 is similar to FIG. 4, except that binary coding has been adopted. In this case, the first through fourth threshold voltage states designate two-bit values of "11", "10", "01" and "00". Again, regardless of whether the cell transistor is in the first state or the second state after the LSB program mode, no programming is executed in the MSB mode if the MSB of the data to be stored is "1". On the other hand, if the MSB of the data to be stored is "0", then programming occurs which is dependent on whether the cell transistor is in the first state or the second state after the LSB program mode. This is shown by the dashed lines appearing in FIG. 5. If the MSB of the data to be stored is "0", and if the cell transistor is in the first state after the LSB program mode, then programming is executed to bring the threshold voltage of the cell transistor from the first state to the third state. On the other hand, if the MSB of the data to be stored is "0", and if the cell transistor is in the second state after the LSB program mode, then programming is executed to bring the threshold voltage of the cell transistor from the second state to the fourth state.

Reading of the multi-bit nonvolatile memory will be described next with reference to FIGS. 6 and 7. In particular, FIG. 6 illustrates the LSB read mode in which the logic value of the LSB of the stored data is determined. The LSB read mode involves a first LSB read operation and a conditional second LSB read operation. In the first LSB read operation, a first read voltage Vread1 is applied to the word line of cell transistor. If the cell transistor is turned ON as a result, then the cell transistor must be in the first state ("11"). If the cell transistor remains OFF, then a second LSB read operation is executed by applying a second read voltage Vread2 to the word line of the cell transistor. Here, if the cell transistor remains OFF during the second LSB read operation, the cell transistor must be in the fourth state ("01"). On the other hand, if the cell transistor turns ON during the second LSB read operation, then the LSB of the stored data is "0", but the MSB of the stored data remains unknown.

In the case of gray-coding, the MSB of the stored data can be detected by a single read operation. This is illustrated in FIG. 7 where the read operation is conducted by applying the third read voltage Vread3 to the word line of the memory cell. If the cell transistor turns ON, the MSB of the stored data is "1". If the cell transistor remains OFF, the MSB of the stored data is "0".

As should be apparent from the above, detection of the multiple bits of a multi-bit nonvolatile memory is quite complex when compared to the detection of a single-bit nonvolatile memory. Numerous challenges are encountered when designing and developing the circuitry needed to both program and read the multiple bits from individual cell transistors.

SUMMARY OF THE INVENTION

According to an aspect of the present invention, a multi-bit nonvolatile semiconductor memory device is provided which includes a memory cell array, a page buffer circuit, and a sub-latch circuit. The memory cell array includes a bit line connected to a plurality of nonvolatile memory cells, where the nonvolatile memory cells are programmable into more than two states in order to store more than one bit of data. The page buffer circuit stores a logic value as main latch data and is responsive to a main latch signal to selectively flip the logic value of the main latch data according to a voltage level of the bit line. The sub-latch circuit stores a logic value as sub-latch data and is responsive to a sub-latch signal to selectively flip the logic value of the sub-latch data according to the voltage level of the bit line. The memory device is operable in a read mode which reads the threshold voltage state of the non-volatile memory cells and a programming mode which programs the threshold voltage state of the non-volatile memory cells, wherein the page buffer circuit is selectively responsive to the sub-latch data to inhibit flipping of the logic value of the main latch data in the programming mode through the bit line.

According to another aspect of the present invention, a multi-bit nonvolatile semiconductor memory device is provided which includes a memory cell array, a main buffer circuit, and a sub-latch circuit. The memory cell array includes a bit line connected to a plurality of nonvolatile memory cells, wherein the nonvolatile memory cells are programmable more than one threshold voltage state in order to store more than one bit of data. The page buffer circuit stores a logic value as main latch data and is responsive to a main latch signal to selectively flip the logic value of the main latch data according to a voltage level of the bit line. The sub-latch circuit stores a logic value as sub-latch data and is responsive to a sub-latch signal to selectively flip the logic value of the sub-latch data according to the voltage level of the bit line. The page buffer circuit and the sub-latch circuit are located at opposite sides of the memory cell array.

According to still another aspect of the present invention, a non-volatile memory device is provided which includes a memory cell array having a bit line connected to a plurality of nonvolatile memory cells, first and second voltage bias circuits which preset a voltages of the bit line and which are connected to the bit line on opposite sides of the memory cell array, and a page buffer circuit which is connected to the bit line and which stores data read from and programmed into the nonvolatile memory cells.

According to yet another aspect of the present invention, a non-volatile semiconductor memory device is provided which includes a memory cell array having a bit line connected to a plurality of non-volatile memory cells, a main sensing latch unit which includes a main latch unit and a main sensing response unit, a sub-latch unit which includes a sub-latch circuit, a first bit line selection circuit which selectively connects the main sensing latch unit to the bit line, and a second bit line selection circuit which selectively connects the sub-latch unit to the bit line.

According to another aspect of the present invention a method of operating a multi-bit nonvolatile semiconductor memory device is provided which includes storing a logic value as main latch data in a first latch, storing a logic value as sub-latch data in a second latch according to the voltage level of the bit line, setting a threshold voltage state of at least one non-volatile memory cell connected to the bit line in the programming mode, and selectively inhibiting flipping of the logic value of the main latch data after setting the threshold voltage state according to the voltage level of the bit line stored in the sub-latch data of the second latch.

According to another aspect of the present invention, a method of operating a multi-bit nonvolatile semiconductor memory device is provided which includes a first bit program operation which includes programming a selected memory cell to a threshold voltage corresponding to a first data state with an externally supplied first bit data value, an initial read storage operation which includes driving the memory cell programmed in the first bit program operation to a first reference voltage to store sub-latch data corresponding to the first bit data value in a sub-latch block, a second bit program operation which includes storing main latch data corresponding to a second bit data value used to program the memory cell to the fourth data state in a main buffer block and programming the memory cell to the fourth data state after the initial read storage operation, thereby programming the memory cell to a threshold voltage corresponding to the third data state, a primary verification read operation which includes driving the memory cell with a second reference voltage so as to reflect a second bit data value of the memory cell on the main sensing node after the second bit program operation, a sub-latch driving program operation which includes driving the sub-latch block so as to reflect the sub-latch data stored in the initial read storage operation on the main sensing node, a primary main latch flip operation which includes flipping the main latch data according to a voltage level of the main sensing node in the primary verification read operation, wherein the flipping of the main latch data is selectively inhibited according to the voltage level of the main sensing node in the sub-latch driving operation, a secondary verification read program operation which includes driving the memory cell with a third reference voltage so as to reflect the second bit data value of the memory cell on the main sensing node after the primary main latch flip operation, and a secondary main latch flip operation which includes flipping the main latch data according to the voltage level of the main sensing node in the secondary verification read operation.

According to yet another aspect of the present invention, a method of operating a multi-bit nonvolatile semiconductor memory device is provided which includes, a first bit program operation which includes programming a selected memory cell with an externally supplied first bit data value, an initial read storage operation which includes driving the memory cell programmed in the first bit program step to a first reference voltage to store sub-latch data corresponding to the first bit data value in the sub-latch block, a second bit program operation which includes driving the memory cell to program an externally supplied second bit data value in the memory cell after the initial read storage operation, a primary verification read operation which includes driving the memory cell with a second reference voltage so as to reflect a second bit data value of the memory cell on the main sensing node after the second bit program operation, a sub-latch driving operation which includes driving the sub-latch block so as to reflect the sub-latch data, stored in the initial read storage step, on the main sensing node, and a primary main flip operation which includes selectively flipping the main latch data according to the voltage level of the main sensing node obtained in the primary verification read operation and the sub-latch driving operation.

According to still another aspect of the present invention, a method of operating a multi-bit nonvolatile semiconductor memory device is provided which includes a first bit program operation which includes programming a selected memory cell with an externally supplied first bit data value, an initial read storage operation which includes driving the memory cell programmed at the first bit program operation to a first reference voltage to store sub-latch data corresponding to the first bit data value in the sub-latch block, a second bit program which includes driving the memory cell to program an externally supplied second bit data value in the memory cell after the initial read storage operation, a primary verification read operation which includes driving the memory cell with a second reference voltage so as to reflect the second bit data value of the memory cell on the main sensing node after the second bit program operation, a sub-latch driving operation which includes driving the sub-latch block so as to reflect the sub-latch data stored in the initial read storage step on the main sensing node, a primary main flip operation which includes selectively flipping the main latch data according to the voltage level of the main sensing node obtained in the primary verification read operation and the sub-latch driving operation, a secondary verification read operation which includes driving the memory cell with a third reference voltage so as to reflect the second bit data value of the memory cell on the main sensing node after the primary main flip operation, and a secondary main flip operation which includes selectively flipping the main latch data according to the voltage level of the main sensing node obtained in the secondary verification read step.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF THE PREFERRED EMBODIMENTS

The present invention will now be described by way of preferred but non-limiting embodiments of the invention.

Figure 8:
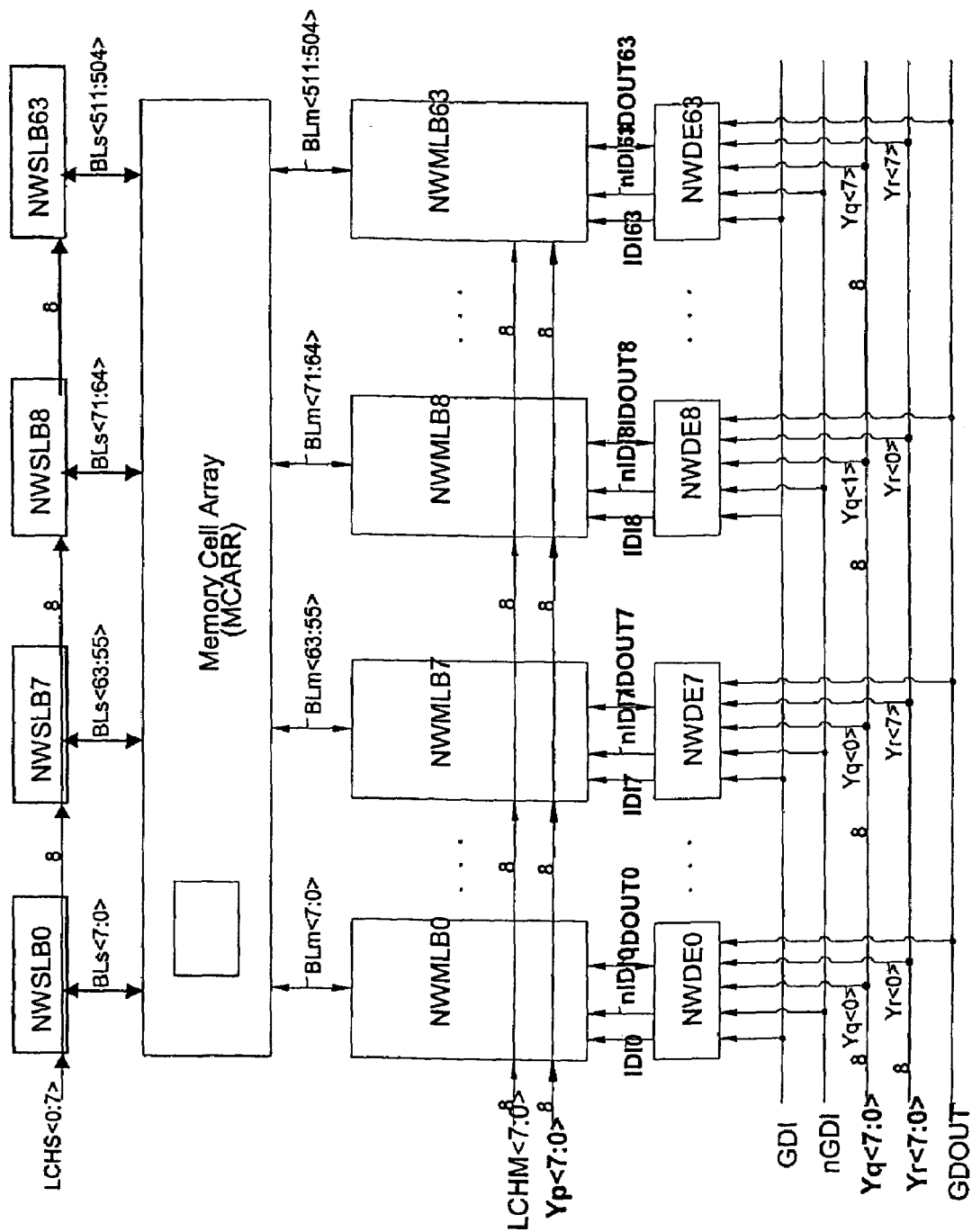
FIG. 8 is a schematic diagram of a multi-bit nonvolatile memory device according to an embodiment of the present invention.

FIG. 8 is a schematic block diagram of a nonvolatile semiconductor memory device according to an embodiment of the present invention.

Referring to FIG. 8, the nonvolatile semiconductor memory device of this example includes a memory cell array MCARR, main latch blocks NWMLB<63:0>, sub-latch blocks NWSLB<63:0>, first and second global input lines GDI and nGDI, a global output line GDOUT, y address signal lines Yp<7:0>, Yq<7:0> and Yr<7:0>, main read latch signal lines LCHM<7:0>, sub-read latch signal lines LCHS<7:0>, and page buffer decoders NWDE<63:0>.

The memory cell array MCARR includes a matrix array of memory cells, word lines WL and bit lines BL. In the example of this embodiment, the memory cells are NAND flash memory cell transistors.

Internal input lines IDI<63:0> and nIDI<63:0>, and internal output lines IDOUT<63:0>, are connected between the page buffer decoders NWDE<63:0> and corresponding main latch blocks NWMLB<63:0>.

The first global input line GDI and the second global input line nGDI transmit input and control data of opposite logic states during predetermined operational intervals, such as a read mode, a program mode and an erase mode. As will be explained in more detail later, each of the page buffer decoders NWDE<63:0> decodes the data GDI and nGDI, together with the y address data Yq<7:0> and Yr<7:0>, to output the data of the internal input lines IDI<63:0> and nIDI<63:0>.

Also, each of the page buffer decoders NWDE<63:0> provides data corresponding to the data on the internal output lines IDOUT<63:0> to the global output line GDOUT.

Each pair of main latch blocks NWMLB<63:0> and sub-latch blocks NWSLB<63:0> function together as a page buffer block of the multi-bit nonvolatile memory.

Figure 9:
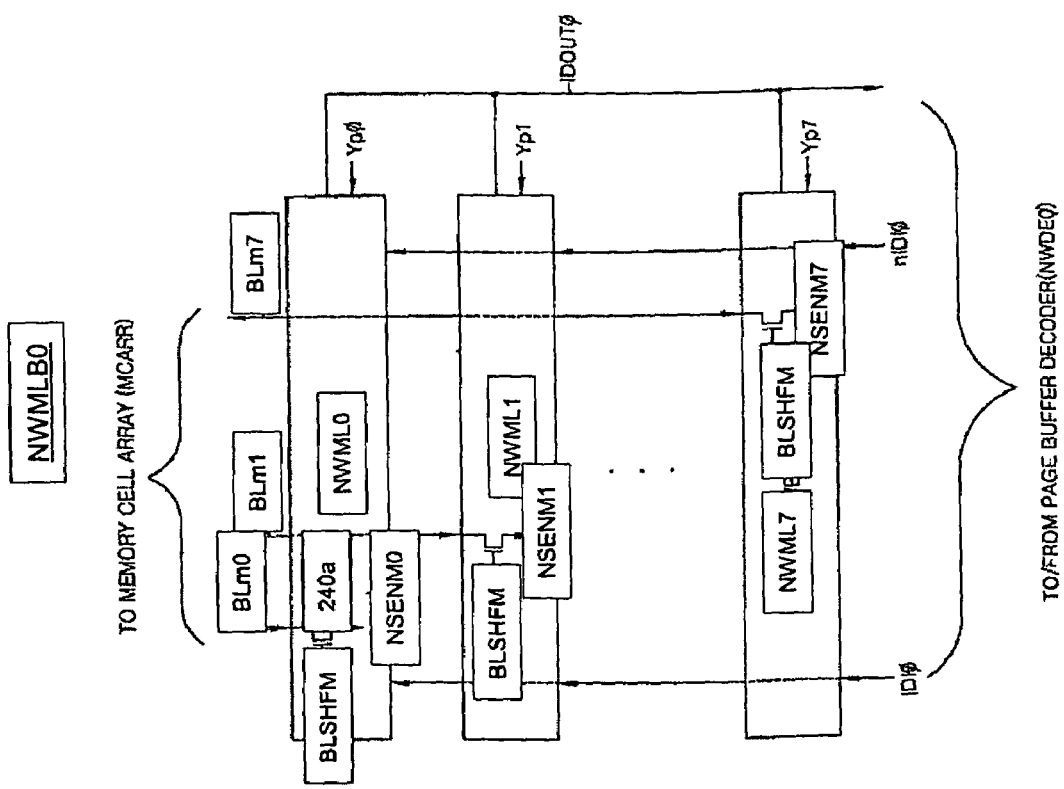
FIG. 9 is a schematic diagram of a main latch block illustrated in FIG. 8 according to an embodiment of the present invention.

Referring to FIG. 9, each main latch block NWMLB includes a plurality of main latch circuits NWML. That is, in the example of FIG. 9, the main latch block NWMLB0 includes eight (8) main latch circuits NWML<7:0> juxtaposed between a page buffer decoder NWDE0 and the memory cell array MCARR. In particular, each of the main latch circuits NWML<7:0> is connected to the page buffer decoder NWDE0 via internal input lines IDI0 and nIDI0 and internal output line IDOUT0, and each of the latch circuits NWML<7:0> is further connected to the memory cell array MCARR via main bit lines BLm<7:0>. Also, as will be explained in more detail later, each of the main latch circuits NWML<7:0> includes a transistor 240a which is gated to a main bit line shutoff signal BLSHFM. Each transistor 240a is connected between the main bit lines BLm<7:0> and respective main sense nodes NSENM<7:0>.

Figure 10:
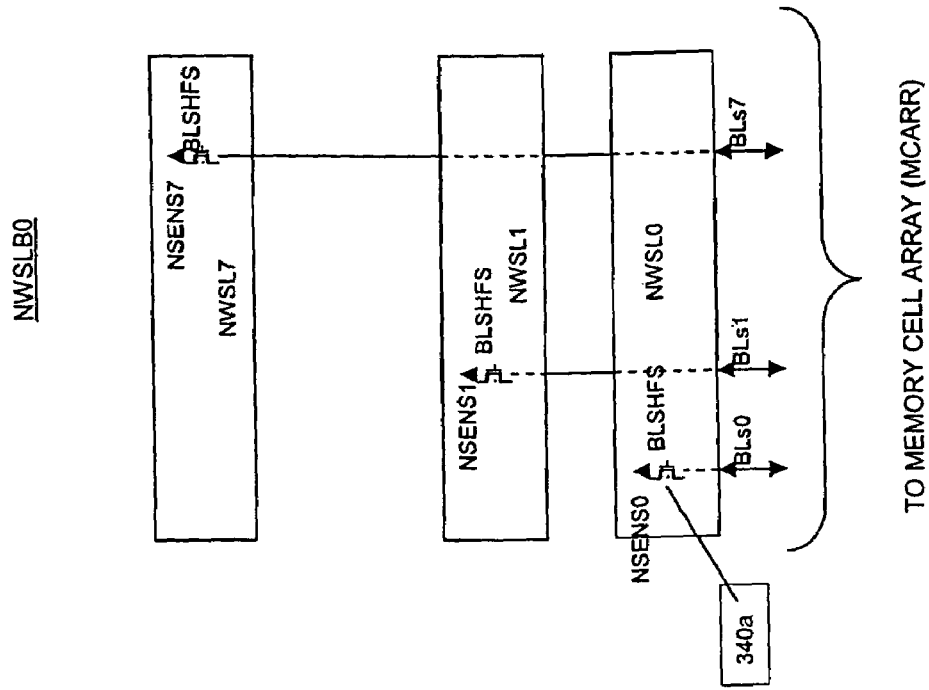
FIG. 10 is a schematic diagram of a sub-latch block illustrated in FIG. 8 according to an embodiment of the present invention.

Referring to FIG. 10, each sub-latch block NWSLB includes a plurality of sub latch circuits NWSL. That is, in the example of FIG. 10, the sub-latch block NWSLB0 includes eight (8) sub-latch circuits NWSL<7:0> connected to the memory cell array MCARR. As shown, each of the sub-latch circuits NWSL<7:0> is connected to the memory cell array MCARR via sub-bit lines BLs<7:0>. Also, as will be explained in more detail later, each of the sub-latch circuits NWSL<7:0> includes a transistor 340a which is gated to a sub-bit line shutoff signal BLSHFS. Each transistor 340a is connected between the sub-bit lines BLs<7:0> and respective sub-sense nodes NSENS<7:0>.

Figure 11:
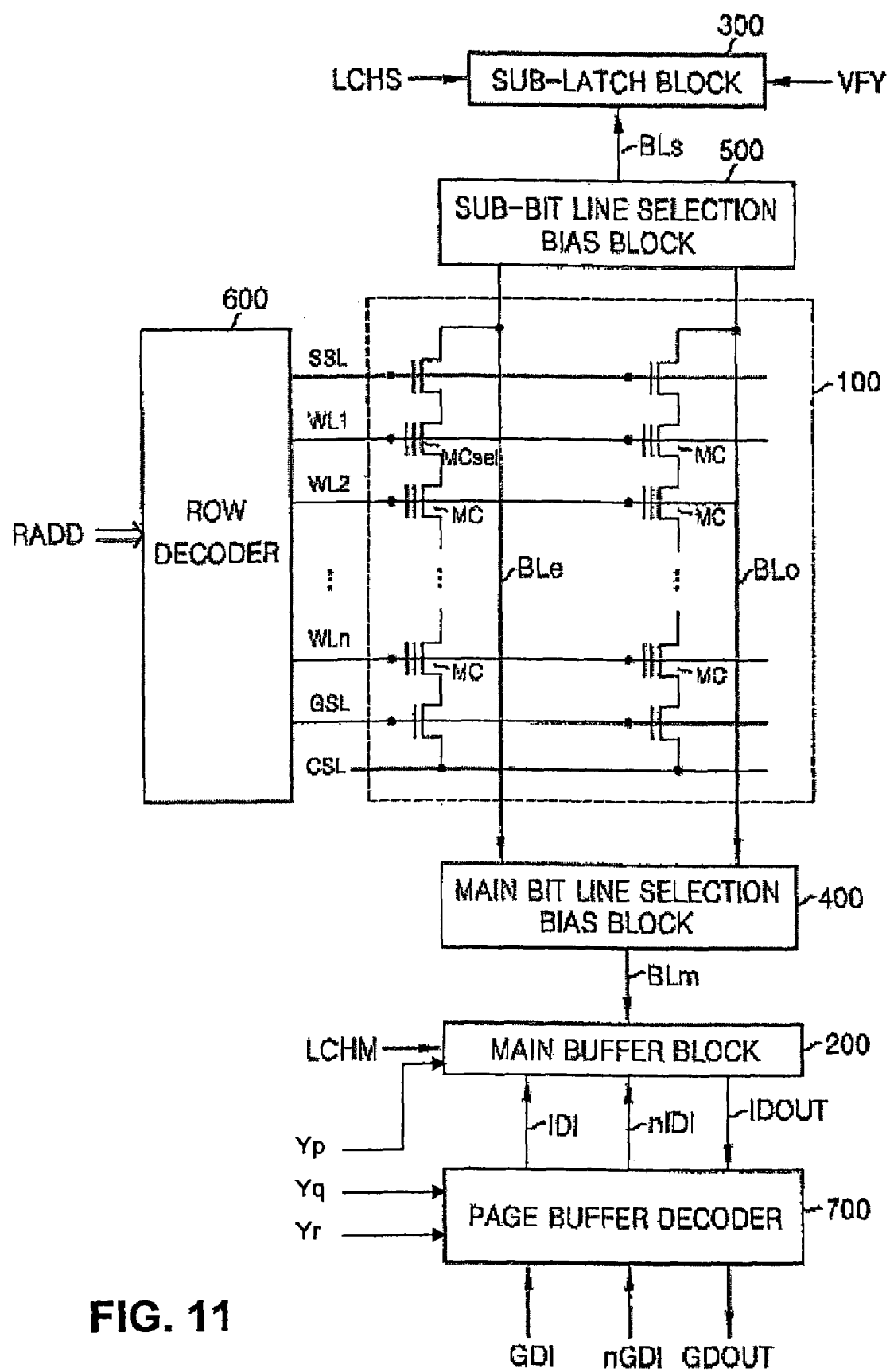
FIG. 11 is a schematic block diagram of a portion of a multi-bit nonvolatile memory device according to an embodiment of the present invention.

FIG. 11 is a schematic block diagram of circuitry associated with a single bit line BL of the multi-bit nonvolatile memory device of FIGS. 8 through 10. Illustrated in FIG. 11 are a memory cell array 100 (corresponding to the memory cell array MCARR of FIG. 8), a main buffer block 200 (corresponding to one of the main latch circuits NWML of FIG. 9), a sub-latch block 300 (corresponding to one of the sub-latch circuits NWSL of FIG. 10), a main bit line selection bias block 400, a sub-bit line selection bias block 500, and a row decoder 600. It is noted that the main bit line selection bias block 400 and the sub-bit line selection bias block are not shown in FIG. 8, as these block may optionally be considered as forming part of the memory cell array MCARR of FIG. 8. Also, for simplicity, the row decoder 600 is not shown in FIG. 8.

NAND flash memories are characterized by serially connected strings of flash memory cell transistors, where multiple parallel strings constitute a memory block of the flash memory. Each string is comprised of a plurality of flash memory cell transistors connected in series along a bit line BL in the memory block, and word lines WL are connected to the control gates of each respective row of cell transistors in the memory block. For example, a flash memory device may contain 16 or 32 cell transistors in each string, and 4224 strings (B/L0 . . . B/L4223) in each memory block.

FIG. 11 illustrates two strings of memory cells MC each storing and outputting data through a respective even bit line BLe or odd bit line BLo. That is, according to the example of the present embodiment, each bit line BL is made up of an even bit line BLe and an odd bit line BLo. Access to these odd and even bit lines BLe and BLo will be explained in more detail later.

At opposite ends of each string are string select transistors having control gates which receive a string select signal SSL and a ground select signal GSL. Generally, the select signals SSL and GSL are utilized in reading and programming of the cell transistors. Further, at the end of each string is a common source line CSL which sets a source line voltage of the cell transistor strings of each memory block. As shown, the word line signals WL<n:1> and select signals SSL and GSL are supplied from a row decoder 600 which decodes row address signals RADD.

Referring still to FIG. 11, connected at opposite ends of the bit lines BLe and BLo are the main bit line selection bias block 400 and the sub-bit line selection bias block 500. Main bit lines BLm extend between the main buffer block 200 and the main bit line selection bias block 400, while sub-bit lines BLs extend between the sub-latch block 300 and the sub-bit line selection bias block 500. The main buffer block 200 is responsive to a main latch signal LCHM and y address signal Yp to transmit/receive data on the main bit line BLm and to transmit data on the internal output line IDOUT. The page buffer decoder 700 supplies data on the internal input data lines IDI and nIDI to the main buffer block 200 based on the global input data signals GDI and nGDI and y address data Yq and Yr. Further, the page buffer decoder 700 supplies data to the global output line GDOUT corresponding to data on the internal output data line IDOUT. Finally, the sub-latch block 300 is responsive to a sub-latch signal and a verification signal VFY to transmit and receive data on the sub-bit line BLs.

Figure 12:
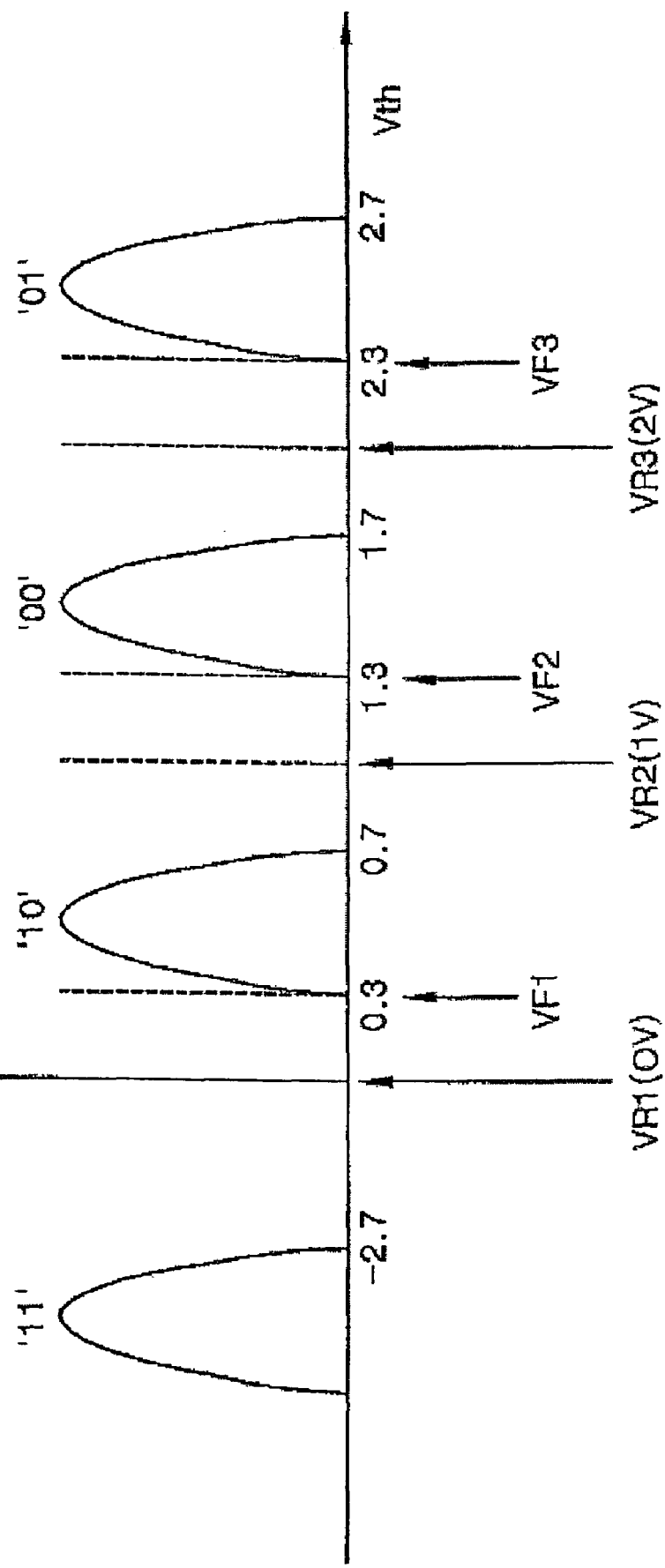
FIG. 12 is a threshold voltage distribution diagram for a multi-bit nonvolatile memory device according to an embodiment of the present invention.

Each of the blocks illustrated in FIG. 11 will be described in more detail below. Initially, however, attention is directed to FIG. 12 for an explanation of the cell transistor threshold voltage distributions which constitute the various states of the multi-bit nonvolatile memory of an embodiment of the present invention. It should be understood that the voltage values presented in FIG. 12 are merely exemplary.

In the example of the present embodiment, a logic value stored in each cell transistor corresponds to at least one of four threshold voltage distribution states. Namely, as shown in FIG. 12, the examples described herein adopt a graycoding scheme in which two-bit logic values of 11, 10, 00 and 01 are respectively designated based on four successive threshold voltage distributions (i.e., four different data states).

In the example of this embodiment, the threshold voltage ranges associated with each data state are shown in TABLE 1.

TABLE 1

| Data State | Threshold Voltage Range |
| --- | --- |
| First data state | −2.7 V or less |
| Second data state | 0.3 V~0.7 V |
| Third data state | 1.3 V~1.7 V |
| Fourth data state | 2.3 V~2.7 V |

Also, in the example of this embodiment, each data state is designated to be composed of a first bit data value and a second bit data value, where the first bit data value is a Least Significant Bit (LSB) data value and the second bit data value is a Most Significant Bit (MSB) data value. These designations are shown below in TABLE 2.

TABLE 2

| Data State | First bit data value (LSB) | Second bit data value (MSB) | Combined data value |
| --- | --- | --- | --- |
| First data state | 1 | 1 | 11 |
| Second data state | 0 | 1 | 10 |
| Third data state | 0 | 0 | 00 |
| Fourth data state | 1 | 0 | 01 |

As shown in TABLE 2, the first and fourth data states have the same first bit data value (that is, "1"), and the second and third data states have the same first bit data value (that is, "0"). Further, the first and second data states have the same second bit data value (that is, "1"), and the third and fourth data states have the same second bit data value (that is, "0").

Still referring to FIG. 12, first, second and third read voltages VR1, VR2 and VR3 are applied to the word lines WL to determine the data state of the cell transistor, i.e., to determine which two-bit value is being stored in the cell transistor. The read voltages are set in the intervals between the threshold voltage distributions of the data states, and in the example of this embodiment, the read voltages VR1, VR2 and VR3 are 0V, 1V and 2V, respectively.

For example, assume a read operation where the third read voltage VR3 is applied to a word line WL1 connected to a selected memory cell MCsel. In this case, if the selected memory cell MCsel is programmed to a data state of "11", "10" or "00", the memory cell MCsel will be turned ON in response to the third read voltage VR3 and the corresponding bit line BL will be driven to the ground voltage VSS. In contrast, if the memory cell MCsel is programmed to a data state "01", the memory cell MCsel will remain OFF and the corresponding bit line will maintain its initial voltage state. As will be explained in more detail later, the read voltages VR1, VR2 and VR3 are selectively applied to the selected word line WL1 during a read operational mode to determine the stored data state of the selected memory cell MCsel.

Also depicted in FIG. 12 are first, second and third verification read voltages VF1, VF2 and VF3. As will be discussed in more detail later, these voltages are utilized in verification read operations that are executed to confirm correct programming of the first and second bit data values in the selected memory cell MCsel. The verification read voltages VF1, VF2 and VF3 are set close to the minimum threshold voltages of the second through fourth threshold voltage distributions, respectively. In the example of this embodiment, the verification read voltages VF1, VF2 and VF3 are about 0.3V, 1.3V and 2.3V, respectively.

Figure 13:
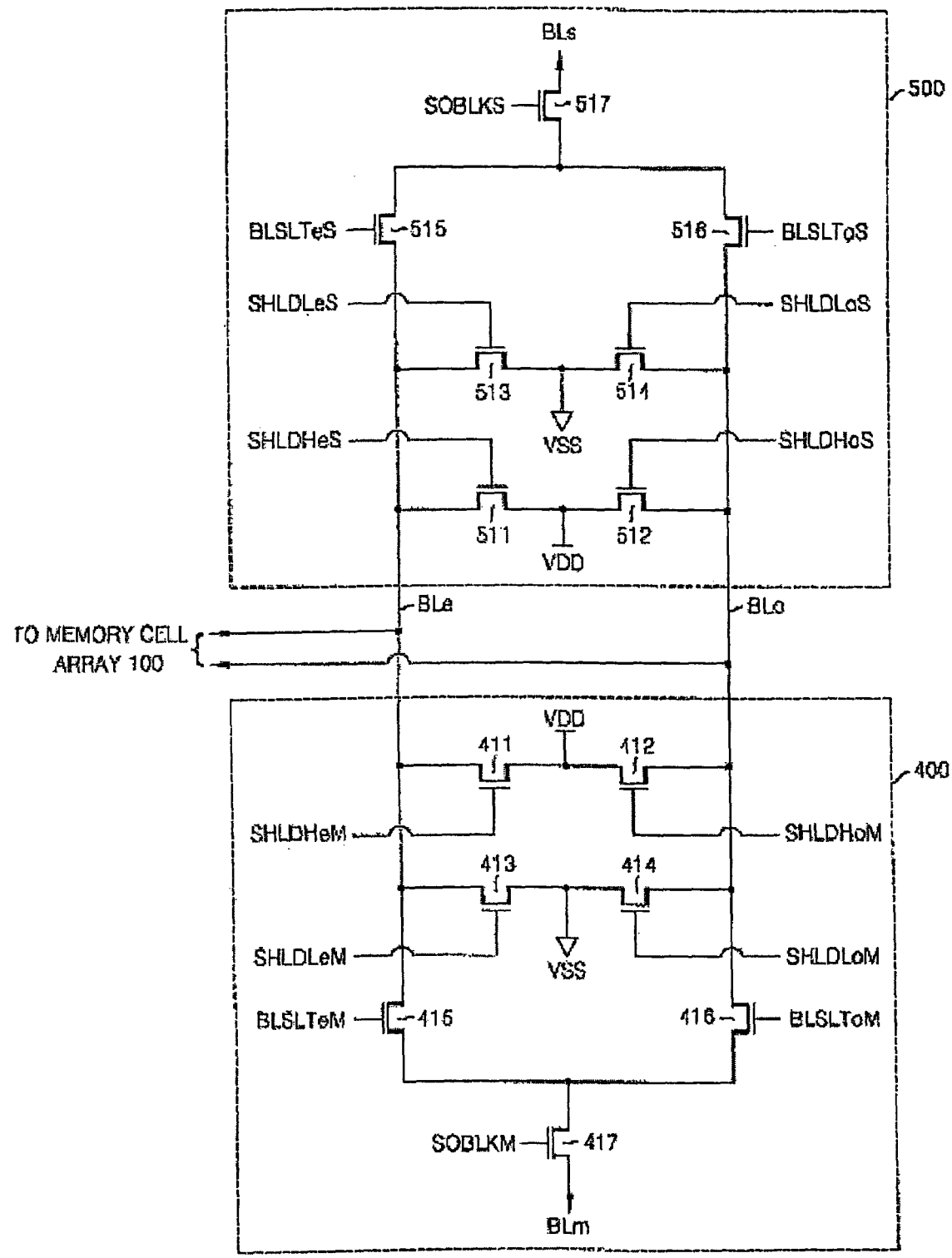
FIG. 13 is a circuit diagram of a main bit line selection bias block and a sub-bit line selection bias block of the multi-bit nonvolatile memory device of FIG. 11 according to an embodiment of the present invention.

Reference is now made to FIG. 13 which illustrates examples of the main bit line selection bias block 400 and the sub-bit line selection bias block 500 shown in FIG. 11. These blocks function to adjust the even bit line BLe and the odd bit line BLo to suitable voltages during read, program and erase operational modes.

The main bit line selection bias block 400 of this example includes high voltage NMOS transistors 411 to 417. The transistors 411 and 412 are gated to a main high even shielding control signal SHLDHeM and a main high odd shielding control signal SHLDHoM, respectively, so as to selectively apply the supply voltage VDD to the even bit line BLe and the odd bit line BLo. Similarly, the transistors 413 and 414 are gated to a main low even shielding control signal SHLDLeM and a main low odd shielding control signal SHLDLoM, respectively, so as to selectively apply the supply voltage VSS to the even bit line BLe and the odd bit line BLo. Transistors 415 and 416 are used in the selection of either the even bit line BLe or the odd bit line BLo. As shown, these transistors 415 and 416 are connected with the even bit line BLe and the odd bit line BLo, respectively, and are gated to a main even bit line selection signal BLSLTeM and a main odd bit line selection signal BLSLToM. Finally, transistor 417, which controls access of the main bit line selection bias block 400 to the main bit line BLm, is connected between the main bit line BLm and a common node of transistors 415 and 416, and is gated to a main sensing node blocking signal SOBLKM.

The sub-bit line selection bias block 500 of this example includes high voltage NMOS transistors 511 through 517. The transistors 511 and 512 are gated to a sub-high even shielding control signal SHLDHeS and a sub-high odd shielding control signal SHLDHoS, respectively, so as to selectively apply the supply voltage VDD to the even bit line BLe and the odd bit line BLo. Similarly, the transistors 513 and 514 are gated to a sub-low even shielding control signal SHLDLeS and a sub-low odd shielding control signal SHLDLoS, respectively, so as to selectively apply the supply voltage VSS to the even bit line BLe and the odd bit line BLo. Transistors 515 and 516 are used in the selection of either the even bit line BLe or the odd bit line BLo. As shown, these transistors 515 and 516 are connected with the even bit line BLe and the odd bit line BLo, respectively, and are gated to a sub-even bit line selection signal BLSLTeS and a sub-odd bit line selection signal BLSLToS. Finally, transistor 517, which controls access of the sub-bit line selection bias block 500 to the sub-bit line BLs, is connected between the sub-bit line BLs and a common node of transistors 515 and 516, and is gated to a sub-sensing node blocking signal SOBLKS.

The above-mentioned control signals SHLDLeM/SHLDLeS, SHLDHeM/SHLDHeS, SHLDLoM/SHLDLoS, SHLDHoM/SHLDHoS BLSLTeM/BLSLTeS, BLSLToM/BLSLToS, and SOBLKM/SOBLKS are preferably high voltage gate signals which exceed the supply voltage VDD.

The transistors 411 through 414 of the main bit line selection bias block 400 and the transistors 511 through 514 of the sub-bit line selection bias block 500 are generally provided to improve the drive capabilities of the main bit line BLm and the sub-bit line BLs, respectively. In the meantime, the transistors 415 through 417 of the main bit line selection bias block 400 and the transistors 515 through 517 of the sub-bit line selection bias block 500 are generally provided to select the even and odd bit lines BLe and BLo. However, the invention is not limited to the provision of these circuits.

Also, in the example of this embodiment, the unselected one of the even bit line BLe and the odd bit line BLo acts as an interference shielding line. However, the invention is not limited to such an arrangement, and in fact, the invention is also applicable to configurations having a single bit line BL (i.e., no even and odd bit lines BLe and BLo).

Figure 14:
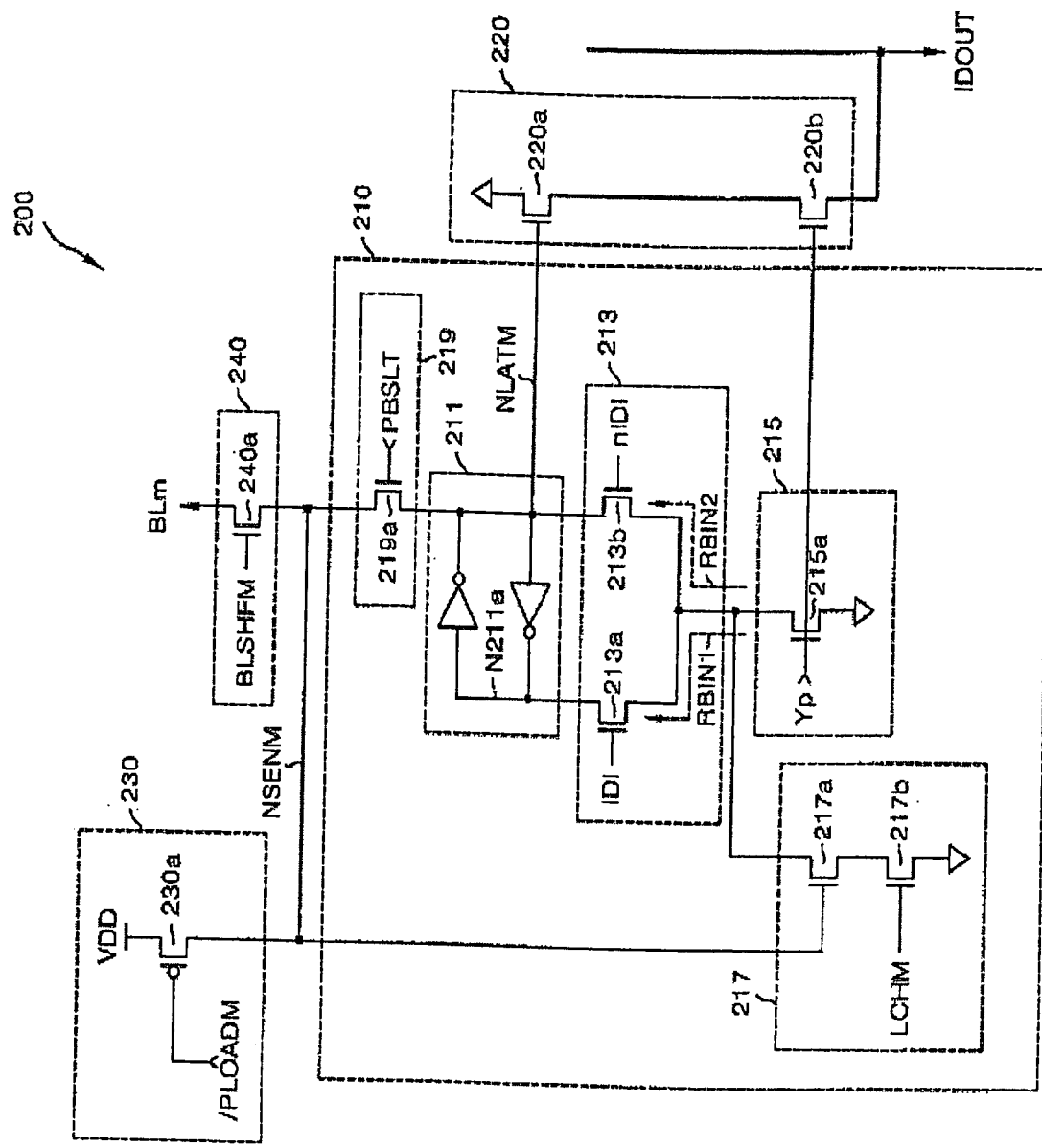
FIG. 14 is a circuit diagram of a main buffer block of the multi-bit nonvolatile memory device of FIG. 11 according to an embodiment of the present invention.

FIG. 14 is a circuit diagram illustrating an example of the main buffer block 200 shown in FIG. 11. The main buffer block 200 functions during reading operations to sense the voltage level of the main bit line BLm, that is, data in the memory cell MCsel reflected on the bit line BL, in response to the activation of a main read latch signal LCHM to a logic "H" state. In this case, data corresponding to the sensed data stored in the memory cell MCsel is stored on a main latch node NLATM of the main buffer block 200. In addition, the main buffer block 200 functions during programming operations to store data corresponding to externally applied data of the first global input line GDI and the second global input line nGDI on the main latch node NLATM. Herein, data on the main latch node NLATM of the main buffer block 200 is designated as "main latch data".

Referring to FIG. 14, the main buffer block 200 of this example includes a main sensing node NSENM, a main sensing latch unit 210, and an output driving unit 220. In addition, the main buffer block 200 preferably also includes a main pre-charge unit 230 and a main bit line shutoff unit 240. The main sensing latch unit 210 of this example includes a main latch unit 211, a main latch transmission unit 213, a main latch driving unit 215, a main sensing response unit 217, and a main buffer selection unit 219.

The main sensing node NSENM is adapted to reflect the voltage level of the main bit line BLm, and is selectively connected to the main bit line BLm through the main bit line shutoff unit 240.

The main bit line shutoff unit 240 is responsive to a main bit line shutoff signal BLSHFM to control the connection of the main bit line BLm to the main sensing node NSENM. In this example, the main bit line shutoff unit 240 is implemented using a main bit line shutoff transistor 240a, which is a low voltage NMOS transistor gated in response to the main bit line shutoff signal BLSHFM.

The main latch unit 211 stores, during reading operations, main latch data corresponding to the voltage level of the main sensing node NSENM on the main latch node NLATM.

The main latch driving unit 215 is enabled in response to a buffer selection address Yp to generate a main latch driving voltage. In this example, the main latch driving voltage is the ground voltage VSS. Further, in this example, the main latch driving unit 215 includes a main latch driving transistor 215a. The main latch driving transistor 215a is an NMOS transistor that is gated in response to the buffer selection address Yp and has a source terminal connected to the ground voltage VSS.

The latch transmission unit 213 of this example includes a first latch transmission transistor 213a and a second latch transmission transistor 213b. The first latch transmission transistor 213a provides the main latch driving voltage, provided from the main latch driving transistor 215a, to a node N211a of the main latch unit 211 in response to the first internal input line IDI. The first latch transmission transistor 213a is connected in series with the main latch driving transistor 215a, and gated in response to data loaded on the first internal input line IDI. Therefore, if data of a logic "H" state is applied to the first internal input line IDI when the buffer selection address Yp is in a logic "H" state, the first latch transmission transistor 213a provides the ground voltage VSS to the node N211a of the main latch unit 211.

The second latch transmission transistor 213b provides the main latch driving voltage, provided from the main latch driving transistor 215a, to the main latch node NLATM of the main latch unit 211 in response to the second internal input line nIDI. The second latch transmission transistor 213b is connected in series with the main latch driving transistor 215a and gated in response to data loaded on the second internal input line nIDI. When data of a logic "H" state is applied to the second internal input line nIDI and the buffer selection address Yp is in a logic "H" state, the second latch transmission transistor 213b provides the ground voltage VSS to the main latch node NLATM of the main latch unit 211.

That is, in this example, when data of logic "1" is programmed as first or second bit data, the first latch transmission transistor 213a is turned ON, so that the main latch data stored on the main latch node NLATM is logic "H". Further, when data of logic "0" is programmed as the first or second bit data, the second latch transmission transistor 213b is turned ON, so that the main latch data stored on the main latch node NLATM is logic "L".

Herein, as shown in FIG. 14, paths through which the main latch driving voltage is transmitted to the main latch unit 211 are designated as "buffer input paths RBIN1 and RBIN2". That is, the path including the main latch driving transistor 215a and the first latch transmission transistor 213a is designated as the first buffer input path RBIN1, and the path including the main latch driving transistor 215a and the second latch transmission transistor 213b is designated as the second buffer input path RBIN2.

In the meantime, the first latch transmission transistor 213a is turned ON at the time of reading out of data. At that time, a main sensing response voltage, provided from the main sensing response unit 217, is selectively provided to the node N211a of the main latch unit 211 through the first latch transmission transistor 213a.

The main sensing response unit 217 is driven by the main sensing node NSENM to transmit the main sensing response voltage to the latch transmission unit 213. In this example, the main sensing response voltage is the ground voltage VSS, and the main sensing response unit 217 includes a main sensing response transistor 217a connected in series with a main output sensing transistor 217b. The main sensing response transistor 217a is an NMOS transistor gated in response to data loaded on the main sensing node NSENM. The main output sensing transistor 217b is an NMOS transistor that is gated to the main read latch signal LCHM and has a source terminal connected to the ground voltage VSS.

When the voltage level of the main sensing node NSENM is close to the supply voltage VDD, the main sensing response transistor 217a is turned ON. Also, assume that the first internal input line IDI is activated to logic "H" state within this operational interval. In this case, in response to a main read latch signal LCHM, the main output sensing transistor 217b provides the main sensing response voltage, that is, the ground voltage VSS, to the node N211a of the main latch unit 211 through the first latch transmission transistor 213a of the latch transmission unit 213. This causes the main latch node NLATM to store main latch data of a logic "H" state, corresponding to data (~VDD) of the main sensing node NSENM.

On the other hand, when the voltage level of the main sensing node NSENM is close to the ground voltage VSS, the main sensing response transistor 217a is turned OFF. In this case, even if the main read latch signal LCHM becomes logic "H", the main latch unit 211 maintains its currently stored logic state according to an input data value.

The buffer selection unit 219 controls the connection of the main latch node NLATM with the main sensing node NSENM. In this example, the buffer selection unit 219 includes a buffer selection transistor 219a, which is an NMOS transistor gated in response to a buffer selection signal PBSLT. When the buffer selection signal PBSLT becomes logic "H", data on the main latch node NLATM is transmitted to the main sensing node NSENM through the buffer selection transistor 219a.

The main pre-charge unit 230 pre-charges the main sensing node NSENM to a predetermined main pre-charge voltage. In this embodiment, the main pre-charge voltage is the supply voltage VDD. That is, the main sensing node NSENM is initially pre-charged to the supply voltage VDD to reflect the voltage level of the main bit line BLm. In this case, when a selected memory cell MCsel is an "on cell", the voltage level of the main sensing node NSENM decreases to the ground voltage VSS.

On the other hand, when the selected memory cell MCsel is determined to be an "off cell", the main sensing node NSENM can be maintained at the supply voltage VDD (although, as explained later, the voltage level of the main sensing node NSENM can decrease to the ground voltage VSS due to operations of to the sub-latch block 300).

The main pre-charge unit 230 of this example includes a main pre-charge transistor 230a. The main pre-charge transistor 230a is a PMOS transistor that is provided with a source terminal connected to the supply voltage VDD (for example, 2.2V) and is gated in response to a main pre-charge signal /PLOADM.

The output driving unit 220 is enabled in response to the buffer selection address Yp, and drives an internal output line IDOUT to a predetermined output driving voltage which depends on the main latch data stored on the main latch node NLATM. The internal output line IDOUT is electrically isolated from the main latch node NLATM and the buffer input paths RBIN1 and RBIN2. As such, inadvertent driving of the main latch node NLATM caused by data loaded on the internal output line IDOUT is prevented.

In this example, the output driving unit 220 includes a first output driving transistor 220a and a second output driving transistor 220b connected in series between an output driving voltage and the internal output line IDOUT. The first output driving transistor 220a is gated in response to the main latch data stored on the main latch node NLATM of the main latch unit 211. The second output driving transistor 220b is gated in response to the buffer selection address Yp. In the example, the output driving voltage is the ground voltage VSS.

According to the example of this embodiment, when the main latch data stored on the main latch node NLATM is logic "H", the internal output line IDOUT is driven to the ground voltage VSS in response to the transition of the buffer selection address Yp to a logic "H" state.

On the other hand, when the main latch data stored on the main latch node NLATM is logic "L", the first output driving transistor 220a is turned off. In this case, regardless of whether the voltage level of the buffer selection address Yp is changed to a logic "H" state, the internal output line IDOUT maintains its high voltage state. In this example, the high voltage state of the internal output line IDOUT is the supply voltage VDD.

Figure 15:
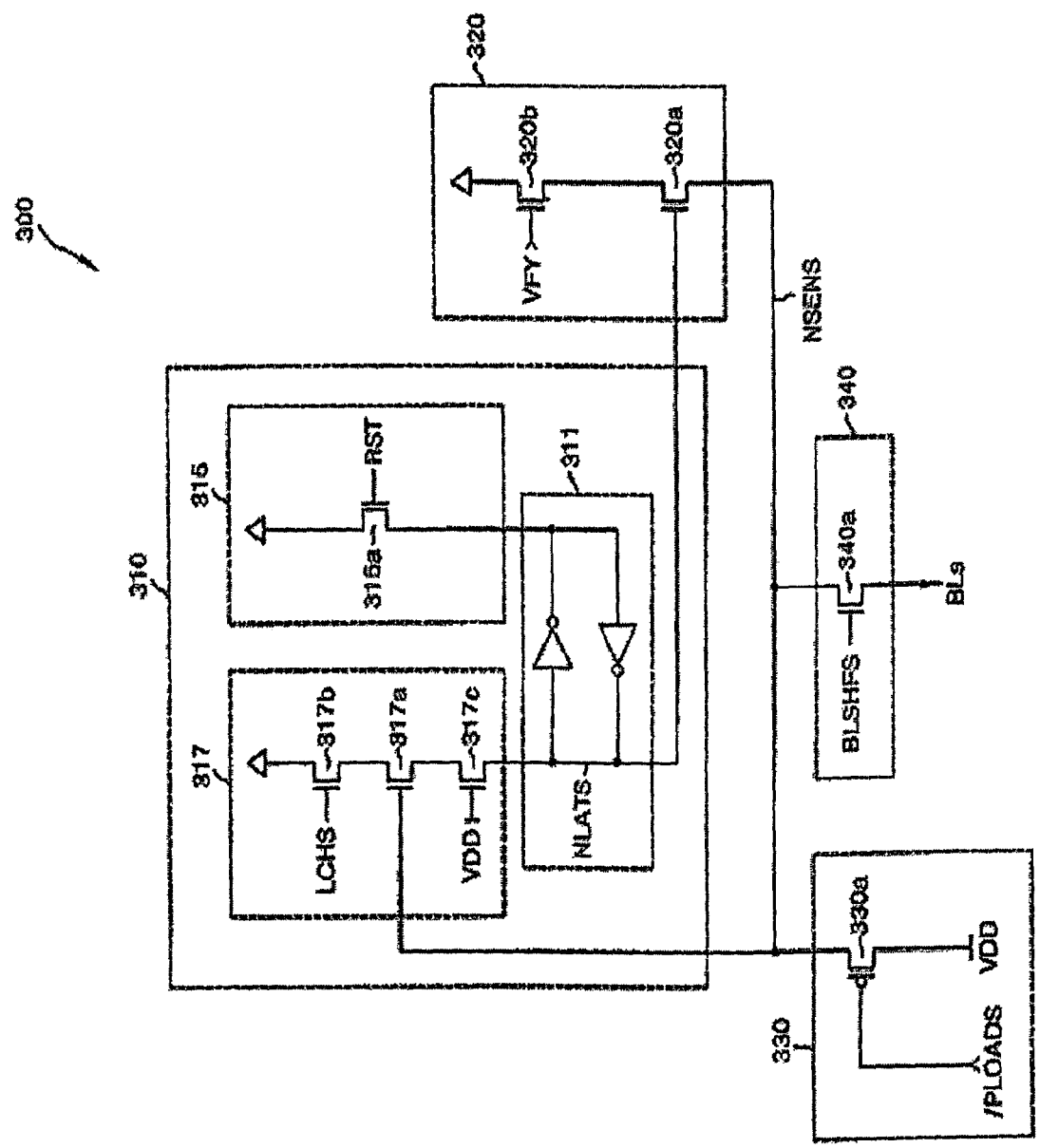
FIG. 15 is a circuit diagram of a sub-latch block of the multi-bit nonvolatile memory device of FIG. 11 according to an embodiment of the present invention.

Reference is now made to FIG. 15 which illustrates an example of the sub-latch block 300 of FIG. 11. The sub-latch block 300 functions during read operations to read the voltage level of the sub-bit line BLs in response to the activation of a sub-read latch signal LCHS to a logic "H" state, and to store the read data as sub-latch data. In this embodiment, the sub-read latch signal LCHS is activated to a logic "H" state before the programming of a second bit data value in the memory cell MCsel is completed, but after the programming of a first bit data value in the memory cell MCsel has been completed. Also in this embodiment, main latch data stored in the main buffer block 200 can be flipped to correspond to a data value ultimately read from the memory cell MCsel. However, when the sub-latch data is logic "H", the flipping of the main latch data can be blocked.

It is noted here that the previously described main buffer block 200 is entirely functional when applied to a single-bit nonvolatile semiconductor memory device, and that multi-bit functionality is obtained simply by adding the sub-latch block 300. As one skilled in the art will appreciate, this results in significant design and fabrication related advantages. These advantages are further enhanced by locating the main buffer block 200 and the sub-latch block 300 on opposite sides of the memory cell array 100 as is described in the example of the present embodiment.

The sub-latch block 300 of FIG. 15 includes a sub-sensing node NSENS, a sub-sensing latch unit 310, and a sub-driving unit 320, and preferably further includes a sub-pre-charge unit 330 and a sub-bit line shutoff unit 340. The sub-sensing latch unit 310 includes a sub-latch unit 311, a sub-latch initialization unit 315 and a sub-sensing response unit 317.

The sub-sensing node NSENS is adapted to reflect the voltage level of the sub-bit line BLs, and is connected to the sub-bit line BLs through the sub-bit line shutoff unit 340.

The sub-bit line shielding unit 340 is responsive to a sub-bit line shutoff signal BLSHFS to control the connection of the sub-bit line BLs with the sub-sensing node NSENS. In this example, the sub-bit line shutoff unit 340 is implemented using a sub-bit line shutoff transistor 340*a*, which is a low voltage NMOS transistor gated in response to the sub-bit line shutoff signal BLSHFS.

The sub-sensing latch unit 310 stores data on a sub-latch node NLATS that corresponds to the voltage level of the sub-sensing node NSENS. Herein, data stored on the sub-latch node NLATS is designated as "sub-latch data".

The sub-latch initialization unit 315 initializes the sub-latch data in response to a sub-latch initialization signal RST. In this example, when the sub-latch initialization signal RST is activated to a logic "H" state, the sub-latch data on the sub-latch node NLATS is initialized to data of a logic "H" state. Also in this example, the logic "H" state of the sub-latch node NLATS is the supply voltage VDD.

The sub-latch initialization unit 315 includes, for example, a sub-latch initialization transistor 315*a*. The sub-latch initialization transistor 315*a* is an NMOS transistor that is gated in response to the sub-latch initialization signal RST and is provided with a source terminal connected to the ground voltage VSS.

The sub-latch unit 311 stores data corresponding to the voltage level of the sub-sensing node NSENS on the sub-latch node NLATS.

The sub-sensing response unit 317 is driven by the sub-sensing node NSENS to transmit a sub-sensing response voltage to the sub-latch unit 311, and is ultimately controlled so that data corresponding to the sub-sensing node NSENS is stored in the sub-latch node NLATS. In this example, the sub-sensing response voltage is the ground voltage VSS, and the sub-sensing response unit 317 includes a sub-sensing response transistor 317*a* and a sub-output sensing transistor 317*b*. The sub-sensing response transistor 317*a* is an NMOS transistor gated in response to data stored on the sub-sensing node NSENS. The sub-output sensing transistor 317*b* is an NMOS transistor connected in series with the sub-sensing response transistor 317*a* and includes a source terminal connected to the ground voltage VSS. The sub-sensing response unit 317 of FIG. 15 also includes an NMOS transistor 317*c* as shown. This NMOS transistor 317*c* is implemented by modeling the first latch transmission transistor 213*a* of the main buffer block 200 of FIG. 14 and is gated by the supply voltage VDD.

The sub-pre-charge unit 330 pre-charges the sub-sensing node NSENS to a predetermined sub-pre-charge voltage. In this example, the sub-pre-charge voltage is the supply voltage VDD, and the sub-pre-charge unit 330 includes a sub-pre-charge transistor 330*a*. The sub-pre-charge transistor 330*a* is a PMOS transistor that includes a source terminal connected to the supply voltage VDD and is gated in response to a sub-pre-charge signal /PLOADS.

The sub-driving unit 320 is enabled in response to a verification read control signal VFY to drive the sub-sensing node NSENS to a predetermined sub-driving voltage depending on sub-latch data stored on the sub-latch node NLATS. In this example, the sub-driving unit 320 includes a first sub-driving transistor 320*a* connected in series with a second sub-driving transistor 320*b*, a sub-driving voltage and the sub-sensing node NSENS. The first sub-driving transistor 320*a* is gated in response to sub-latch data stored on the sub-latch node NLATS. That is, the first sub-driving transistor 320*a* is turned ON when the data stored on the sub-latch node NLATS of the sub-latch unit 311 is logic "H". The second sub-driving transistor 320*b* is gated in response to the verification read control signal VFY to drive the sub-sensing node NSENS to the sub-driving voltage. In this embodiment, the sub-driving voltage is the ground voltage VSS, which is connected to the source terminal of the second sub-driving transistor 320*b*.

In operation of the sub-latch block 300, if the selected memory cell MCsel is determined to be an "off cell", the sub-sensing node NSENS has a pre-charged supply voltage VDD. Further, the sub-latch data on the sub-latch node NLATS is flipped to a logic "L" state in response to the sub-read latch signal LCHS. In this case, the sub-sensing node NSENS maintains the supply voltage VDD if the verification read control signal VFY transitions to a logic "H" state.

On the other hand, if the selected memory cell MCsel is determined to be an "on cell", the voltage level of the sub-sensing node NSENS decreases to the ground voltage VSS. In this case, even if the sub-read latch signal LCHS is activated to a logic "H" state, the sub-latch data on the sub-latch node NLATS is not flipped, and instead maintains its initial "H" state. At this time, when the transition of the verification read control signal VFY to a logic "H" state occurs, the sub-sensing node NSENS is driven to the ground voltage VSS. In this way, the sub-sensing node NSENS, driven to the ground voltage VSS, ultimately drives the main sensing node NSENM (FIG. 14) of the main buffer block 200 to the ground voltage VSS, thus preventing the flipping of the main latch data stored on the main latch node NLATM.

Figure 1B:
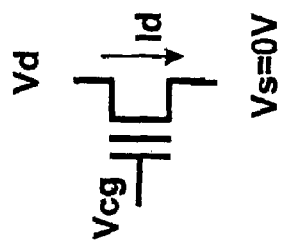
FIGS. 1A through 1C are a schematic view of a nonvolatile memory cell, the circuit symbol of a nonvolatile memory cell, and a threshold voltage characteristic of a nonvolatile memory cell, respectively.
Figure 1C:
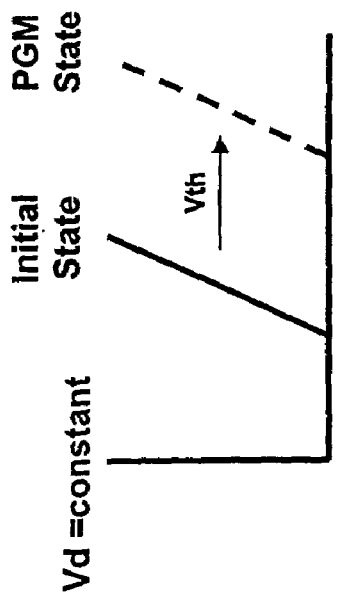
Figure 1A:
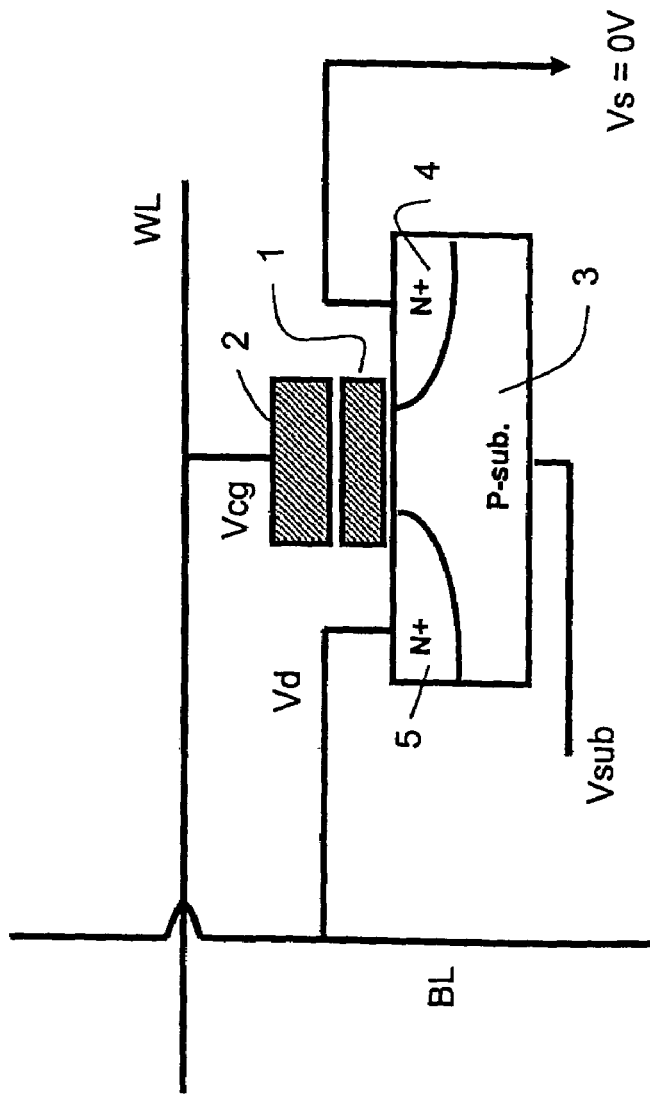
Figure 2:
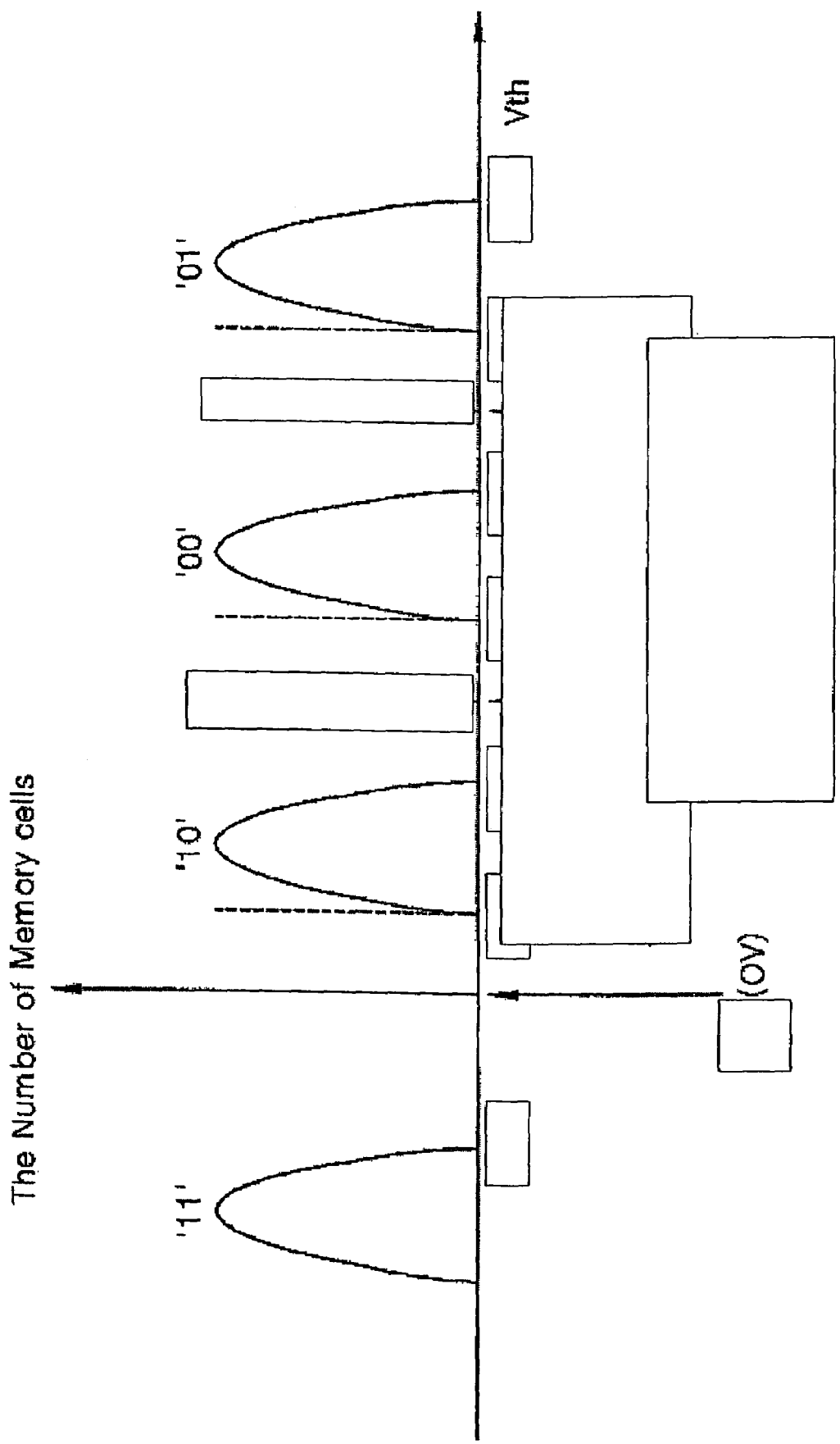
FIG. 2 illustrates threshold voltage distribution states of a multi-bit nonvolatile memory cell.
Figure 3:
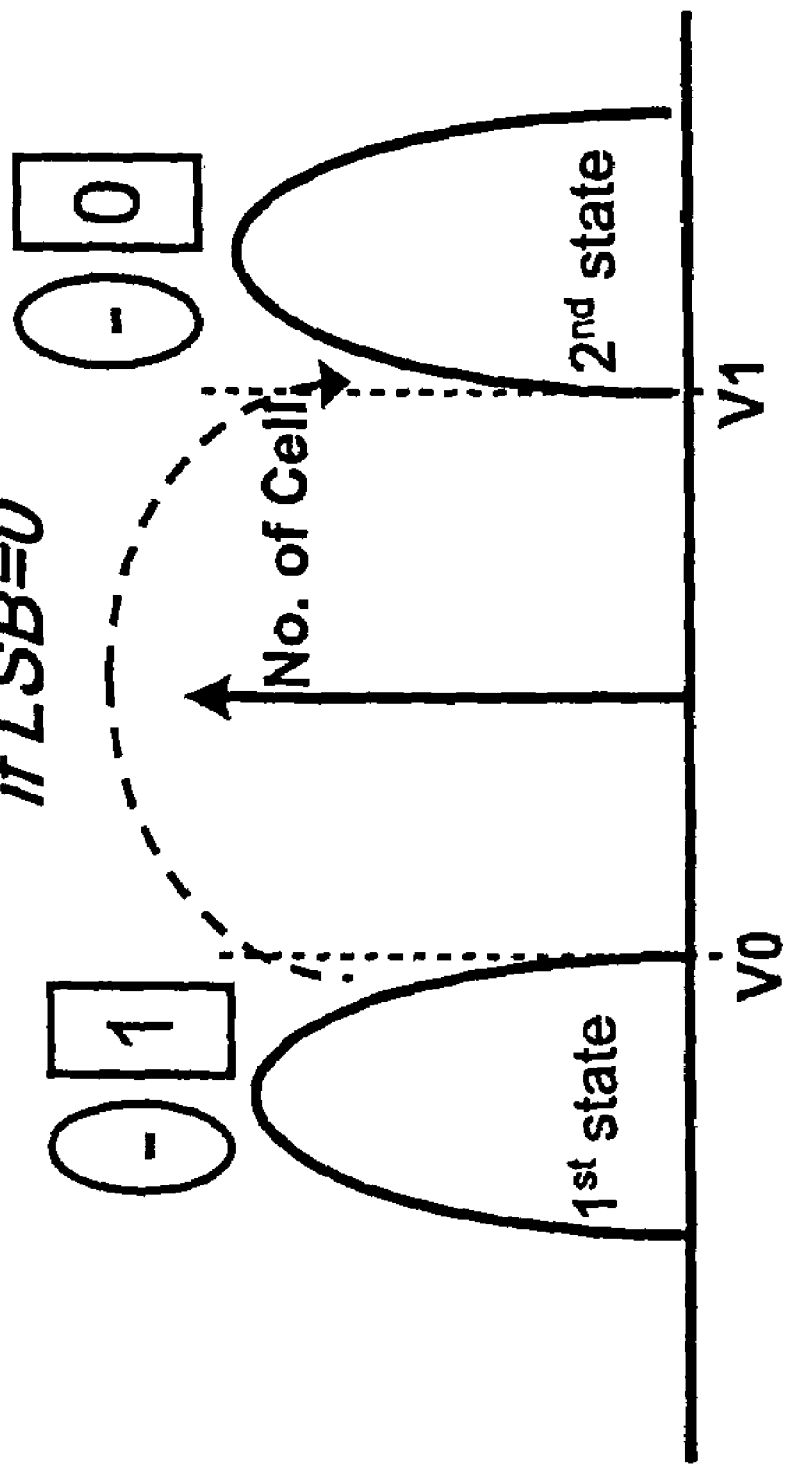
FIGS. 3 through 5 are threshold voltage distribution diagrams for explaining the programming of a multi-bit nonvolatile memory cell.
Figure 4:
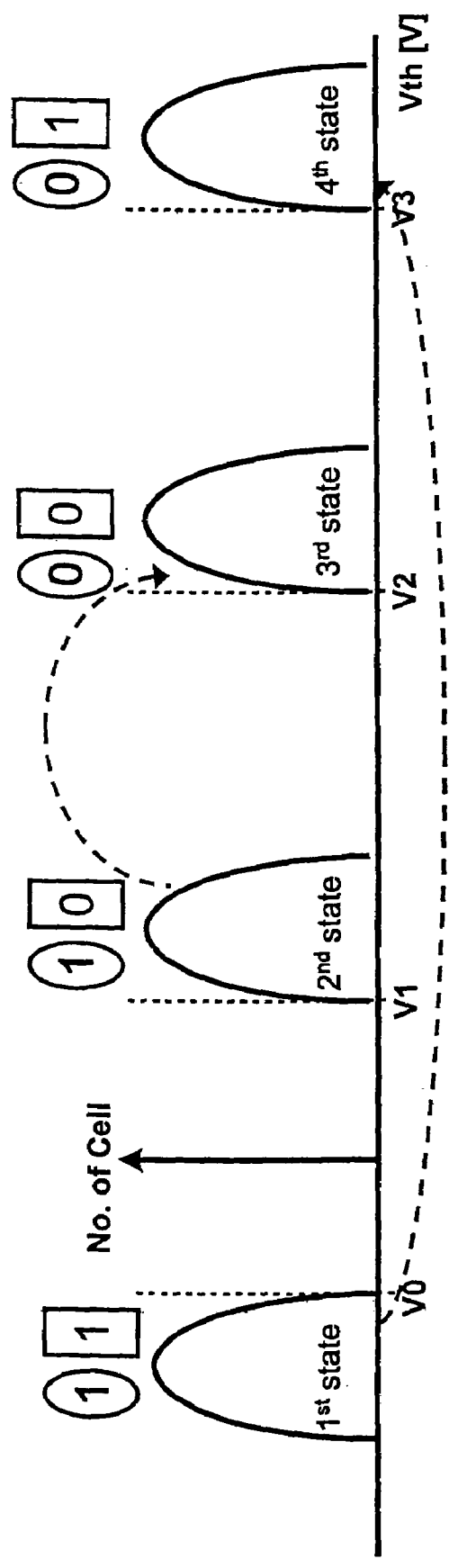
Figure 5:
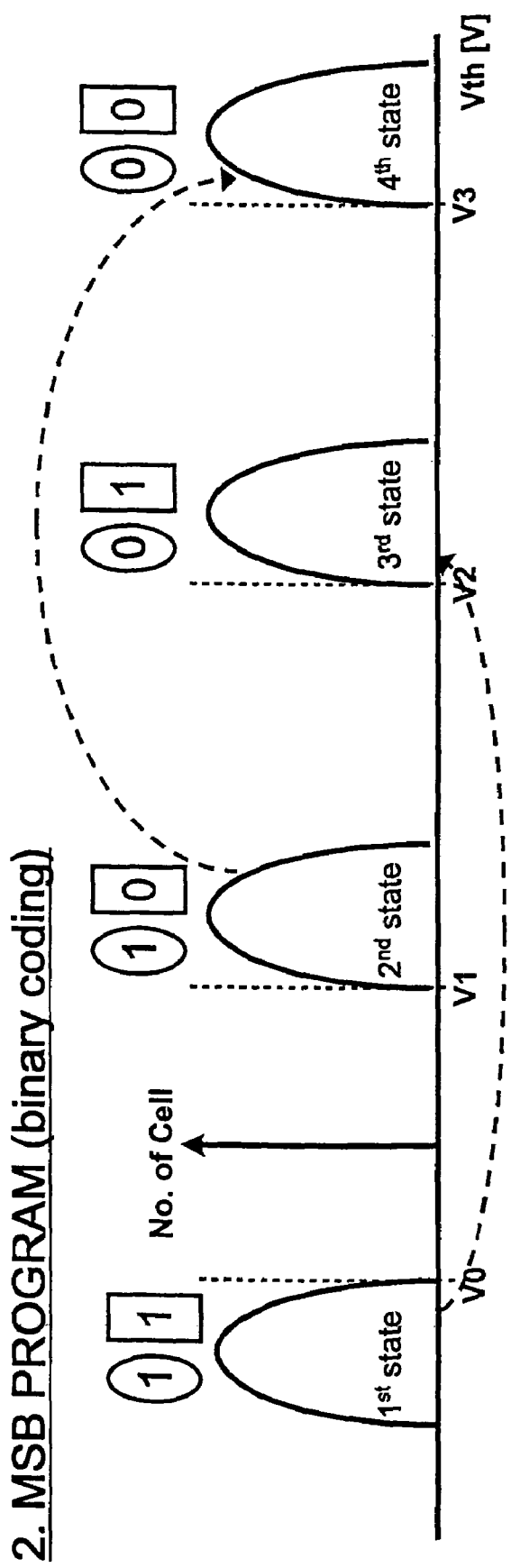
Figure 6:
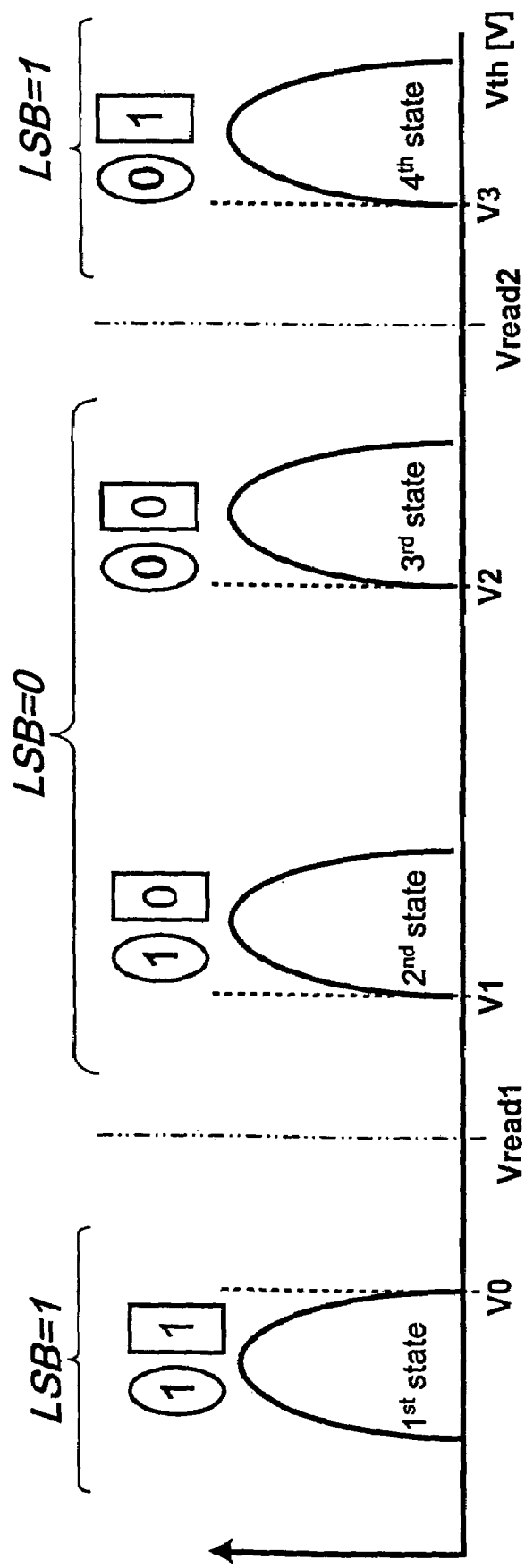
FIGS. 6 and 7 are threshold voltage distribution diagrams for explaining the reading of a multi-bit nonvolatile memory cell.
Figure 7:
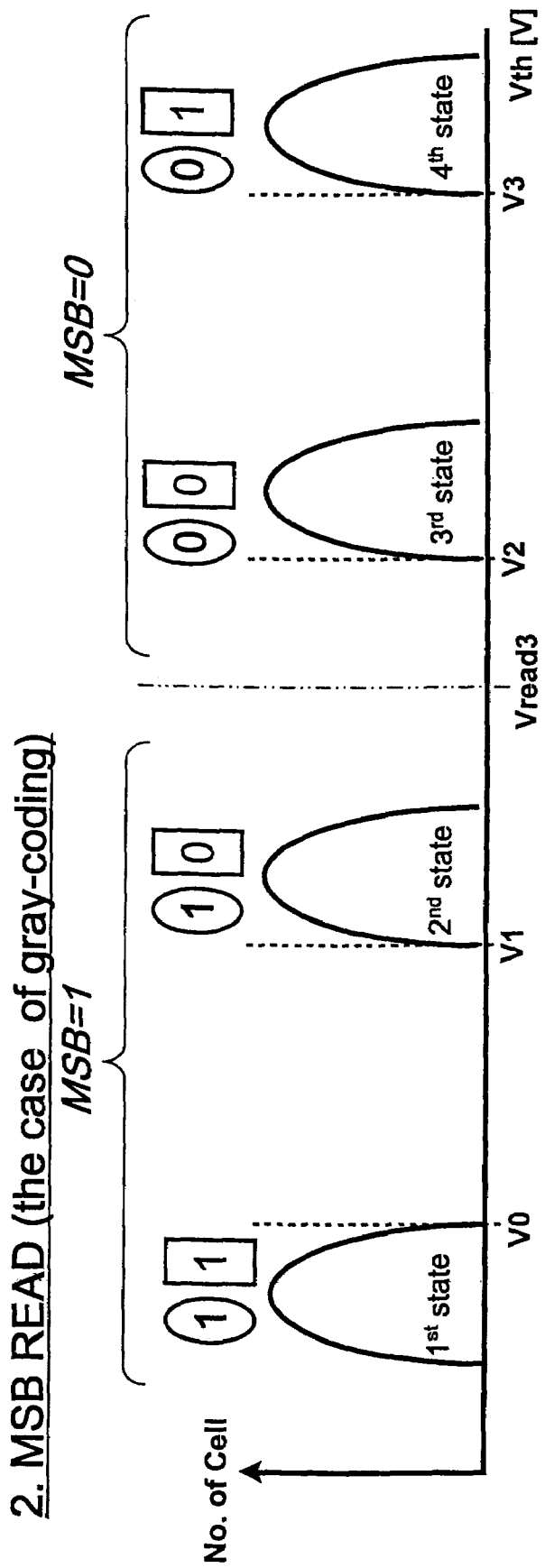
Figure 16:
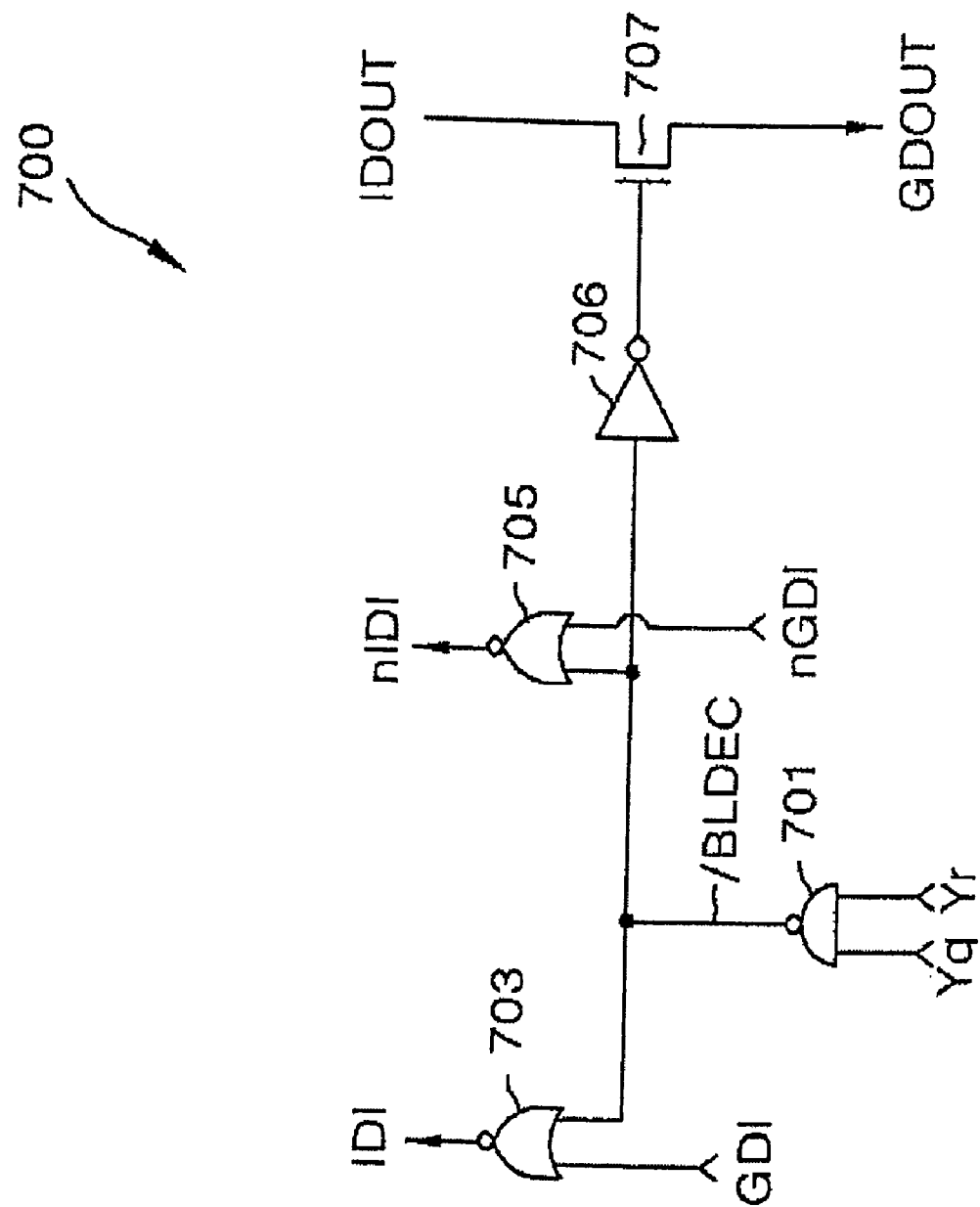
FIG. 16 is a circuit diagram of a page buffer decoder of the multi-bit nonvolatile memory device of FIG. 11 according to an embodiment of the present invention.

FIG. 16 is a circuit diagram illustrating an example of the page buffer decoder 700 shown in FIG. 1. The page buffer decoder 700 in the example of FIG. 16 includes first to third decoder logic gates 701, 703 and 705, an inverter 706, and a decoder transistor 707.

The page buffer decoder 700 has two primary functions. First, the page buffer decoder 700 selectively transmits output data corresponding to data on the internal output line IDOUT to the global output line GDOUT. Second, the page buffer decoder 700 transmits data corresponding to input data on the first global input line GDI and the second global input line nGDI to the first internal input line IDI and the second internal input line nIDI, respectively.

Herein, the y address signals Yq are referred to as main selection addresses, and the y address signals Yr are referred to as sub-selection addresses. That is, in the example of previously described FIG. 8, the nonvolatile memory includes 64 page buffer decoders NWDE<63:0>. The page buffer decoders NWDE<63:0> are individually selected based on a combination of the main selection addresses Yq<7:0> and sub-selection addresses Yr<7:0>. The main selection addresses Yq<7:0> are used to select one of 8 groups (having 8 buffer decoders each) among the 64 page buffer decoders NWDE<63:0>, and the sub-selection addresses Yr<7:0> are used to select any one of 8 page buffer decoders contained in the selected group. Also, as mentioned previously, the buffer selection addresses Yp<7:0> are used to select individual ones of 8 page buffers (main latch circuits) associated with the selected buffer decoder.

Returning to FIG. 16, the first decoder logic gate 701 performs a logic operation on a main selection address Yq and a sub-selection address Yr, and outputs the logic operation result as a block decoding signal /BLDEC. In this example, the first decoder logic gate 701 is a NAND gate which executes NAND operation on the main selection address Yq and the sub-selection address Yr, and outputs the NAND operation results as the block decoding signal /BLDEC. In this case, when both the main selection address Yq and the sub-selection address Yr are activated to a logic "H" state, the block decoding signal /BLDEC is activated to a logic "L" state.

The second decoder logic gate 703 is enabled in response to the block decoding signal /BLDEC, and provides logic operation results to the first internal input line IDI in accordance with data on the first global input line GDI. In this example, the second decoder logic gate 703 is a NOR gate which executes a NOR operation on the block decoding signal /BLDEC and the first global input line GDI. In this case, the second decoder logic gate 703 inverts the data on the first global input line GDI and provides the inverted result to the first internal input line IDI when the block decoding signal /BLDEC is in a logic "L" state (i.e., when both the main selection address Yq and the sub-selection address Yr are in a logic "H" state).

The third decoder logic gate 705 is enabled in response to the block decoding signal /BLDEC and provides logic operation results to the second internal input line nIDI in accordance with data on the second global input line nGDI. In this example, the third decoder logic gate 705 is a NOR gate which executes a NOR operation on the block decoding signal /BLDEC and the second global input line nGDI. In this case, the third decoder logic gate 705 inverts data on the second global input line nGDI and provides the inverted data to the second internal input line nIDI thereof when the block decoding signal /BLDEC is in a logic "L" state (i.e., when both the main selection address Yq and the sub-selection address Yr are in a logic "H" state).

The inverter 706 inverts the block decoding signal /BLDEC to gate the decoder transistor 707. As such, in this example, the decoder transistor 707 provides data on the internal output line IDOUT to the global output line GDOUT when the block decoding signal /BLDEC is activated to a logic "L" state.

Figure 17:
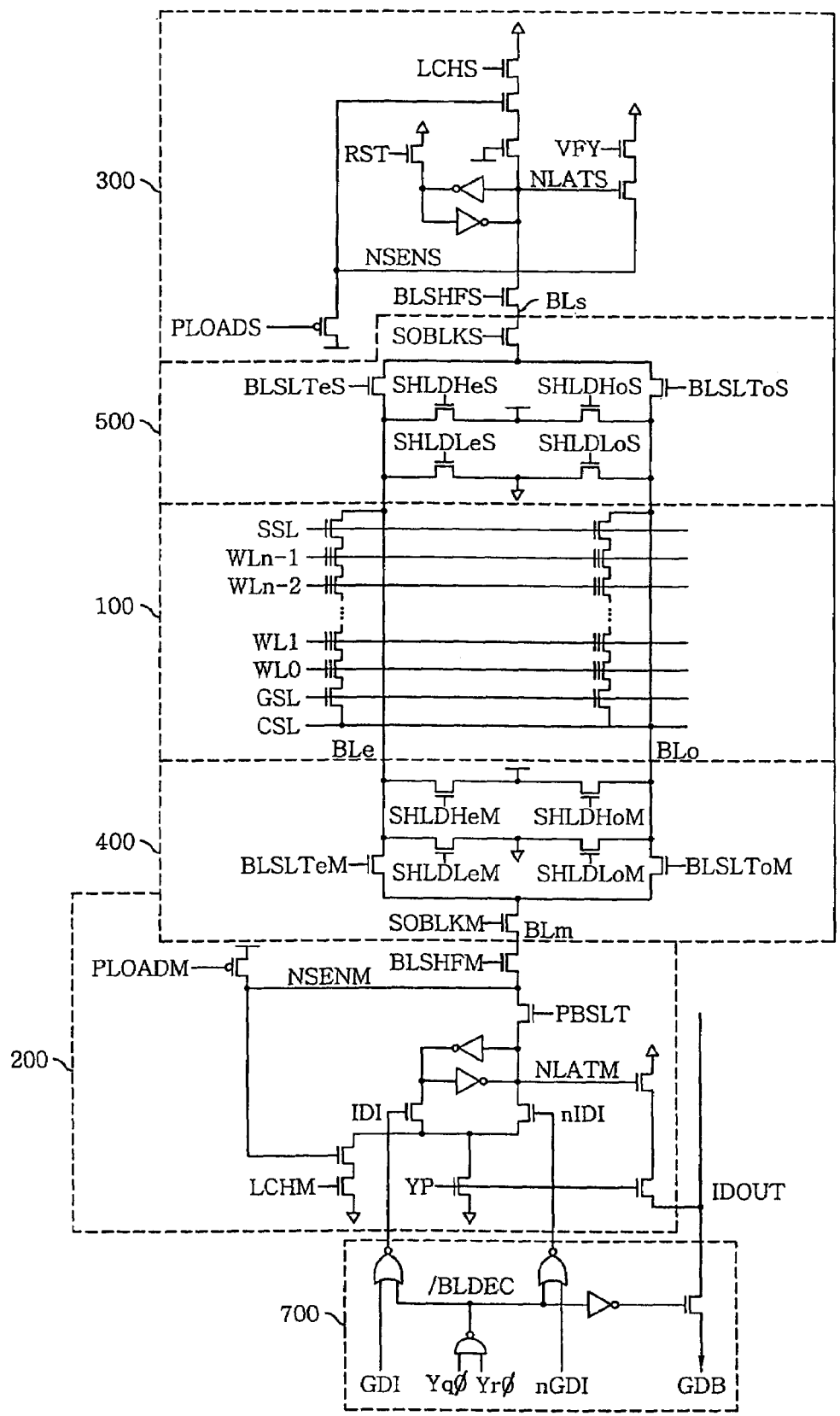
FIG. 17 is a circuit diagram of the multi-bit nonvolatile memory device of FIG. 11 according to an embodiment of the present invention.

Programming, reading and erasing operational modes according to embodiments of the invention will be described in detail below. References should concurrently be made to FIGS. 8-16 in the discussions that follow. Also, for convenience, FIG. 17 is presented which illustrates a diagram showing all of the above-discussed circuitry associated with a single pair of odd and even bit lines BLo and BLe. Like signal and node designations are utilized in FIG. 17 as those appearing in previous figures, and accordingly, reference is made to corresponding previous discussions regarding the interconnection of elements appearing in FIG. 17.

Figure 18A:
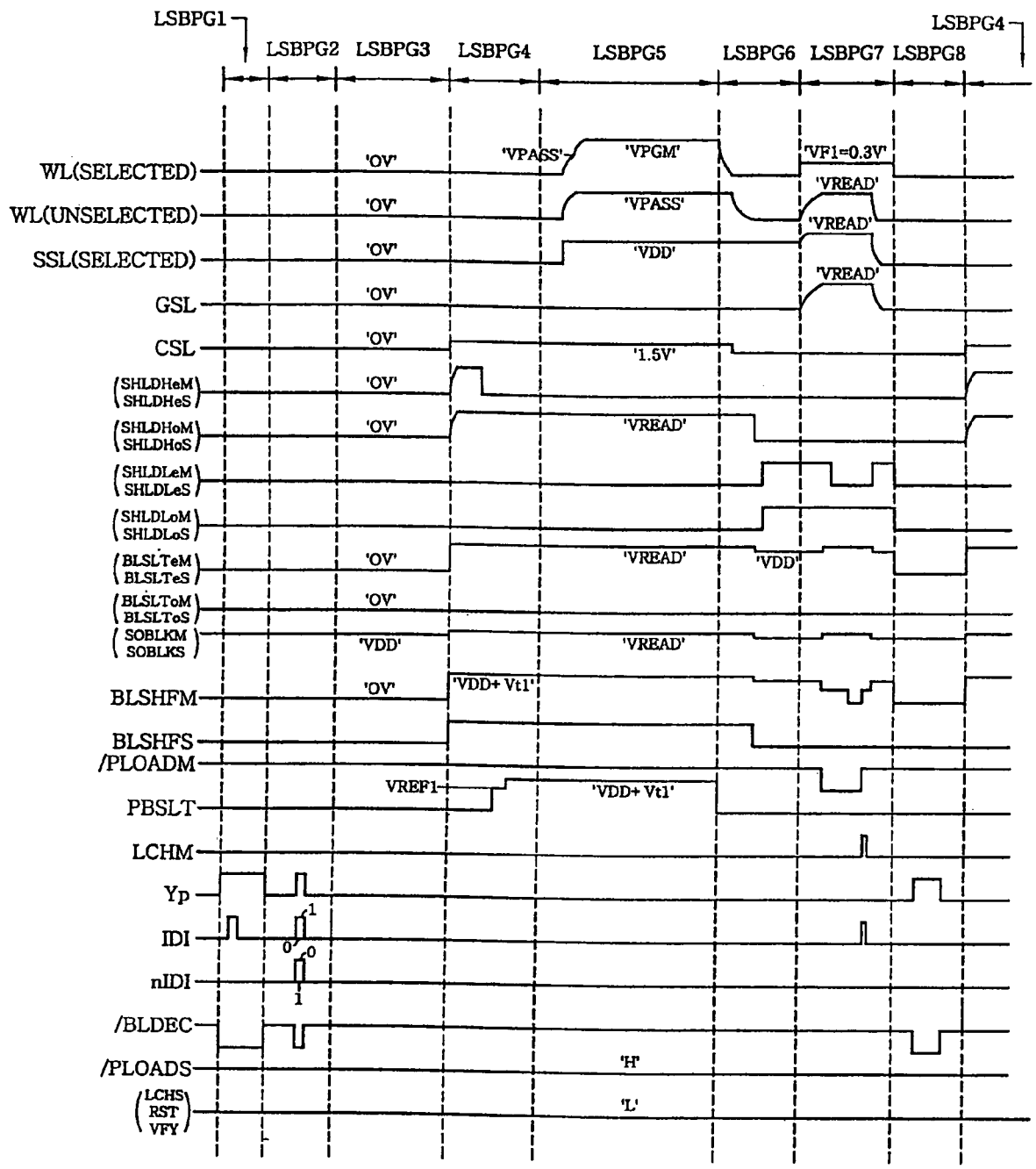
FIGS. 18A and 18B are flowcharts for describing a method of programming the least significant bit (LSB) of the multi-bit nonvolatile memory device of FIG. 11 according to an embodiment of the present invention.
Figure 18B:
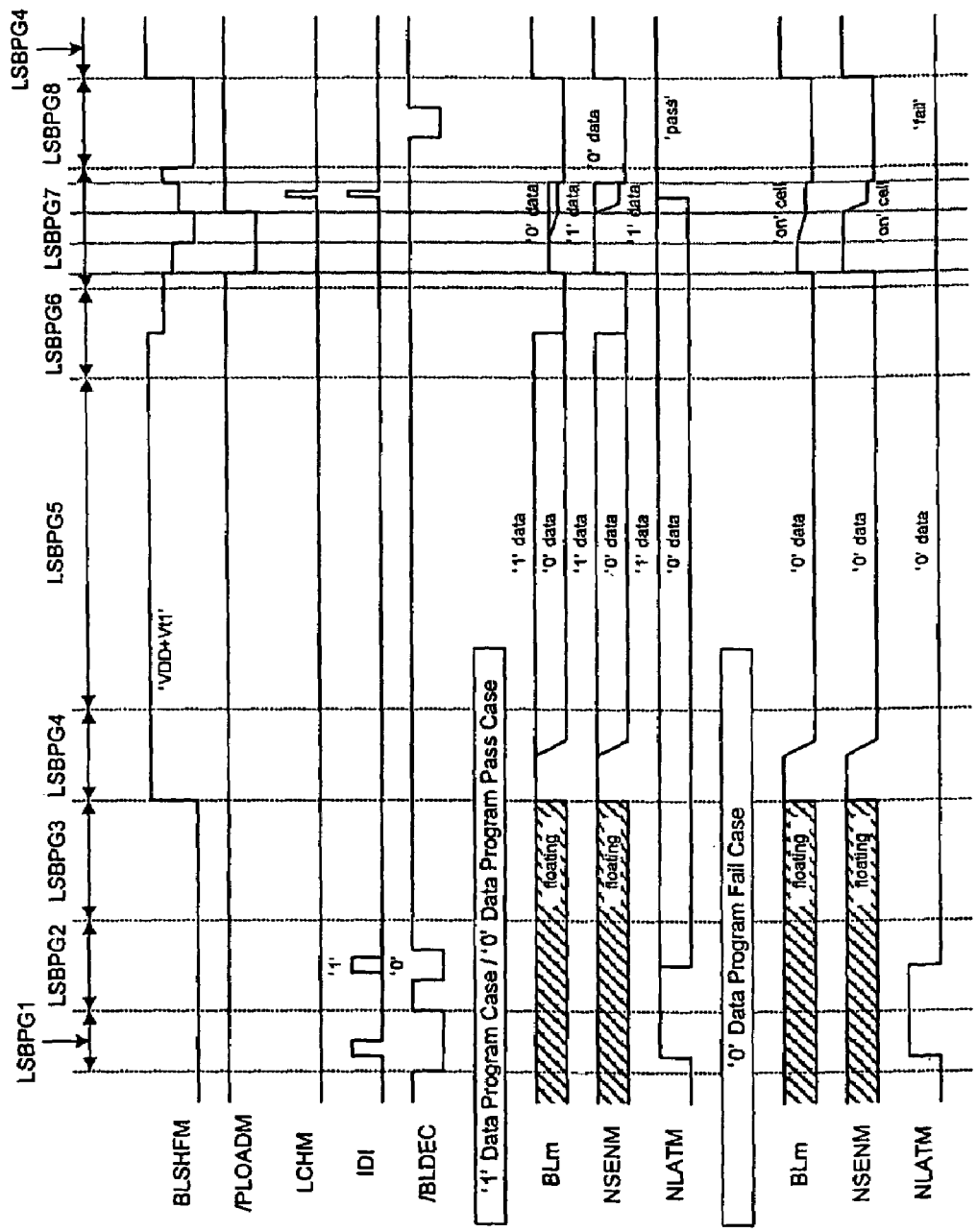

FIGS. 18A and 18B are timing diagrams showing principal signal and node voltages during programming of the first data bit value, i.e., the least signification bit (LSB) of a multi-bit nonvolatile semiconductor memory device according to an embodiment of the present invention. This programming sequence is referred to herein as the "first data bit value LSB" program mode LSBPG.

For explanation purposes, FIGS. 18A and 18B are segmented into eight (8) LSBPG intervals, namely, a page buffer setup interval (hereinafter referred to as an "LSBPG1 interval"), a data loading interval (hereinafter referred to as an "LSBPG2 interval"), a high voltage enable interval (hereinafter referred to as an "LSBPG3 interval"), a bit line setup interval (hereinafter referred to as an "LSBPG4 interval"), a program execution interval (hereinafter referred to as an "LSBPG5 interval"), a recovery interval (hereinafter referred to as an "LSBPG6 interval"), a verification read interval (hereinafter referred to as an "LSBPG7 interval"), and a verification scan interval (hereinafter referred to as an "LSBPG8 interval").

Throughout the LSBPG1 to LSBPG8 intervals, the sub-pre-charge signal /PLOADS, the sub-read latch signal LCHS, the verification read control signal VFY and the sub-latch initialization signal RST are all inactive. The sub-latch block 300 is therefore effectively prevented from influencing the main sensing node NSENM.

During the LSBPG1 interval, the main latch node NLATM is adjusted to a program inhibited state before externally applied data is loaded, i.e., in this example, the voltage level of the main latch node NLATM is set to a logic "H" state. Herein, the phrase "program inhibited state" denotes a state in which the execution of programming is not required with respect to externally applied data. In this example, when data of logic value "1" is externally applied, the execution of the programming is not required.

More specifically, during the LSBPG1 interval, the buffer selection address Yp is in a logic "H" state so as to turn ON the latch driving transistor 215a. Further, both the main selection address Yq and the sub-selection address Yr are in a logic "H" state, and thus the block decoding signal /BLDEC is activated to a logic "L" state. In this example, the first global input line GDI is an active pulse having a logic "L" state, and the second global input line nGDI is in a logic "H" state. Accordingly, the first internal input data IDI is an active pulse having a logic "H" state, and the second internal input data nIDI is in a logic "L" state. The first latch transmission transistor 213a is therefore temporarily turned ON, and the second latch transmission transistor 213b is in an OFF state. In this manner, the main latch node NLATM is set to the program inhibited state, i.e., a logic "H" state.

In the LSBPG2 interval, externally applied data is loaded on the main latch node NLATM before the selected memory cell MCsel is programmed. When the input data is logic "0", a logic "L" state is stored as main latch data on the main latch node NLATM. In contrast, when the input data is logic "1", a logic "H" state is stored as main latch data on the main latch node NLATM.

More specifically, in the LSBPG2 interval, the buffer selection address Yp is logic "H". Also, both the main selection address Yq and the sub-selection address Yr are logic "H", and thus the block decoding signal /BLDEC is logic "L". At this time, the first global input line GDI or the second global input line nGDI is changed to a logic "H" state.

That is, if the input data is logic "L", the second global input line nGDI is changed to a logic "L" state, and accordingly, the first internal input line IDI is in a logic "L" state, and the second internal input line nIDI is changed to a logic "H" state. Therefore, data of a logic "L" state is stored on the latch node NLATM.

On the other hand, if the input data is logic "H", the first global input line GDI is changed to a logic "L" state. As a result, the second internal input line nIDI is in a logic "L" state, and the first internal input line IDI is changed to a logic "H" state. Therefore, data of a logic "H" state is stored on the latch node NLATM.

During the LSBPG3 interval, high voltage pumping circuits of the multi-bit nonvolatile memory device are enabled. These circuits, which are not shown in the drawings, generate the various operational supply voltages having voltage levels which exceed VDD. In the example of this embodiment, the high voltage pumping circuits includes circuits for generating a program voltage VPGM (for example, 20V), a pass voltage VPASS (for example, 7 to 9V), and a read voltage VREAD (for example, 5V). Further, the high voltage pumping circuits may also include a circuit for generating a boosting voltage VPP (not shown) which is utilized by the row decoder 600. For reference, the supply voltage VDD in the example of the present embodiment is about 2.2 V.

In the LSBPG4 interval, the voltage of the even bit line BLe of the selected memory cell MCsel is adjusted to a level corresponding to data stored on the main latch node NLATM. That is, when data of logic "1" is programmed, the even bit line BLe is set to a voltage level close to the supply voltage VDD. When data of logic "0" is programmed, the even bit line BLe is set to a voltage level close to the ground voltage VSS. Further, the odd bit line BLo that is not connected to the selected memory cell MCsel, that is, an unselected bit line, is adjusted to the program inhibited state.

More specifically, the voltage levels of the control signals SHLDHeM/SHLDHeS are temporarily increased to the read voltage VREAD, and the voltages of the control signals SHLDHoM/SHLDHoS are increased to the read voltage VREAD. Therefore, the voltage levels of the even bit line BLe and the odd bit line BLo become the supply voltage VDD.

The voltage levels of the control signals BLSLTeM/BLSLTeS and the main sensing node blocking signal SOBLK are also increased to the read voltage VREAD, and the voltage level of the main bit line shutoff signal BLSHFM is increased to a voltage "VDD+Vt1". In the present example, the voltage "Vt1" is a voltage of about 1.5 V.

After the lapse of a predetermined time period within the LSBPG4 interval, the voltage level of the control signals SHLDHeM/SHLDHeS is again decreased to the ground voltage VSS. Further, soon after the buffer selection signal PBSLT is initially changed to a first reference voltage VREF1, it is changed again to a fifth voltage. In the example of this embodiment, the first reference voltage VREF1 is about 1.3V, and the fifth voltage is equal to "VDD+Vt1".

As a result of the above operations, the data stored on the main latch node NLATM is transmitted to the even bit line BLe connected to the selected memory cell MCsel. If the data stored on the main latch node NLATM is logic "L", the voltage of the even bit line BLe becomes "0V". On the other hand, if the data stored on the main latch node NLATM is logic "H", the even bit line BLe maintains the supply voltage VDD.

The LSBPG5 interval is executed next in which LSB data transmitted to the even bit line BLe is stored in the selected memory cell MCsel. That is, when the LSB is logic "1" and thus the voltage level of the even bit line BLe is close to the supply voltage VDD, the program inhibited state is maintained. In contrast, when the LSB is logic "0" and thus the voltage level of the even bit line BLe is close to the ground voltage VSS, the selected memory cell MCsel is programmed as a result of F-N tunneling.

In particular, a pass voltage VPASS is briefly applied to a selected word line WL for a predetermined period of time, and then the program voltage VPGM, which is a third voltage, is applied to the selected word line WL. As discussed previously, the program voltage VPGM enables data dependent upon the voltage level of the even bit line BLe to be programmed in the selected memory cell MCsel. Further, the pass voltage VPASS is applied to the remaining unselected word lines WL, and accordingly, the unselected memory cells MC are not program-enabled and thus maintain their current states.

Also, during the LSBPG5 interval, the string selection line SSL is changed to the supply voltage VDD, the ground selection line GSL remains the ground voltage VSS, and the common source line CSL maintains a voltage of about 1.5V.

The LSBPG6 interval is executed next in which word lines WL, bit lines BL, BLe and BLo, and the sensing node NSENM are discharged to the ground voltage VSS.

That is, during the LSBPG6 interval, the control signals SHLDLeM/SHLDLeS and the control signals SHLDLoM/SHLDLoS are activated, and the control signals BLSLTeM/BLSLTeS, the main sensing node blocking signal SOBLKM, and the main bit line shutoff signal BLSHFM are changed to the supply voltage VDD. Therefore, the bit lines BL, BLe and BLo, and the sensing node NSENM, are discharged to the ground voltage VSS. In addition, voltages of the selected and unselected word lines are made the ground voltage VSS.

Further, the buffer selection signal PBSLT is changed to the ground voltage VSS to electrically isolate the bit line BL from the main latch node NLATM.

The LSBPG7 interval is executed next to sense (verify) the data programmed in the memory cell MCsel. Briefly, this is carried out by application of a first read verification voltage VF1 to the selected word line WL during a read verification mode.

The specific operations performed during the LSBPG7 interval are effectively the same as those performed in a later described normal read mode. That is, the LSBPG7 interval differs from the normal read mode in that only a single read sequence is executed (at verification read voltage VF1) with respect to the selected word line WLn-1, and the resetting of the main latch node NLATM can be omitted. Since the remaining operations performed during the LSBPG7 interval are similar to those of the later described read mode, a detailed description thereof is omitted here to avoid redundancy.

The LSBPG8 interval is executed next in which a determination is made as to whether the selected memory cell MCsel has been correctly programmed. This is done using the data stored on the main latch node NLATM during the LSBPG7 interval.

That is, during the LSBPG8 interval, if the data stored on the main latch node NLATM is logic "H", data of a logic "L" state is output to the global output line GDOUT, meaning that a pass signal is generated. On the other hand, if the data on the latch node NLATM is logic "L", data of a logic "H" state is output to the global output line GDOUT, meaning that a fail signal is generated.

When the fail signal is generated during the LSBPG8 interval, a program loop from the LSBPG4 interval to the LSBPG8 interval is repeated until a pass signal is generated. Once the pass signal is generated, the LSBPG program mode is completed.

Figure 19A:
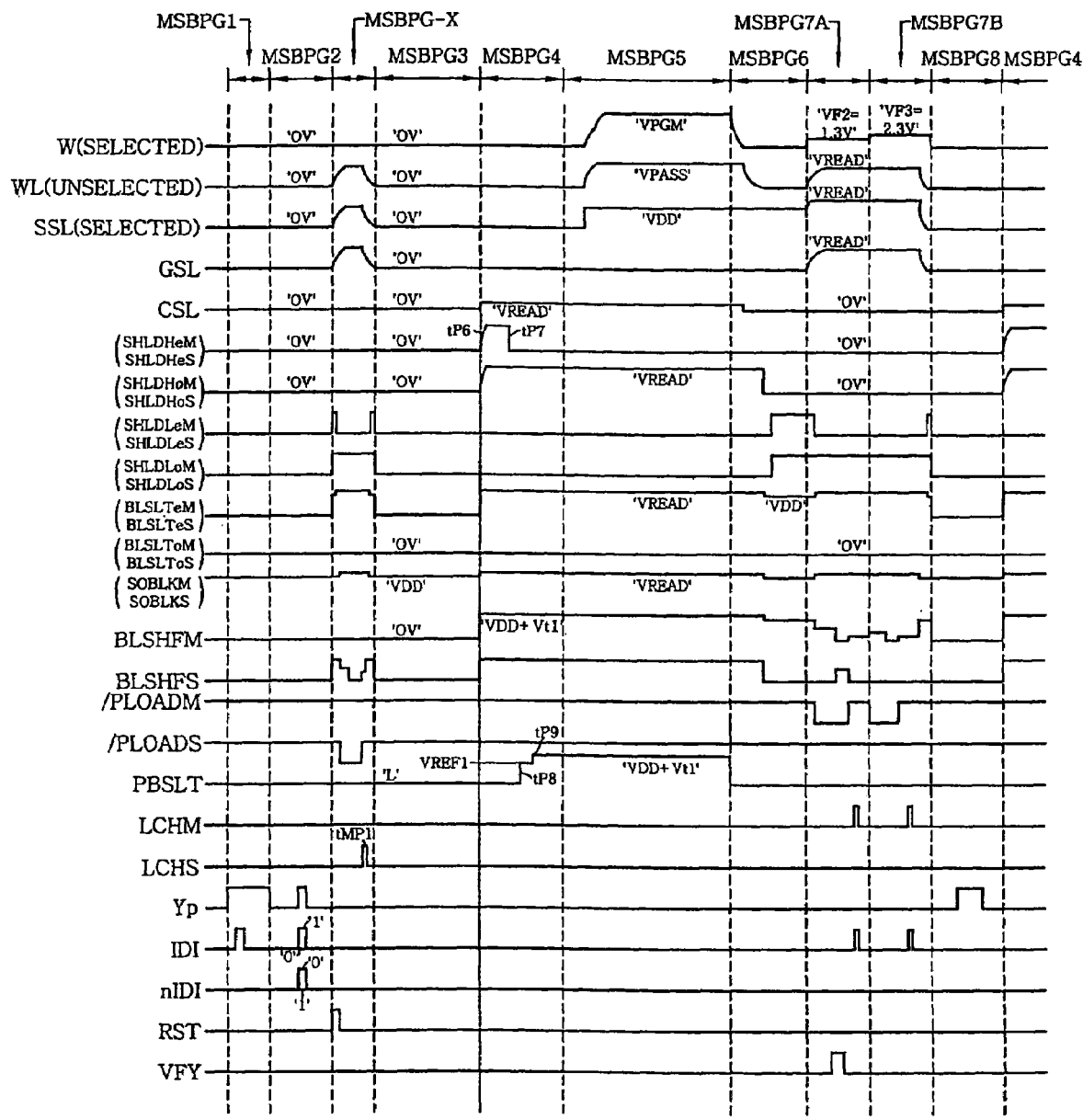
FIGS. 19A through 19C are timing diagrams for explaining the programming of the most significant bit (MSB) of the multi-bit nonvolatile memory device of FIG. 11 according to an embodiment of the present invention.
Figure 19B:
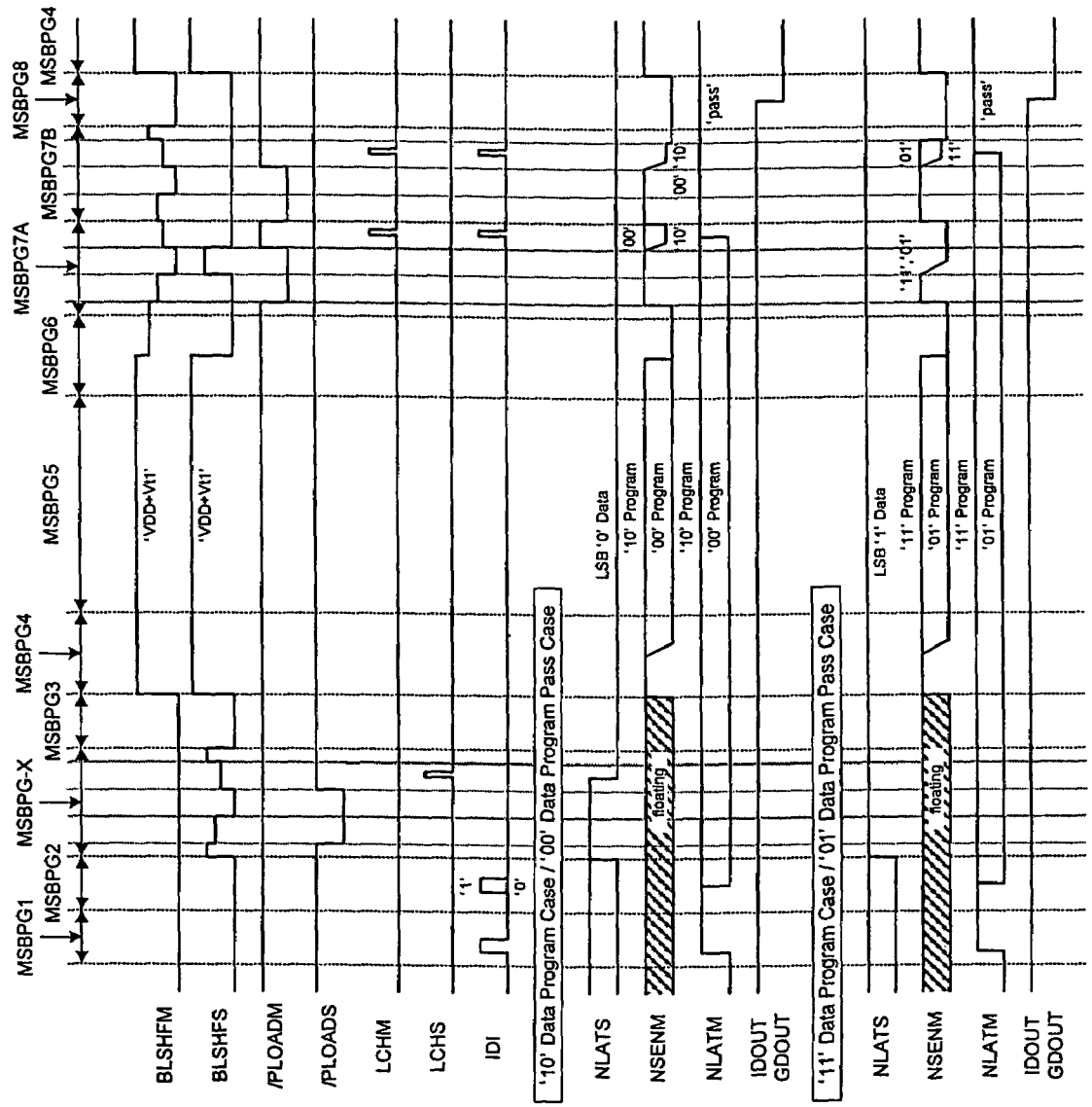
Figure 19C:
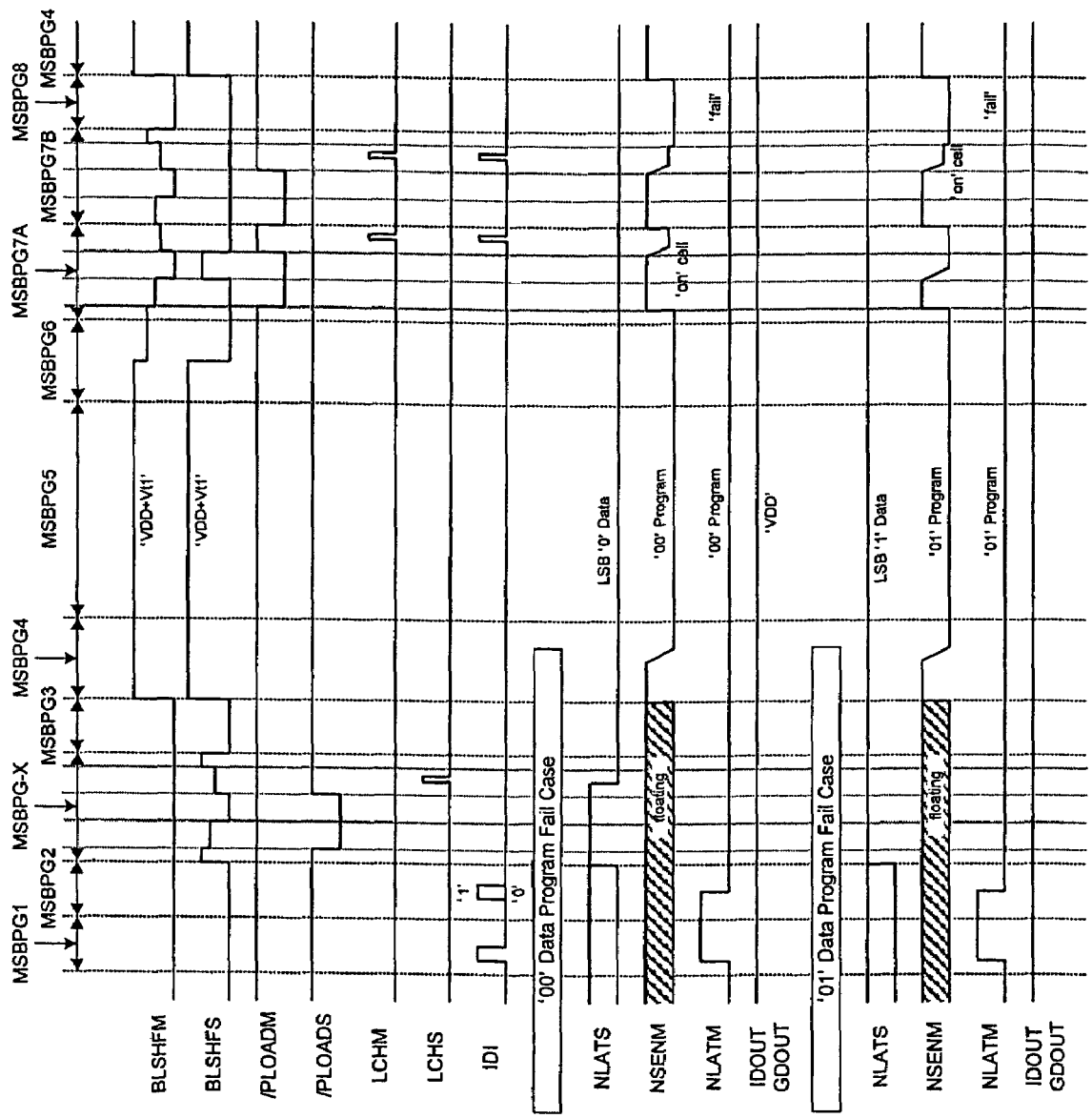

FIGS. 19A through 19C are timing diagrams showing signal and node voltages during programming of the second data bit value, i.e., the most significant bit (MSB) of a multi-bit nonvolatile semiconductor memory device according to an embodiment of the present invention. This programming sequence is referred to herein as the "second data bit value MSB" program mode MSBPG.

For explanation purposes, FIGS. 19A through 19C are segmented into a plurality of intervals, namely, a page buffer setup interval (hereinafter referred to as an "MSBPG1 interval"), a data loading interval (hereinafter referred to as an "MSBPG2 interval"), an initial reading interval (hereinafter referred to as an "MSBPG-X interval"), a high voltage enable interval (hereinafter referred to as an "MSBPG3 interval"), a bit line setup interval (hereinafter referred to as an "MSBPG4 interval"), a program execution interval (hereinafter referred to as an "MSBPG5 interval"), a recovery interval (hereinafter referred to as an "MSBPG6 interval"), a verification read interval (hereinafter referred to as an "MSBPG7 interval"), and a verification scan interval (hereinafter referred to as an "MSBPG8 interval"). The MSBPG7 interval of the FIGS. 19A through 19C is further segmented into a first verification read interval (hereinafter referred to as an "MSBPG7 A interval") and a second verification read interval (hereinafter referred to as an "MSBPG7B interval").

The MSBPG1 to MSBPG6 intervals (excluding the MSBPG-X interval) of the second data bit value program mode MSBPG are similar to the previously described LSBPG1 to LSBPG6 intervals of the first bit data value program mode LSBPG. As such, a detailed description of these intervals is omitted here to avoid redundancy.

However, as shown in FIGS. 19A through 19C, the initial read interval MSBPG-X is executed between MSBPG2 and MSBPG3 intervals. In the MSBPG-X interval, the first bit data value previously programmed in the memory cell MCsel is read, and sub-latch data corresponding to the read data value is stored on the sub-latch node NLATS of the sub-latch block 300. That is, the first read voltage VR1 of 0V is applied to a word line WL1 of the selected memory cell MCsel, and a high voltage VREAD is applied to word lines WL<n:2> of unselected memory cells MC. Then, when the first bit data value (LSB) programmed in the memory cell MCsel is logic "0", the sub-latch data stored on the sub-latch node NLATS is flipped to a logic "L" state in response to the sub-read latch signal LCHS (tMP1). In contrast, when the first bit data value (LSB) programmed in the memory cell MCsel is logic "1", the sub-latch data stored on the sub-latch node NLATS maintains a logic "H" state. The MSBPG3 through MSBPG6 intervals are then executed in sequence, and as mentioned previously, these intervals are essentially the same as the intervals LSBPG3 through LSBPG6 already described.

The first verification read interval MSBPG7A is then executed. During the MSBPG7A interval, the second verification read voltage VF2 of 1.3V is applied to the word line WL1 of the selected memory cell MCsel.

In the case where memory cell MCsel is programmed to the first data state "11" or the second data state "10", the voltage level of the main sensing node NSENM decreases to the ground voltage VSS. Therefore, the main latch data is not flipped, and instead maintains the logic "H" state that existed during the MSBPG2 interval.

In the case where the memory cell MCsel is programmed to the third data state "00", the voltage level of the main sensing node NSENM maintains the supply voltage VDD. Therefore, the main latch data is flipped from a logic "L" state to a logic "H" state.

Further, in the case wherein the memory cell MCsel is programmed to the fourth data state "01", the sub-latch data stored on the sub-latch node NLATS is logic "H". At this time, the voltage level of the main sensing node NSENM decreases to the ground voltage VSS in response to the verification read control signal VFY. Therefore, the main latch data is not flipped, but maintains a logic "L" state that existed during the MSBPG2 interval.

Next, the second verification read interval MSBPG7B is executed. During the second verification read interval MSBPG7B, the third verification read voltage VF3 of 2.3V is applied to the word line WL1 of the selected memory cell MCsel.

In the case where the memory cell MCsel is programmed to the fourth data state "01", the voltage level of the main sensing node NSENM maintains the supply voltage VDD. Therefore, the main latch data is flipped from a logic "L" state to a logic "H" state. Otherwise, the main latch data maintains its current state.

So long as one of the first through fourth data states is correctly stored in the memory cell MCsel, the main latch data will have a logic "H" state at the end of the MSBPG7B interval. As such, data of a logic "L" state, which indicates a pass condition, is provided to both the internal output line IDOUT and to the global output line GDOUT. In contrast, if the intended data state is not correctly programmed, the main latch data will have a logic "L" state. As such, data indicative of a fail condition (logic "H") will be transmitted on the internal output line IDOUT and the global output line GDOUT.

Herein, two types of fail conditions are described, namely, a "third data state failure program operation" and a "fourth data state failure program operation". The "third data state failure program operation" denotes the case where the memory cell MCsel intended to be programmed to the third data state "00" from the second data state "10" still has a threshold voltage lower than the second verification voltage VF2. The "fourth data state failure program operation" denotes the case where the memory cell MCsel intended to be programmed to the fourth data state "01" from the first data state "11" has a threshold voltage lower than the third verification voltage VF3.

FIG. 19C is a timing diagram showing relevant node and signal voltages in case of the third data state failure program operation described above.

As shown in FIG. 19C, since the input second bit data value is logic "0" during the MSBPG2 interval, main latch data of a logic "L" state is stored on the main latch node NLATM. Further, since the selected memory cell MCsel is turned ON during the first and second verification read intervals MSBPG7A and MSBPG7B, the voltage level of the main sensing node NSENM decreases to the ground voltage VSS. Therefore, the main latch data is not flipped, but maintains the logic "L" state that existed during the MSBPG2 interval.

In the third data state failure program operation, the main latch data is still in a logic "L" state even after the first and second verification read intervals MSBPG7A and MSBPG7B have terminated. Therefore, during the subsequent MSBPG8 interval, the internal output line IDOUT and the global output line GDOUT maintain a logic "H" state, to allow recognition of the data program failure.

When a fail signal is generated, a program loop from the MSBPG4 interval to the MSBPG8 interval is repeatedly performed until a pass signal is generated during the MSBPG8 interval, at which time the MSBPG program mode is completed.

FIG. 19C also shows relevant node and signal voltages for the fourth data state failure program operation described above.

Referring to FIG. 19C, since the second bit data value is "0" during the MSBPG2 interval, main latch data of a logic "L" state is stored on the main latch node NLATM. Further, since a first bit data value (LSB) programmed in the memory cell MCsel is logic "1" during the initial read interval MSBPG-X, the sub-latch data stored on the sub-latch node NLATS maintains a logic "H" state.

Further, during the first verification read interval MSBPG7A, the voltage level of the main sensing node NSENM decreases to the ground voltage VSS in response to the verification read control signal VFY. Therefore, the main latch data is not flipped, but maintains the logic "L" state that existed during the MSBPG2 interval.

Next, since the selected memory cell MCsel is determined to be an "on cell" even during the second verification read interval MSBPG7B, the voltage level of the main sensing node NSENM decreases to the ground voltage VSS. Therefore, the main latch data is not flipped, but maintains the logic "L" state that existed during the MSBPG2 interval.

As described above, in the fourth data state failure program operation, the main latch data is still in a logic "L" state even after the first and second verification read intervals MSBPG7A and MSBPG7B have terminated. Therefore, during the subsequent MSBPG8 interval, the internal output line IDOUT and the global output line GDOUT maintain a logic "H" state, thus indicating a data program failure.

When a fail signal is generated, a program loop from the MSBPG4 interval to the MSBPG8 interval is repeatedly performed until a pass signal is generated during the MSBPG8 interval, at which time the MSBPG program mode is complete.

Figure 20A:
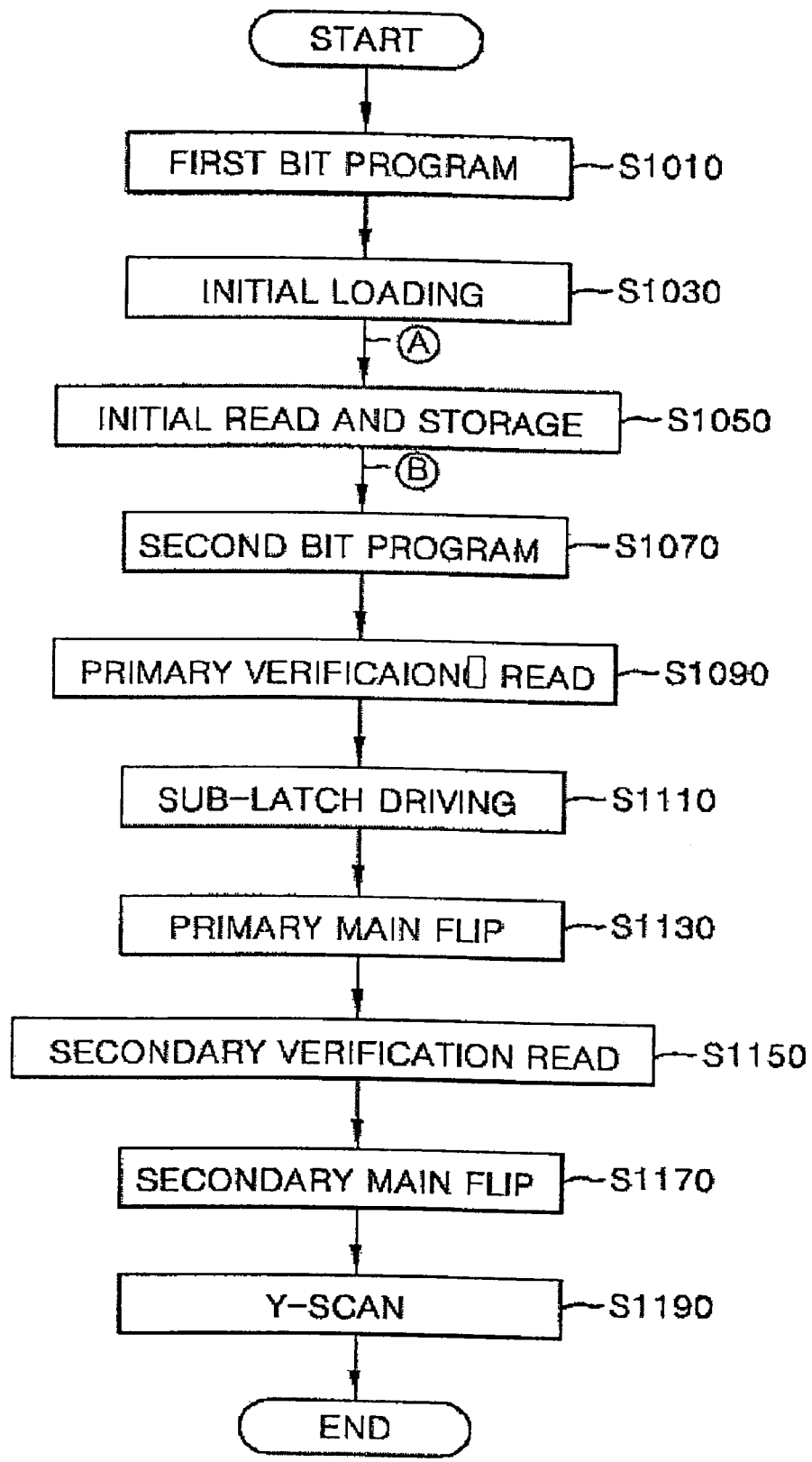
FIGS. 20A and 20B are flowcharts for describing a method of programming the multi-bit nonvolatile memory device of FIG. 11 according to an embodiment of the present invention.
Figure 20B:
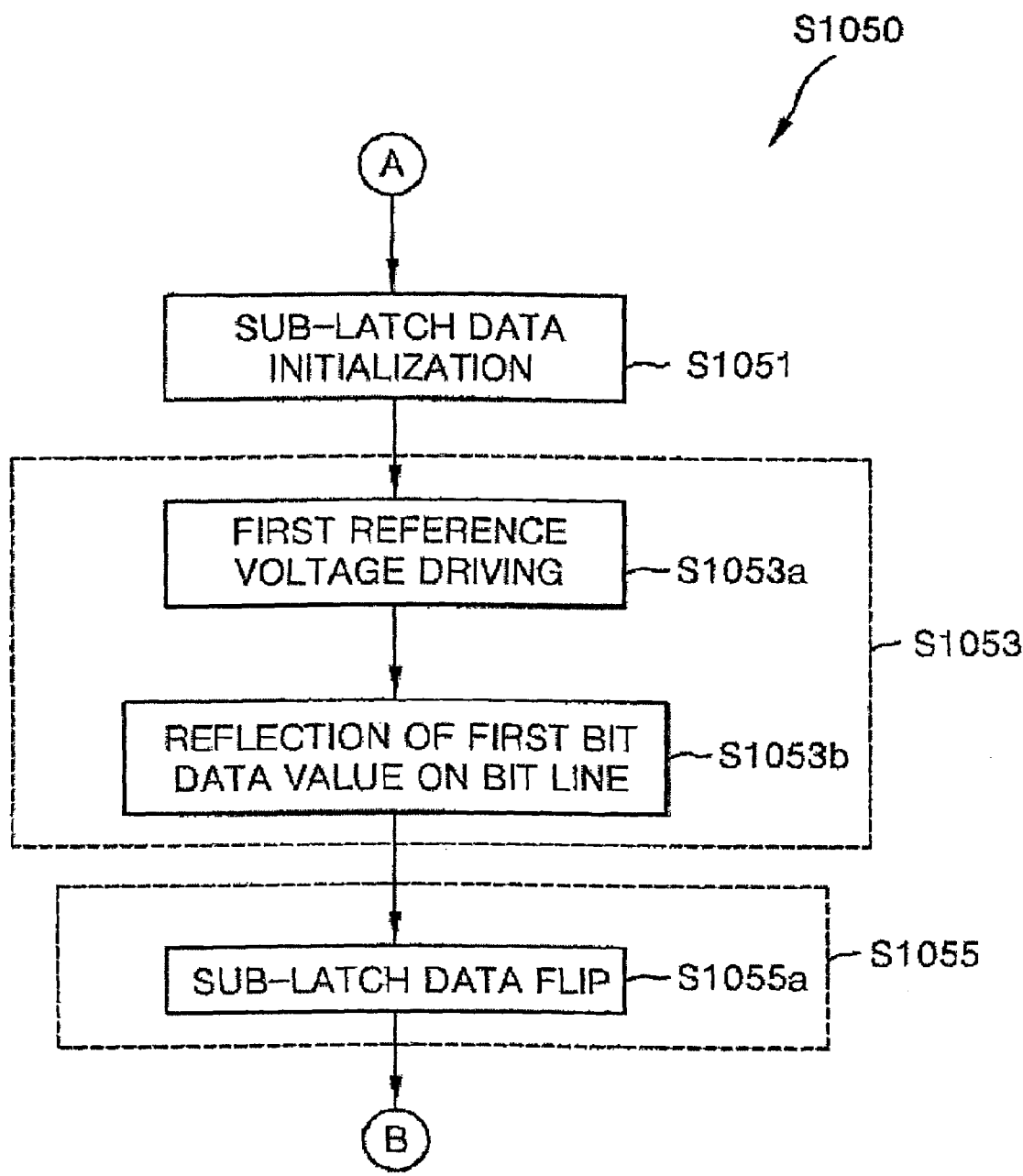

FIGS. 20A and 20B are flowcharts for use in further explaining a method of programming a multi-bit nonvolatile semiconductor memory device according to an embodiment of the present invention.

At step S1010, a selected memory cell MCsel is programmed with an externally supplied first bit data value (LSB).

Then, at step S1030, main latch data corresponding to a second bit data value is stored on the main latch node NLATM. In the case of a fourth data state failure program operation, data of a logic "L" state is stored on the main latch node NLATM.

At the initial read storage step S1050, the memory cell MCsel programmed at the first bit program step S1010 is driven to a first reference voltage, thus performing a control operation in which sub-latch data corresponding to the first bit data value is stored in the sub-latch block 300. The first reference voltage is used to distinguish the first threshold voltage group from the second threshold voltage group, and is preferably a first read voltage VR1.

In the case of the fourth data state failure program operation, the memory cell MCsel read by the first read voltage VR1 is an "on cell". Therefore, sub-latch data of logic "H" corresponding to the first bit data value of the first data state is stored on the sub-latch node NLATS of the sub-latch block 300.

The initial read storage step S1050 includes a sub-latch initialization step S1051, an initial read step S1053, and a sub-latch storage step S1055.

In the sub-latch initialization step S1051, the sub-latch data is initialized to a logic "H" state.

In the initial read step S1053, the memory cell MCsel programmed at the first bit program step S1010 is driven to reflect the first bit data value on the bit line BL. Herein, the initial read step S1053 includes a first reference voltage driving step S1053a and a bit line reflection step S1053b.

In the first reference voltage driving step S1053a, the memory cell MCsel is driven to a first reference voltage. When a first bit data value is logic "1", the memory cell MCsel is turned ON. In contrast, when a first bit data value is logic "0", the memory cell MCsel is turned OFF.

In the bit line reflection step S1053b, the first bit data value fetched at the first reference voltage driving step S1053a is reflected on the bit line BL, that is, the sub-bit line BLs. If the first bit data value is logic "1", the voltage level of the sub-bit line BLs decreases to the ground voltage VSS. In contrast, if the first bit data value is logic "0", the sub-bit line BLs maintains its pre-charged voltage level.

The sub-latch storage step S1055 includes a sub-latch flip step S1055a in which the sub-latch data is flipped according to the voltage level of the sub-bit line BLs, which ultimately is the voltage level of the bit line BL. That is, when a first bit data value is logic "1", the sub-latch data maintains its logic "H" state. In contrast, when a first bit data value is logic "0", the sub-latch data is flipped from a logic "H" state to a logic "L" state.

After the execution of the initial read storage step S1050, the second bit program step S1070 is performed.

In the second bit program step S1070, an operation is executed to program main latch data stored at the initial loading step S1030, which ultimately is an externally applied second bit data value, in the memory cell MCsel. In the case of a fourth data state failure program operation, an operation is executed to program the memory cell MCsel to the fourth data state, but the threshold voltage of the memory cell MCsel is still lower than the third verification voltage VF3.

After the execution of the second bit program step S1070, the primary verification read step S1090 and the sub-latch driving step S1110 are performed.

In the primary verification read step S1090, the memory cell MCsel is driven to a second reference voltage to reflect a second bit data value of the memory cell MCsel on the main sensing node NSENM. The second reference voltage is used to distinguish the second threshold voltage group from the third threshold voltage group, and is preferably the second verification read voltage VF2. In the case of the fourth data state failure program operation, the memory cell MCsel read by the second verification read voltage VF2 is an "off cell". Therefore, the memory cell MCsel is driven to allow the main sensing node NSENM to have a data value close to a logic "H" state according to the second bit data value.

In the sub-latch driving step S1110, the sub-latch block 300 is driven to ultimately reflect the sub-latch data stored at the initial read storage step S1050 on the main sensing node NSENM. In the case of the fourth data state failure program operation, the sub-latch block 300 is driven to reflect a data value having a logic "L" state on the main sensing node NSENM since the sub-latch data of a logic "H" state is stored at the initial read storage step S1050.

The voltage level of the main sensing node NSENM obtained by execution of the primary verification read step S1090 and the sub-latch driving step S1110 is described below.

When the memory cell MCsel is normally programmed to a first or second data state, the memory cell is determined to be an ON, and thus the voltage level of the main sensing node NSENM has a data value close to a logic "L" state. Further, since the sub-latch data maintains the "H" initialization state even when the memory cell is programmed to a fourth data state through a first data state, the main sensing node NSENM has a data value close to a logic "L" state.

In contrast, when a third data state is programmed through a second data state, the main sensing node NSENM has a data value close to a logic "H" state.

In the case of the fourth data state failure program operation, a data value having a logic "L" state is reflected on the main sensing node NSENM since the sub-latch data of a logic "H" state is stored at the initial read storage step S1050.

At the primary main flip step S1130, the main latch data is selectively flipped according to the voltage level of the main sensing node NSENM obtained at the primary verification read step S1090 and the sub-latch driving step S1110.

That is, when normal programming to a first or second data state is performed, the main latch data on the main latch node NLATM maintains the logic "H" state obtained at the initial loading step S1030. When normal programming to a third data state is performed, main latch data on the main latch node NLATM is flipped from a logic "L" state to a logic "HH" state.

In the meantime, when the memory cell is programmed to a fourth data state (including the fourth data state failure program operation), the main latch data on the main latch node NLATM maintains the logic "L" state obtained in the initial loading step S1030.

At the secondary verification read step S1150, the memory cell MCsel is driven to a third reference voltage so as to determine whether the memory cell MCsel is programmed to a fourth data state, and then ultimately to reflect the fourth data state on the main sensing node NSENM. The third reference voltage is used to distinguish the third threshold voltage group from the fourth threshold voltage group, and is preferably the third verification read voltage VF3. That is, when the memory cell is programmed to a fourth data state, the main sensing node NSENM has a voltage level close to the supply voltage VDD.

In the case of the fourth data state failure program operation, the memory cell MCsel read out by the third verification read voltage VF3 is an "on cell". Therefore, the main sensing node NSENM has a voltage level close to the ground voltage VSS.

In the secondary main flip step S1170, the main latch data is selectively flipped according to the voltage level of the main sensing node NSENM obtained at the secondary verification read step S1150. That is, when the memory cell MCsel is normally programmed to a fourth data state, the main latch data on the main latch node NLATM is flipped from a logic "L" state to a logic "H" state.

In the case of the fourth data state failure program operation, the main latch data on the main latch node NLATM maintains the logic "L" state obtained in the initial loading step S1030.

In the verification scan step S1190, internal output data is generated corresponding to main latch data obtained by the execution of the primary and secondary main flip steps S1130 and S1170. That is, when the memory cell MCsel is normally programmed to first to fourth data states, the voltage levels of all of the main latch data are logic "H". Therefore, at the verification scan step S1190, data of a logic "L" state is provided to both the internal output line IDOUT and the global output line GDOUT, so that it can be seen that the data programming is performed as intended.

In the case of the fourth data state failure program operation, the voltage level of the main latch data is logic "L" even after execution of the primary and secondary main flip steps S1130 and S1170. Therefore, in the verification scan step S1190, the internal input line IDOUT and the global output line GDOUT maintain a logic "H" state, thus indicating a data program failure.

Figure 21A:
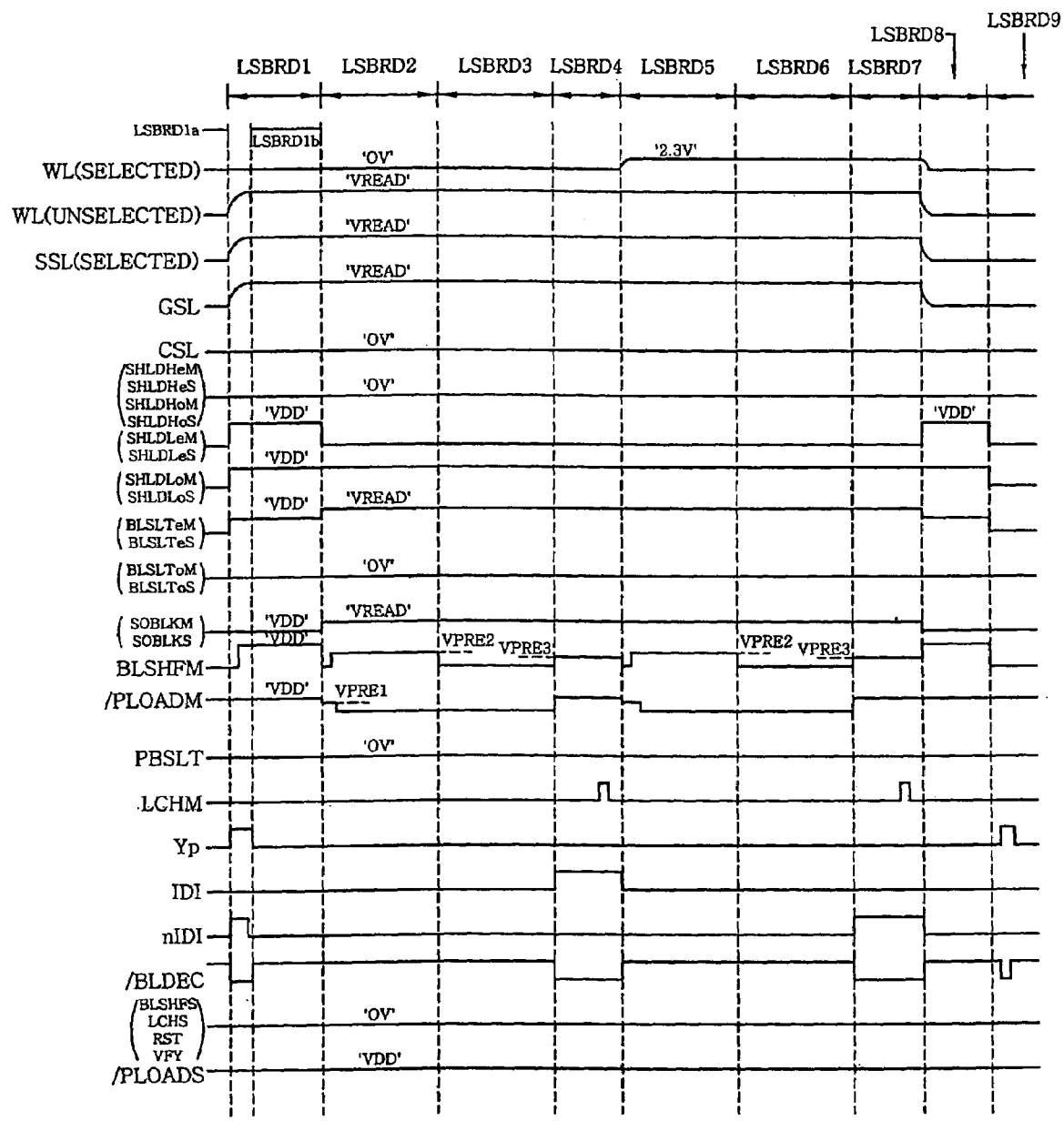
FIGS. 21A and 21B are timing diagrams for explaining the reading of the least significant bit (LSB) of the multi-bit nonvolatile memory device of FIG. 11 according to an embodiment of the present invention.
Figure 21B:
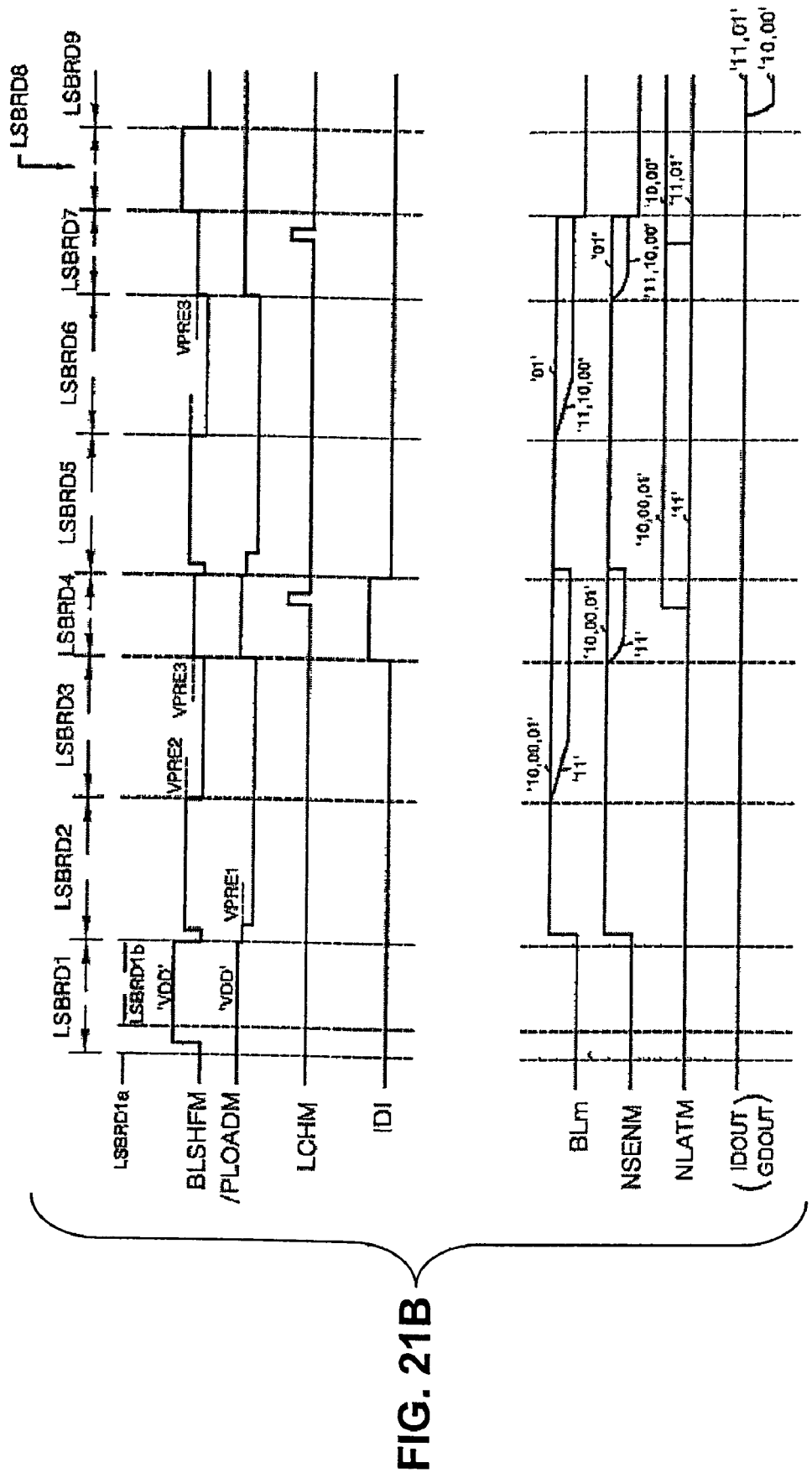

FIGS. 21A and 21B are timing diagrams showing principal signal and node voltages during reading of the first data bit value, i.e., the least significant bit (LSB) of a multi-bit nonvolatile semiconductor memory device according to an embodiment of the present invention. This programming sequence is referred to herein as the "first data bit value LSB" read mode LSBRD.

For explanation purposes, FIGS. 21A and 21B are segmented into nine (9) LSBRD intervals, namely, a bit line discharge and page buffer reset interval (hereinafter referred to as an "LSBRD1 interval"), a first bit line pre-charge interval (hereinafter referred to as an "LSBRD2 interval"), a first bit line development interval (hereinafter referred to as an "LSBRD3 interval"), a first sensing interval (hereinafter referred to as an "LSBRD4 interval"), a second bit line precharge interval (hereinafter referred to as an "LSBRD5 interval"), a second bit line development interval (hereinafter referred to as an "LSBRD6 interval"), a second sensing interval (hereinafter referred to as an "LSBRD7 interval"), a recovery interval (hereinafter referred to as an "LSBRD8 interval"), and a data fetch interval (hereinafter referred to as an "LSBRD9 interval").

For explanation purposes, the LSBRD1 interval is divided here into a page buffer reset interval (hereinafter referred to as an "LSBRD1a interval") and a bit line discharge interval (hereinafter referred to as an "LSBRD1b interval"). During the LSBRD1a interval, the main latch node NLATM of the main buffer block is reset to a logic "L" state, that is, the ground voltage VSS. During the LSBRD1b interval, bit lines BLe, BLo, BLm and BLs are discharged to the ground voltage VSS.

Resetting of the main latch node NLATM during the LSBRD1a interval is described next.

Since the buffer selection address Yp is logic "H" during the LSBRD1a interval, the main latch driving transistor 215a is turned ON. Further, since both the main selection address Yp and the sub-selection address Yr are logic "H", the voltage level of a block decoding signal /BLDEC is changed to a logic "L" state. At this time, the voltage level of the first global input line GDI is logic "H", and the voltage level of the second global input line nGDI is logic "L". Therefore, the voltage level of the first internal input line IDI is logic "L", and the voltage level of the second internal input line nIDI is logic "H". The first latch transmission transistor 213a is turned OFF, and the second latch transmission transistor 213b is turned ON. Accordingly, the voltage level of the node N211a of the main latch unit 211 is changed to a logic "H" state, and the main latch node NLATM is reset to a logic "L" state.

The discharge of the bit lines BLe, BLo, BLm and BLs during the LSBRD1b interval is described next.

During the LSBRD1b interval, a read voltage VREAD (for example, 5V) is applied to unselected word lines WL<n:2>, and the ground voltage VSS is applied to a selected word line WL1. Further, the read voltage VREAD is applied to both the string selection line (SSL) and the ground selection line (GSL), and the ground voltage VSS is applied to the common source line (CSL). Also, control signals SHLDHeM, SHLDHeS, SHLDHoM and SHLDHoS are set to the ground voltage VSS, and control signals SHLDLeM, SHLDLeS, SHLDLoM, SHLDLoS, BLSLTeM, BLSLTeS, SOBLKM and SOBLKS are set to the supply voltage VDD. In this manner, the bit lines BLe, BLo, BLm and BLs are discharged to the ground voltage VSS.

The LSBRD2 interval is executed next in which the even bit line BLe and the main bit line BLm are pre-charged to a predetermined pre-charge voltage (for example, 0.8V) to sense the data value stored in the selected memory cell MCsel.

During the LSBRD2 interval, the ground voltage VSS, which is a first reference voltage, is applied to the selected word line WL1, and the read voltage VREAD is applied to the unselected word lines WL<n:2>. Therefore, the on/off states of the selected memory cell MCsel are controlled depending on the data stored therein. When the data stored in the selected memory cell MCsel has a first data state ("11" in this example), the selected memory cell MCsel is in an ON state. In contrast, when the stored data is one of the second to fourth data states ("10", "00" and "10" in this example), the selected memory cell MCsel is in an OFF state.

During the LSBRD2 interval, the voltage levels of the control signals SHLDLeM and SHLDLeS are changed to the ground voltage VSS. Therefore, the discharge state of the even bit line BLe and the main bit line BLm is released. In this case, the control signals SHLDLoM and SHLDLoS are maintained at the supply voltage VDD. Therefore, the voltage level of the odd bit line BLo maintains the ground voltage VSS, and then functions as a shielding line between even bit lines BLe.

Further, after the main pre-charge signal /PLOADM changes from the supply voltage VDD to a first preliminary voltage VPRE1 and maintains the first preliminary voltage VPRE1 for a certain period of time, the main pre-charge signal /PLOADM decreases to the ground voltage VSS. Therefore, the main pre-charge transistor 230a is turned ON, and the main sensing node NSENM is thus pre-charged to the supply voltage VDD.

In this case, the voltage level of a main bit line shutoff signal BLSHFM is changed to a second preliminary voltage VPRE2 having a voltage level between the supply voltage VDD and the ground voltage VSS. Therefore, the main sensing node NSENM and the main bit line BLm are electrically connected to each other. As described above, the main bit line shutoff signal BLSHFM gates the main bit line shutoff transistor 240a with the second preliminary voltage VPRE2. Accordingly, the main bit line BLm is recharged to a voltage level that is lower than the second preliminary voltage VPRE2 by the threshold voltage of the main bit line shutoff transistor 240a through the use of current provided from the main pre-charge transistor 230a.

The LSBRD3 interval is executed next in which the main bit line BLm senses the data stored in the selected memory cell MCsel and develops the sensed data thereon.

During the LSBRD3 interval, since the main bit line shutoff signal BLSHFM is the ground voltage VSS, the main bit line shutoff transistor 240a is set to an ON state. Therefore, the main bit line BLm is electrically isolated from the main sensing node NSENM, and the development of data on the main bit line BLm progresses.

When a data value stored in the selected memory cell MCsel is a first data state ("11" in this example), data on the main bit line BLm is discharged to the common source line (CSL). Therefore, the voltage level of the main bit line BLm approaches the ground voltage VSS. When the data value in the selected memory cell MCsel is one of the second to fourth data states ("10", "00" and "0" in this example), the voltage level of the main bit line BLm does not change, except for any fluctuation caused by leakage current.

Further, the main pre-charge transistor 230a maintains ON state and is then turned off just before the LSBRD3 interval terminates. Therefore, the main sensing node NSENM is changed to a floating state after maintaining the supply voltage VDD.

The LSBRD4 interval is executed next in which data developed on the main bit line BLm, that is, data corresponding to the voltage level of the main bit line BLm, is stored on the main latch node NLATM of the main buffer block 200.

First, the floating state of the main sensing node NSENM occurring during the LSBRD3 interval is maintained. Thereafter, the voltage level of the main bit line shutoff signal BLSHFM is changed to a third preliminary voltage VPRE3, thus turning ON the main bit line shutoff transistor 240a. According to this example, the third preliminary voltage VPRE3 has a voltage level between the ground voltage VSS and the supply voltage VDD. The voltage level of the main sensing node NSENM is determined according to the voltage level of data developed on the main bit line BLm.

In this case, the data value of the first internal input line IDI is changed to a logic "H" state, whereby the first latch transmission transistor 213a is turned ON. Further, the main latch node NLATM stores the data loaded on the main sensing node NSENM, determined according to the voltage level of the main bit line BLm, which ultimately corresponds to the data stored in the selected memory cell MCsel. That is, when a data value stored in the selected memory cell MCsel is a first data state ("11" in this example), the voltage levels of the main bit line BLm and the main sensing node NSENM are close to the ground voltage VSS. Therefore, even if the main read latch signal LCHM is enabled to a logic "H" state, the main latch data on the main latch node NLATM maintains a logic "L" state.

If a data value stored in the selected memory cell MCsel is one of the second to fourth data states ("10", "00" and "01" in this example), the main bit line BLm maintains the initially pre-charged voltage level, so that the main sensing node NSENM maintains a logic "H" state. Therefore, when the main read latch signal LCHM is enabled to a logic "H" state, the main latch data on the main latch node NLATM is flipped to a logic "H" state.

The second bit line precharge interval (LSBRD5 interval), a second bit line development interval (LSBRD6 interval) and a second sensing interval (LSBRD7 interval) are executed next.

Except as discussed below, the operations executed during the LSBRD5, LSBRD6 and LSBRD7 intervals are closely similar to those executed during the LSBRD2, LSBRD3 and LSBRD4 intervals, respectively.

Specifically, while the first reference voltage (VSS) is applied to the selected word line WL1 during the LSBRD2, LSBRD3 and LSBRD4 intervals, the third reference voltage (about 2.3V) is applied to the selected word line WL1 during the LSBRD5, LSBRD6 and LSBRD7 intervals. Therefore, when a data value stored in the selected memory cell MCsel is one of the first to third data states ("11", "10" and "00" in this example), the selected memory cell MCsel is in an ON state. When the stored data value is a fourth data state ("01" in this example), the selected memory cell MCsel is in an ON state.

The voltage levels of the main bit line BLm and the main sensing node NSENM obtained during the LSBRD6 and LSBRD7 intervals are somewhat different from those obtained during the LSBRD3 and LSBRD4 intervals. That is, when a data value stored in the selected memory cell MCsel is the one of the first to third data states ("11", "10" and "00" in this example) during the LSBRD6 and LSBRD7 intervals, the voltage levels of the main bit line BLm and the main sensing node NSENM approach the ground voltage VSS. Further, when a data value stored in the selected memory cell MCsel is the fourth data state ("01" in this example), the voltage levels of the main bit line BLm and the main sensing node NSENM hardly change.

Further, the LSBRD7 interval is different from the LSBRD4 interval in that the first internal input line IDI is logic "H" during the LSBRD4 interval, while the second internal input line nIDI is logic "H" during the LSBRD7 interval. Therefore, the main latch data is flipped from a logic "L" state to a logic "H" state during the LSBRD4 interval, while the main latch data is flipped from a logic "H" state to a logic "L" state during the LSBRD7 interval. Therefore, when a data value in the selected memory cell MCsel is a fourth data state ("01" in this example), the main latch data is flipped from a logic "H" state to a logic "L" state.

Consequently, after the main read latch signal LCHM is enabled to a logic "H" state during the LSBRD7 interval, the logic state of the main latch data on the main latch node NLATM is as follows.

If a data value in the selected memory cell MCsel is the first or fourth data state ("11" or "01" in this example), that is, if a first bit data value (LSB) is "1", the voltage level of the main latch data on the main latch node NLATM is logic "L". If the data value in the selected memory cell MCsel is a second or third data state ("10" or "00", in this example), that is, if a first bit data value (LSB) is "0", the voltage level of the main latch data on the main latch node NLATM is logic "H".

The other operations executed during the LSBRD5, LSBRD6 and LSBRD7 intervals are the same as those executed during the LSBRD2, LSBRD3 and LSBRD4 intervals, and accordingly, a detailed description thereof is omitted here to avoid redundancy.

The LSBRD8 interval is executed next in which the main bit line BLm and the main sensing node NSENM are reset.

During the LSBRD8 interval, the voltage levels of the control signals SHLDLeM and SHLDLeS are changed to the supply voltage VDD, and the voltage levels of the control signals BLSLTeM, BLSLTeS and SOBLKM are changed from the read voltage VREAD to the supply voltage VDD. Therefore, the main bit line BLm and the main sensing node NSENM are reset to the ground voltage VSS.

Further, the voltage levels of unselected word lines WL<n:2>, the string selection line (SSL) and the ground selection line (GSL) are changed from the read voltage VREAD to the ground voltage VSS.

The LSBRD9 interval is executed next in which data corresponding to the main latch data stored on the main latch node NLATM during the LSBRD7 interval is output to the global output line GDOUT through the internal output line IDOUT.

During the LSBRD9 interval, the buffer selection address Yp and the block decoding signal /BLDEC are pulse activated. Data corresponding to the main latch data is transmitted to the global output line GDOUT through the internal output line IDOUT in response to the activation of the block decoding signal /BLDEC.

In the example of this embodiment, the global output line GDOUT is pre-charged to the supply voltage VDD by an output line pre-charge circuit (not shown) before the block decoding signal/BLDEC is activated.

Therefore, when a first bit data value (LSB) stored in the selected memory cell MCsel is "11", data on the main latch node NLATM is logic "L", whereby data on the global output line GDOUT is changed to a logic "H" state. When a first bit data value (LSB) in the selected memory cell MCsel is "0", data on the main latch node NLATM is logic "H", whereby data on the global output line GDOUT is discharged to a logic "L" state. In this manner, the global output line GDOUT carries a signal indicative of the LSB of the selected memory cell MCsel.

Figure 22A:
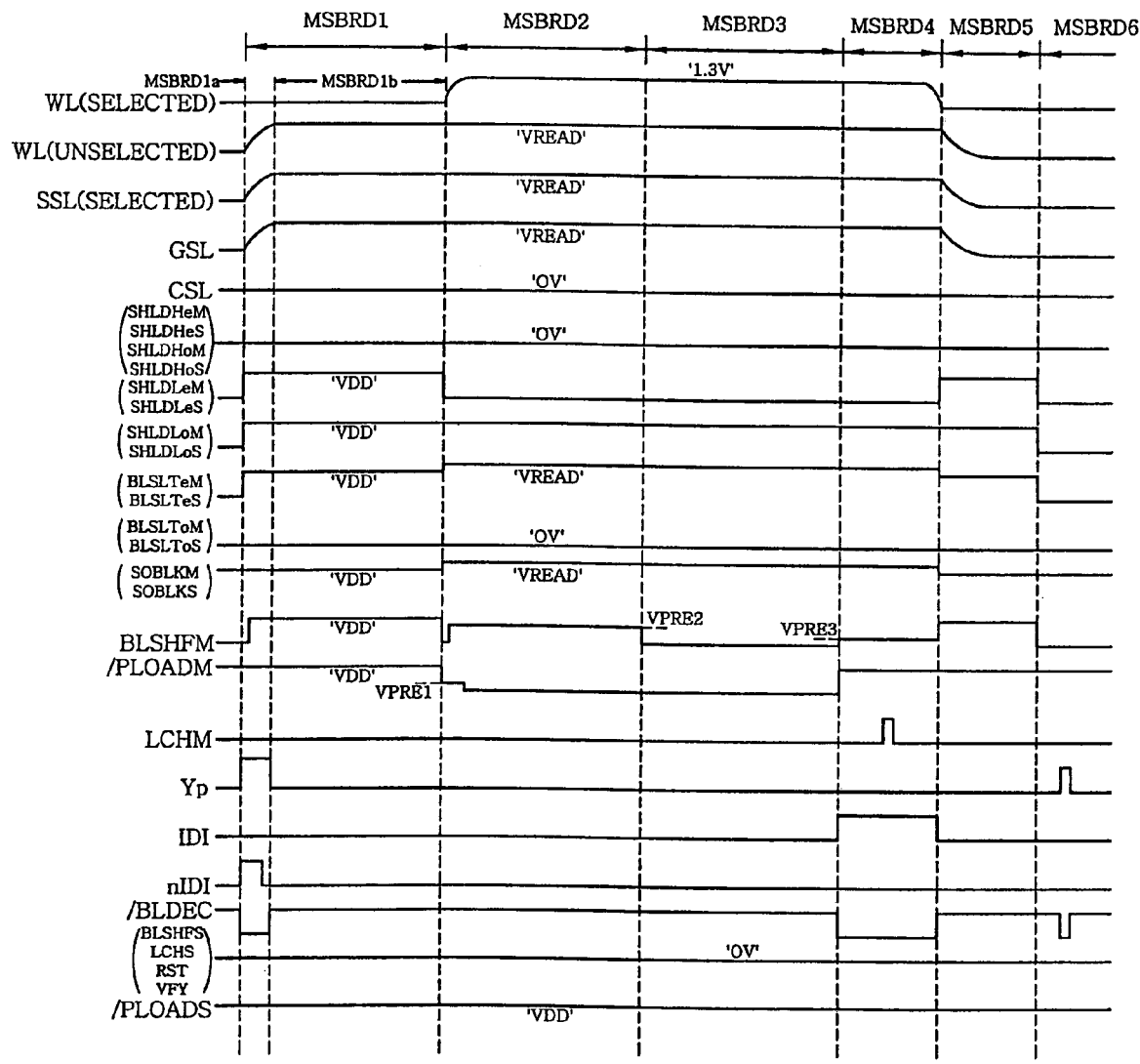
FIGS. 22A and 22B are timing diagrams for explaining the reading of the most significant bit (MSB) of the multi-bit nonvolatile memory device of FIG. 11 according to an embodiment of the present invention.
Figure 22B:
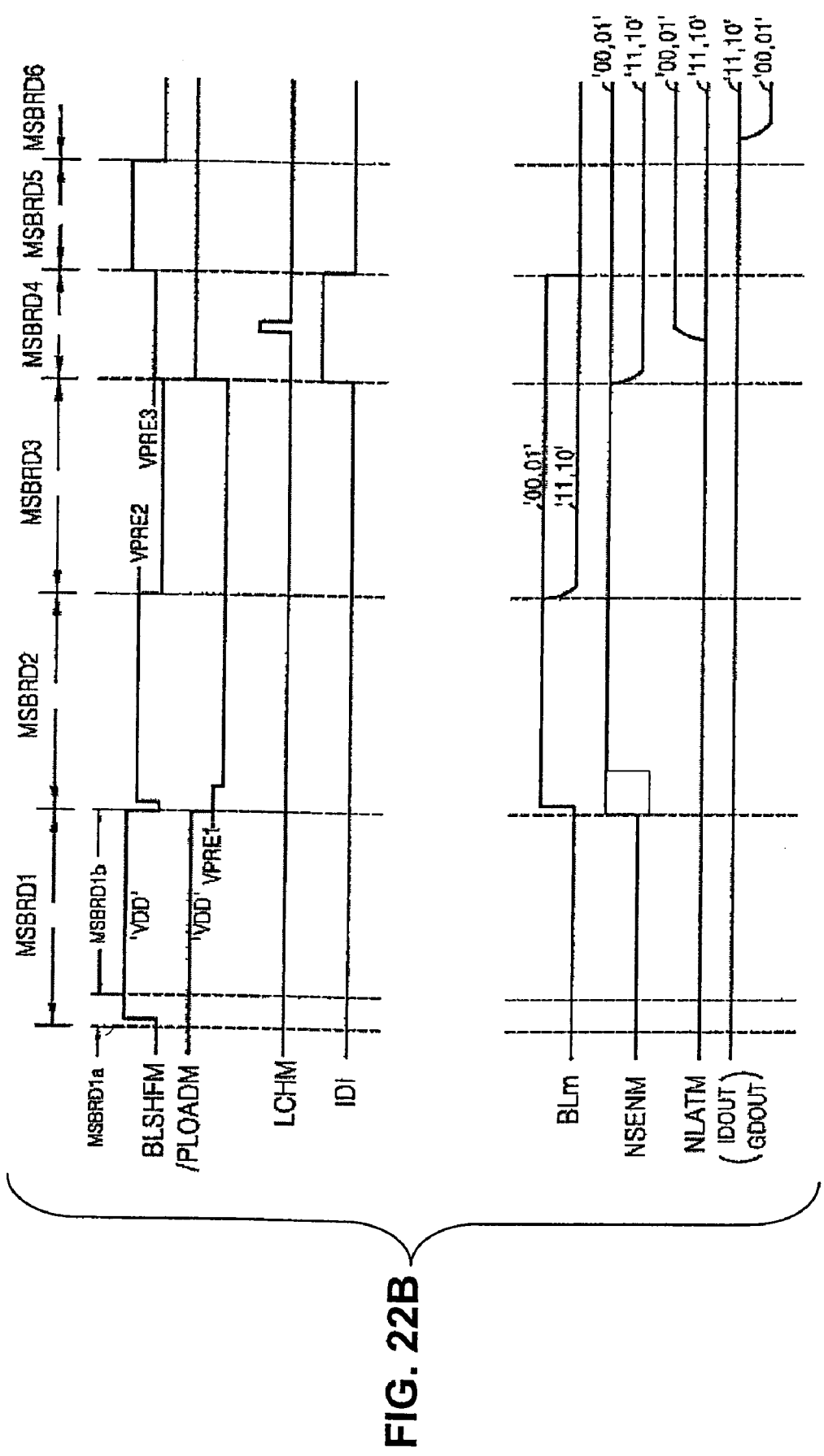

FIGS. 22A and 22B are timing diagrams showing principal signal and node voltages during reading of the second data bit value, i.e., the most significant bit (MSB) of a multi-bit nonvolatile semiconductor memory device according to an embodiment of the present invention. This programming sequence is referred to herein as the "second data bit value MSB" read mode MSBRD.

For explanation purposes, FIGS. 22A and 22B are segmented into six (6) LSBRD intervals, namely, a bit line discharge and page buffer reset interval (hereinafter referred to as an "MSBRD1 interval"), a bit line pre-charge interval (hereinafter referred to as an "MSBRD2 interval"), a bit line development interval (hereinafter referred to as an "MSBRD3 interval"), a sensing interval (hereinafter referred to as an "MSBRD4 interval"), a recovery interval (hereinafter referred to as an "MSBRD5 interval"), and a data fetch interval (hereinafter referred to as an "MSBRD6 interval").

Except as noted below, the operations executed during the MSBRD1 interval through the MSBRD4 interval of FIGS. 22A and 22B are closely similar to those executed during the previously described LSBRD1 interval through LSBRD4 interval of FIGS. 21A and 21B.

The ground voltage VSS, which is the first reference voltage, is applied to a selected word line WL1 during the LSBRD1 through LSBRD4 intervals, while the second reference voltage of about 1.3V is applied to the selected word line WL1 during the MSBRD1 through MSBRD4 intervals. Therefore, when a data value stored in the selected memory cell MCsel is one of first and second data states ("11" and "10" in this example), the selected memory cell MCsel is in an ON state. When the stored data value is one of third and fourth data states ("00" and "01" in this example), the selected memory cell MCsel is in an OFF state.

Accordingly, the voltage levels of the main bit line BLm and the main sensing node NSENM during the MSBRD3 and MSBRD4 intervals are somewhat different from those during the LSBRD3 and LSBRD4 intervals. That is, during the MSBRD3 and MSBRD4 intervals, when the data value of the selected memory cell MCsel is one of the first and second data states ("11" and "10" in this example), the voltage levels of the main bit line BLm and the main sensing node NSENM approach the ground voltage VSS. Further, when the data value of the selected memory cell MCsel is one of the third and fourth data states ("00" and "01" in this example), the voltage levels of the main bit line BLm and the main sensing node NSENM hardly change.

The logic state of the main latch data on the main latch node NLATM is altered after the voltage level of the main read latch signal LCHM is enabled to a logic "H" state during the MSBRD4 interval as follows. When a data value stored in the selected memory cell MCsel is a first or second data state ("11" or "10" in this example), that is, when a second bit data value (MSB) is logic "1", main latch data on the main latch node NLATM is logic "L". When a data value stored in the selected memory cell MCsel is the third or fourth data state ("00" or "01" in this example), that is, when a second bit data value (MSB) is logic "0", the main latch data on the main latch node NLATM is logic "H".

The other operations executed during the MSBRD1 through MSBRD4 intervals are the same as those executed during the LSBRD1 through LSBRD4 intervals, and accordingly, a detailed description thereof is omitted here to avoid redundancy.

The MSBRD5 and MSBRD6 intervals are executed next and, except as discussed below, are closely similar to those executed during the LSBRD8 and LSBRD9 intervals of FIGS. 21A and 22B, and accordingly, a detailed description thereof is omitted here to avoid redundancy.

When the second bit data value (MSB) stored in the selected memory cell MCsel is logic "1", data on the main latch node NLATM is logic "L", whereby data on the global output line GDOUT is logic "H". When the second bit data value (MSB) stored in the selected memory cell MCsel is logic "0", data on the main latch node NLATM is logic "H", whereby data on the global output line GDOUT is discharged to a logic "L" state. In this manner, data indicative of the MSB of the selected memory cell MCsel is carried on the global output line GDOUT.

Figure 23:
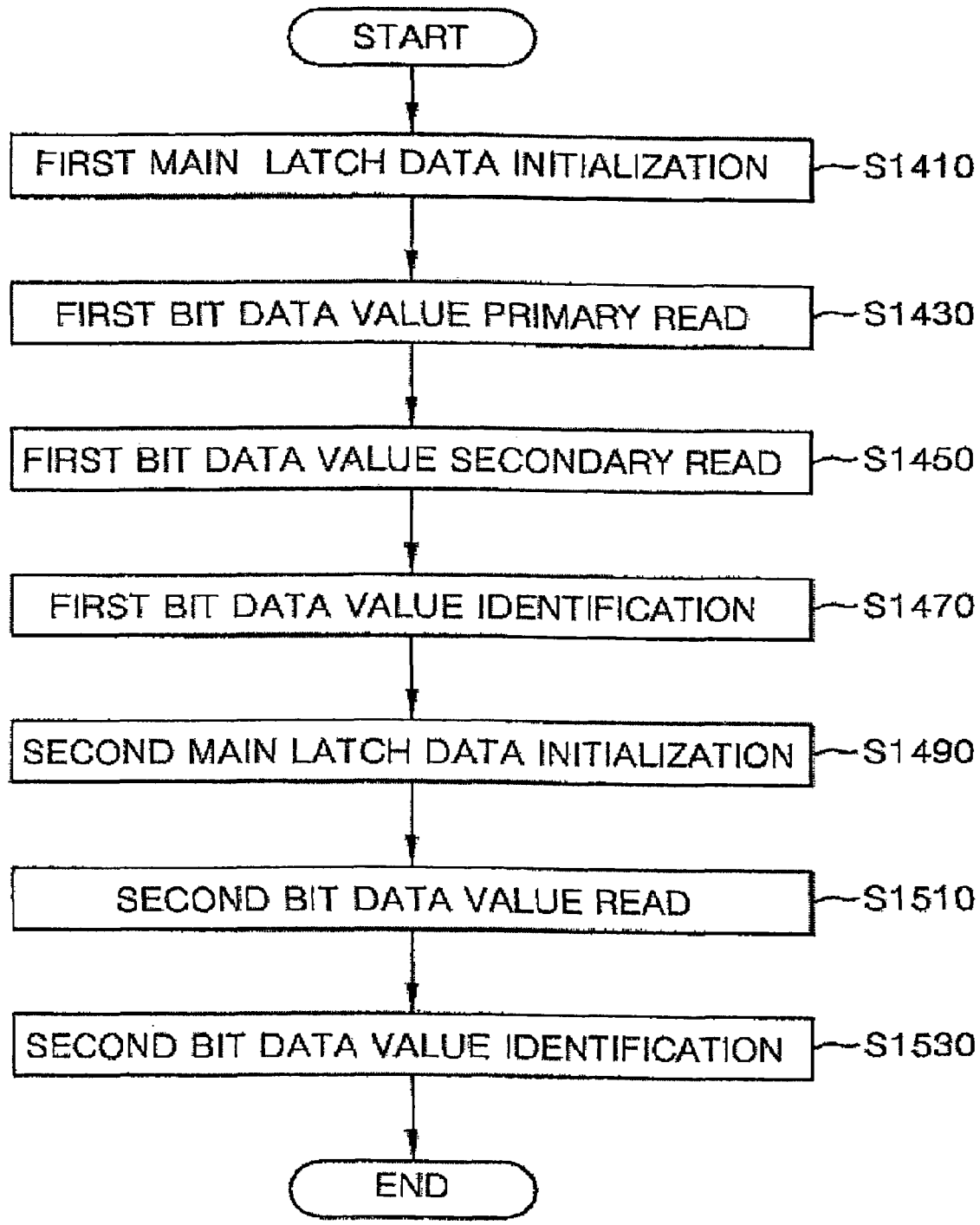
FIG. 23 is a flowchart for describing a method of programming the multi-bit nonvolatile memory device of FIG. 11 according to an embodiment of the present invention.

FIG. 23 is a flowchart for further describing a method of reading a multi-bit nonvolatile semiconductor memory device according to an embodiment of the present invention.

The method of executing a read mode in the example illustrated in FIG. 23 includes a first main latch data initialization step S1410, a first bit data value primary read step S1430, a first bit data value secondary read step S1450, a first bit data value identification step S1470, a second main latch data initialization step S1490, a second bit data value read step S1510, and a second bit data value identification step S1530.

In the first main latch data initialization step S1410, the main latch data stored on the main latch node NLATM is initialized to a logic "L" state. In this case, the main latch driving voltage provided from the main latch driving unit 215 is utilized.

In the first bit data value primary read step S1430, the selected memory cell MCsel is driven to the first reference voltage.

At this time, when data stored in the memory cell MCsel has one of the second to fourth data states ("10", "00" and "01" in this example), the main latch data is flipped from a logic "L" state to a logic "H" state. Further, the main latch data is flipped with the main sensing response voltage provided from the main sensing response unit 217. In contrast, when data stored in the memory cell MCsel has the first data state ("11" in this example), the main latch node is not flipped.

At the first bit data value secondary read step S1450, the selected memory cell MCsel is driven to a third reference voltage. At this time, when data stored in the memory cell MCsel has a fourth data state ("01" in this example), the main latch data is flipped from a logic "H" state to a logic "L" state. Further, the main latch data is flipped with the main sensing response voltage. In contrast, when data stored in the memory cell MCsel has one of the first to third data states ("11", "10" and "00" in this example), the main latch data does not flip.

In the first bit data value verification step S1470, the internal output line IDOUT and the global output line GDOUT are driven by the main latch data obtained by the execution of the first bit data value secondary read step S1450. Further, in this same step, the first bit data value (LSB) is identified.

In the second main latch data initialization step S1490, the main latch data stored on the main latch node NLATM is initialized again to a logic "L" state. At this time, the main latch driving voltage provided from the main latch driving unit 215 is utilized.

In the second bit data value read step S1510, the selected memory cell MCsel is driven to the second reference voltage. In this case, when data stored in the memory cell MCsel has one of the third and fourth data states ("00" and "01" in this example), the main latch data is flipped from a logic "L" state to a logic "H" state. Further, the main latch data is flipped with the main sensing response voltage provided from the main sensing response unit 217 (refer to FIG. 14). In contrast, when data stored in the memory cell MCsel is one of the first and second data states ("11" and "10" in this example), the main latch data does not flip.

In the second bit data value identification step S1530, the internal output line IDOUT and the global output line GDOUT are driven by the main latch data obtained by the execution of the second bit data value read step S1510. Further, the second bit data value (MSB) is identified at the second bit data value identification step S1530.

Thus, the LSB and MSB data values on the global output line GDOUT are identified at the two identification steps S1470 and S1530.

Figure 24:
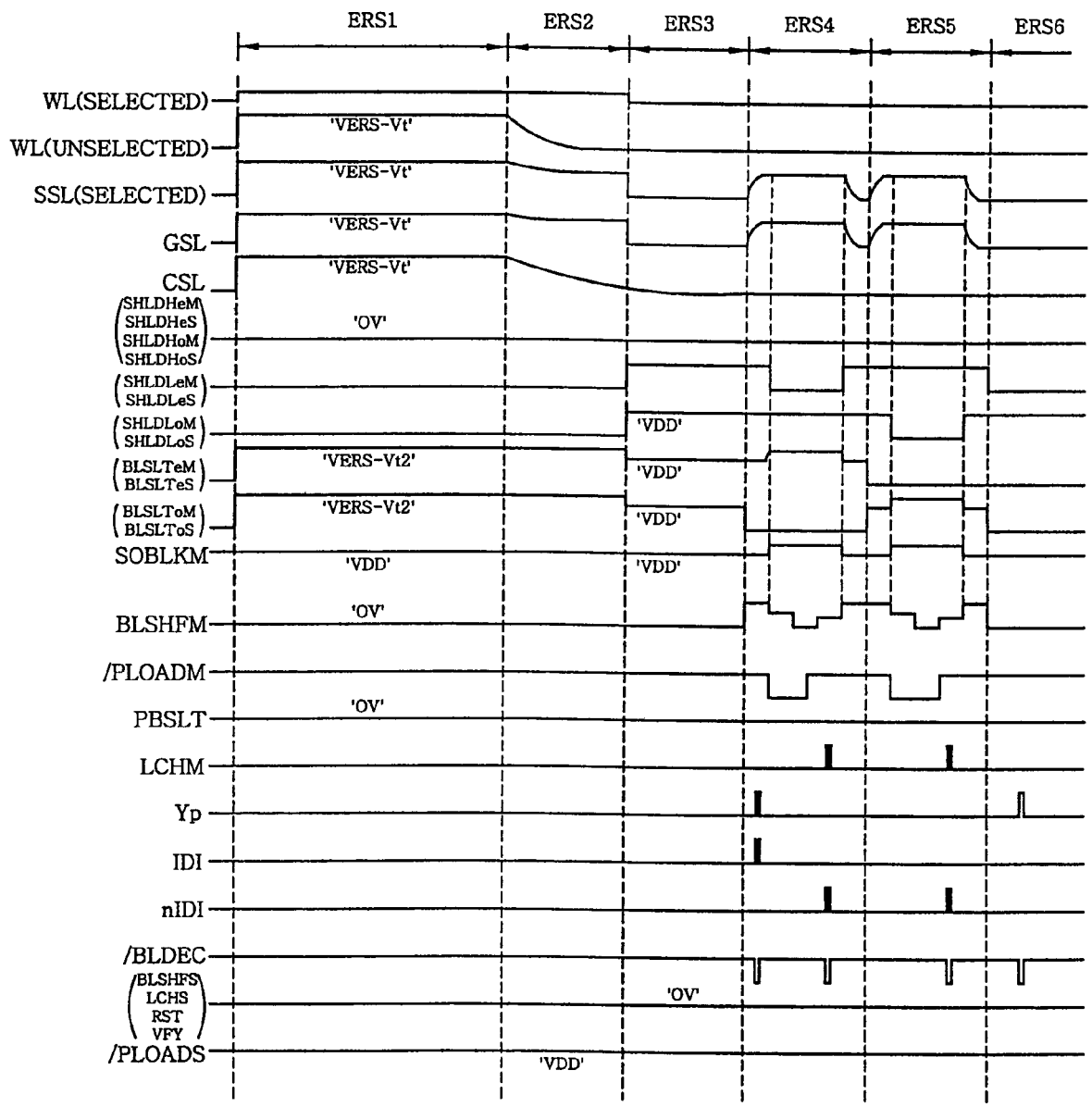
FIG. 24 is a timing diagram for explaining the erasing of the multi-bit nonvolatile memory device of FIG. 11 according to an embodiment of the present invention.

FIG. 24 is a timing diagram showing principal signal and node voltages during erasing of a multi-bit nonvolatile semiconductor memory device according to an embodiment of the present invention. This programming sequence is referred to herein as an erase mode ERS.

For explanation purposes, FIG. 24 is segmented into six (6) ERS intervals, namely, an erase execution interval (hereinafter referred to as an "ERS1 interval"), a first recovery interval (hereinafter referred to as an "ERS2 interval"), a second recovery interval (hereinafter referred to as an "ERS3 interval"), a first verification read interval (hereinafter referred to as an "ERS4 interval"), a second verification read interval (hereinafter referred to as an "ERS5 interval"), and a Y-scan interval (hereinafter referred to as an "ERS6 interval").

During the ERS1 interval, an erase voltage VERS is applied to the bulk region of the memory cells MC, and a voltage of about 0.3V is applied to selected word lines to erase data from corresponding memory cells. In this example, the erase voltage VERS is about 20V. Further, unselected word lines are adjusted to a floating state. In this case, the voltage level of the unselected word lines approaches the erase voltage VERS as the result of coupling with the bulk region. Therefore, an erase operation is not performed in the memory cells connected to the unselected word lines.

Also during the ERS1 interval, the voltage levels of control signals SHLDHeM, SHLDHeS, SHLDHoM, SHLDHoS, SHLDLeM, SHLDLeS, SHLDLoM and SHLDLoS are maintained at the ground voltage VSS, and the voltage levels of control signals BLSLTeM, BLSLTeS, BLSLToM and BLSLToS are changed to "VERS-Vt2". Sensing node blocking signals SOBLKM and SOBLKS maintain the supply voltage VDD. In this example, voltage "Vt2" represents the threshold voltage of a high voltage NMOS transistor and is about 1.3V.

During the ERS2 and ERS3 intervals, the voltages of the bulk region of the memory cells and the bit line BL are adjusted to sense the data stored in the selected memory cell MCsel.

That is, the ERS2 interval, during which the common source line (CSL) is discharged, is executed in which the bulk region of the memory cell MC is floated and a voltage of VERS-Vt charged on the CSL is discharged to the ground voltage VSS.

In the ERS3 interval, the bulk region and the bit lines BLm, BLs, BLe and BLo are discharged. That is, during the ERS3 interval, the voltage levels of the control signals SHLDHeM, SHLDHeS, SHLDHoM and SHLDHoS are changed to the ground voltage VSS. Further, the voltage levels of the control signals, SHLDLeM, SHLDLeS, SHLDLoM, SHLDLoS, BLSLTeM, BLSLTeS, BLSLToM and BLSLToS are changed to the supply voltage VDD. Therefore, the bit lines BLm, BLs, BLe and BLo are discharged to the ground voltage VSS.

During the ERS4 and ERS5 intervals, the main latch node NLATM is pre-charged to sense any un-erased data of the memory cell MC. Further, the data stored in the memory cell is sensed by and stored on the main latch node NLATM.

That is, during the ERS4 interval, the data of the memory cell MC that is connected to the even bit line BLe and was not erased during the ERS1 interval is sensed after the main latch node NLATM is pre-charged to a logic "H" state. The operation performed during the ERS4 interval is closely similar to that performed in the second bit data value (MSB) read mode. However, in the ERS4 interval, the first reference voltage of 0V is applied to all word lines WL<n:1> in the selected memory block and the main latch node NLATM is reset to a logic "H" state. Further, sensing of read data is performed by the activation of the second internal input line nIDI during the ERS4 interval. Since the remaining operations executed during the ERS4 interval are essentially the same as those performed in the second bit data value (MSB) read mode, a description of the ERS4 interval is omitted here to avoid redundancy.

The ERS5 interval is executed next to sense data that is stored in the memory cell MC of the odd bit line BLo and that has not been erased during the ERS1 interval. The operations executed during the ERS5 interval differ from those of the ERS4 interval in that setting the main latch node NLATM is not performed. Otherwise, the ERS5 interval is closely similar to the ERS4 interval, and accordingly, a detailed description thereof is omitted to avoid redundancy.

The ERS6 interval is executed next in which a determination is made as to whether the erase operation for the memory cells MC has been correctly performed with respect to the data sensed during the ERS4 and ERS5 intervals.

If the main latch node NLATM is in a logic "H" state during the ERS6 interval, data of a logic "L" state is output to the global output line GDOUT, which means that a pass signal is generated. In contrast, if the main latch node NLATM is in a logic "L" state, data of a logic "H" state is output to the global output line GDOUT, which means that a fail signal is generated. Therefore, when the pass signal is generated, the erase mode is complete.

However, during the ERS6 interval, if the main latch node NLATM maintains a logic "H" state, the memory cell MCsel is sensed as an "on cell" in both the ERS4 and ERS5 intervals. If the even bit line BLe is connected to an "off cell", the main latch node NLATM is discharged to the ground voltage VSS during the ERS4 interval. Therefore, even though a memory cell MC connected to the odd bit line BLo is an "on cell" during the ERS5 interval, data on the main latch node NLATM is logic "L".

Further, if the odd bit line BLo is connected to an "off cell", then data on the main latch node NLATM becomes logic "L" during the ERS5 interval, even if a memory cell MC connected to the even bit line BLe is an "on cell". As such, a fail signal is generated.

Therefore, a pass signal is generated only when both the even bit line BLe and the odd bit line BLo are connected to "on cells".

Although the preferred embodiments of the present invention have been disclosed for illustrative purposes, those skilled in the art will appreciate that various modifications, additions and substitutions are possible, without departing from the scope and spirit of the invention. For example, a NAND-type nonvolatile semiconductor memory device is shown and described in this specification. However, it will be apparent to those skilled in the art that the technical spirit of the present invention can also be applied to other types of nonvolatile semiconductor memory devices, such as AND-type semiconductor memory devices.

Figure 25:
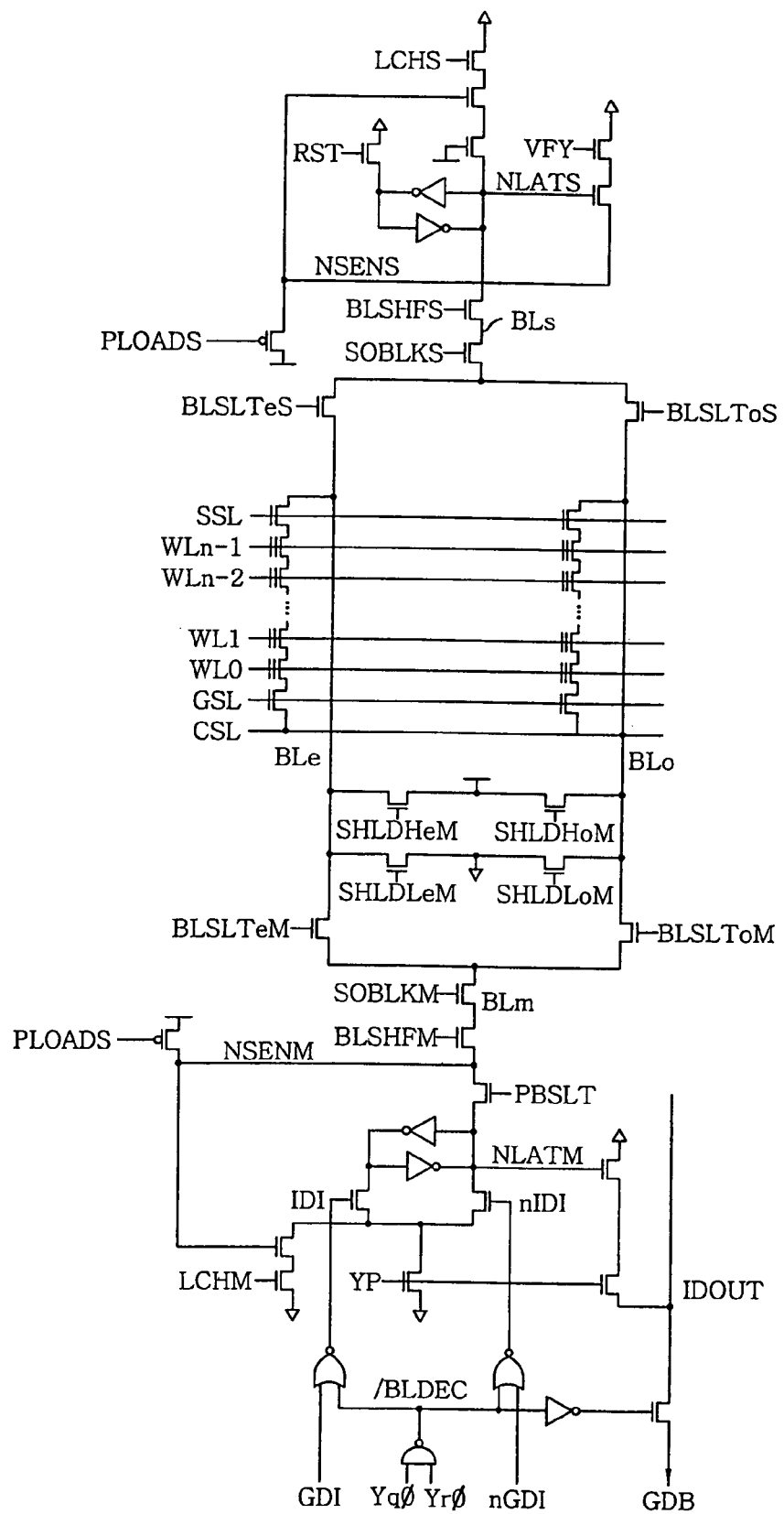
FIG. 25 is a circuit diagram of a multi-bit nonvolatile memory device according to another embodiment of the present invention.

Further, as already suggested, it is not necessary or essential to include each and every element of the exemplary embodiments to realize the benefits and advantages of the present invention. As one example only, attention is direct to FIG. 25 which illustrates a modification of the embodiment shown in FIG. 17. Specifically, the embodiment of FIG. 25 omits the biasing circuitry found in the sub-bit line selection block 500 of FIG. 17. Many other variations of the invention, too numerous to list herein, will be readily contemplated by those of ordinary skill in the art.

Therefore, the technical scope of protection of the present invention is to be defined by the technical spirit of the accompanying claims, not the disclosed embodiments. In this regard, the phrase "connected to" and similar such phrases are not to be interpreted as requiring direct connection between elements.

What is claimed is:

1. A multi-bit nonvolatile semiconductor memory device, comprising:
   a memory cell array including a bit line connected to a plurality of nonvolatile memory cells, wherein the nonvolatile memory cells are programmable in more than two threshold voltage states in order to store more than one bit of data;
   a page buffer circuit which stores a logic value as main latch data and which is responsive to a main latch signal to selectively flip the logic value of the main latch data according to a voltage level of the bit line; and
   a sub-latch circuit which stores a logic value as sub-latch data and which is responsive to a sub-latch signal to selectively flip the logic value of the sub-latch data according to the voltage level of the bit line;
   wherein the memory device is operable in a read mode which reads the threshold voltage state of the nonvolatile memory cells and a programming mode which programs the threshold voltage state of the non-volatile memory cells, wherein the page buffer circuit is selectively responsive to the sub-latch data to inhibit flipping of the logic value of the main latch data in the programming mode through the bit line.

2. The memory device of claim 1, wherein only the page buffer circuit among the page buffer and sub-latch circuits is used in the read mode, and both the page buffer and sub-latch circuits are used in the programming mode.

3. The memory device of claim 1, wherein the programming mode includes a first bit data value programming operation and a second bit data value programming operation, and wherein, during the programming mode, the sub-latch signal is activated after the first bit data value programming operation and before the second bit data value programming operation.

4. The memory device of claim 1, wherein the sub-latch circuit comprises:

a sub-sensing node connected to the bit line;

a sub-sensing latch unit which stores the sub-latch data according to a voltage level of the sub-sensing node; and a sub-driving unit which is selectively enabled in response to the sub-latch data and which is responsive to a verification control signal to drive the sub-sensing node to a sub-driving voltage to inhibit flipping of the logic value of the main latch data.

5. The memory device of claim 4, wherein the sub-driving unit comprises a first sub-driving transistor and a second sub-driving transistor connected in series between the sub-sensing node and a sub-driving voltage source, wherein the first sub-driving transistor is gated in response to the verification control signal, and the second sub-driving transistor is gated in response to the sub-latch data.

6. The memory device of claim 5, wherein the sub-driving voltage is a ground voltage.

7. The memory device of claim 5, wherein the sub-latch circuit further comprises a sub-pre-charge unit which is responsive to a sub-sensing pre-charge control signal to pre-charge the sub-sensing node to a sub-sensing pre-charge voltage.

8. The multi-bit nonvolatile semiconductor memory device according to claim 7, wherein the sub-sensing pre-charge voltage is a supply voltage, and wherein the sub-pre-charge unit includes a transistor connected between a supply voltage source and the sub-sensing node and gated in response to the sub-sensing pre-charge signal.

9. The memory device of claim 4, wherein the sub-sensing latch unit comprises:

a sub-latch which stores the sub-latch data;

a sub-latch initialization circuit which initializes the sub-latch data in response to a sub-latch initialization signal; and a sub-sensing response circuit which is enabled in response to the sub-latch signal and which is driven to selectively flip the logic value of the sub-latch data in accordance with the voltage level of the sub-sensing node.

10. The memory device of claim 1, further comprising:

a first global input line which transmits first global input data;

a second global input line which transmits second global input data, wherein a logic state of the first global input data is opposite to that of the second global input data during a given operation interval; and a page buffer decoder which is connected to the first and second global input lines and which provides internal input data to the main buffer circuit according to the first and second global input data.

11. The memory device of claim 10, further comprising:

an internal output line which selectively outputs data corresponding to the main latch data of the page buffer circuit and which is connected to the page buffer decoder;

a global output line which is responsive to the page buffer decoder to selectively output global output data corresponding to the internal output data, wherein the page buffer circuit includes a main latch node which stores the main latch data, and wherein the page buffer circuit is responsive to the internal input data from the page buffer decoder to control the logic value of the main latch data on the main latch node, and wherein the internal output line is electrically isolated from the main latch node.

12. The memory device of claim 1, further comprising a main bit line selection bias circuit which biases the voltage of the bit line and which selectively connects the bit line to the page buffer circuit.

13. The memory device of claim 12, further comprising a sub-bit line selection bias circuit which biases the voltage of the bit line and which selectively connects the bit line to the sub-latch circuit.

14. The memory device of claim 13, wherein the bit line of the memory cell array comprises an odd bit line and an even bit line.

15. The memory device of claim 1, wherein the nonvolatile memory cells are programmable into four threshold voltage states.

16. The memory device of claim 1, wherein the nonvolatile memory cells are NAND-type flash memory cells.

17. A non-volatile semiconductor memory device, comprising:

a memory cell array comprising a bit line connected to a plurality of non-volatile memory cells;

a main sensing latch unit which comprises a main latch unit and a main sensing response unit;

a sub-latch unit which comprises a sub-latch circuit;

a first bit line selection circuit which selectively connects the main sensing unit to the bit line;

a second bit line selection circuit which selectively connects the sub-latch unit to the bit line.

18. The memory device of claim 17, wherein the first and second bit line selection circuits are located at opposite sides of the memory cell array.

19. The memory device of claim 18, wherein the plurality of non-volatile memory cells are selectively programmable in any one of at least four threshold voltage states, wherein the memory device is operable in a read mode which reads a threshold voltage state of the non-volatile memory cells and a programming mode which programs a threshold voltage state of the non-volatile memory cells.

20. The memory device of claim 19, wherein only the first latch circuit among the first and second latch circuits is used in the read mode, and both the first and second latch circuits are used in the programming mode.

21. The memory device of claim 19, wherein, in the programming mode, a voltage of the second latch circuit is selectively transferred via the bit line to the page buffer unit to control a state of the first latch circuit.

22. The memory device of claim 17, further comprising a least one voltage bias circuit which presets a voltage of the bit line.

23. The memory device of claim 17, further comprising first and second voltage bias circuits which preset a voltage of the bit line and which are connected to the bit line at opposite sides of the memory cell array.

24. The memory device of claim 17, wherein the non-volatile memory cells are NAND-type flash memory cells.

25. A method of operating a multi-bit nonvolatile semiconductor memory device, the memory device including a memory cell array including a bit line connected to a plurality of nonvolatile memory cells, wherein the nonvolatile memory cells are selectively programmable in more than one threshold voltage state, and wherein each threshold voltage state corresponds to a different data value, wherein the memory device is operable in a read mode which reads the threshold voltage state of the non-volatile memory cells and a programming mode which programs the threshold voltage state of the non-volatile memory cells, said method comprising:

storing a logic value as main latch data in a first latch;
storing a logic value as sub-latch data in a second latch according to the voltage level of the bit line;
setting a threshold voltage state of at least one nonvolatile memory cell connected to the bit-line in the programming mode; and
selectively inhibiting flipping of the logic value of the main latch data after setting the threshold voltage state according to the voltage level of the bit line stored in the sub-latch data of the second latch.

26. The method of claim 25, wherein only the page buffer circuit among the page buffer and sub-latch circuits is used in the read mode, and both the page buffer and sub-latch circuits are used in the programming mode.

27. A method of operating a multi-bit nonvolatile semiconductor memory device, wherein the memory device includes (a) a memory cell array including a bit line connected to a plurality of nonvolatile memory cells, wherein the nonvolatile memory cells are selectively programmable in any one of at least successive first, second, third and fourth threshold voltage states, and wherein the first, second, third and fourth threshold voltage states correspond to four different data values defined by first and second bits, wherein first bit of the first and fourth threshold voltage states is the same, and wherein the second bit of the first and second threshold voltage states is the same, (b) a main buffer unit which stores a logic value as main latch data and which includes a main sensing node which is connected to the bit line, wherein the logic value of the main latch data is selectively flipped according to a voltage level of the main sensing node, and (c) a sub-latch unit which stores a logic value as sub-latch data and which includes a sub-sensing node which is connected to the bit line, said method comprising:
a first bit program operation which includes programming a selected memory cell to a threshold voltage corresponding to the first data state with an externally supplied first bit data value;
an initial read storage operation which includes driving the memory cell programmed in the first bit program operation to a first reference voltage to store sub-latch data corresponding to the first bit data value in the sub-latch block;
a second bit program operation which includes storing main latch data corresponding to a second bit data value used to program the memory cell to the fourth data state in the main buffer block and programming the memory cell to the fourth data state after the initial read storage operation, thereby programming the memory cell to a threshold voltage corresponding to the third data state;
a primary verification read operation which includes driving the memory cell with a second reference voltage so as to reflect the second bit data value of the memory cell on the main sensing node after the second bit program operation;
a sub-latch driving program operation which includes driving the sub-latch block so as to reflect the sub-latch data stored in the initial read storage operation on the main sensing node;
a primary main latch flip operation which includes flipping the main latch data according to a voltage level of the main sensing node in the primary verification read operation, wherein the flipping of the main latch data is selectively inhibited according to the voltage level of the main sensing node in the sub-latch driving operation;
a secondary verification read program operation which includes driving the memory cell with a third reference voltage so as to reflect the second bit data value of the memory cell on the main sensing node after the primary main latch flip operation; and
a secondary main latch flip operation which includes flipping the main latch data according to the voltage level of the main sensing node in the secondary verification read read program operation.

28. The method of claim 27, comprising using the first to third reference voltages to distinguish the first to fourth threshold voltage groups.

29. The method of claim 27, further comprising a verification scan operation which includes generating data, based on the main latch data obtained by the execution of the primary and secondary main flip operations, indicating that a programming failure of the memory cell to the fourth data state in the second bit program operation.

30. The method of claim 27, wherein the initial read storage operation comprises:
an initial read operation which includes driving the memory cell programmed in the first bit program operation to reflect the first bit data value on the bit line; and
a sub-latch storage operation which includes performing a control operation so that the sub-latch data, corresponding to the voltage level of the bit line obtained by execution of the initial read operation, is stored in the sub-latch block.

31. The method of claim 27, wherein the first to fourth data states are "11", "10", "00" and "01", respectively.

32. A method of operating a multi-bit nonvolatile semiconductor memory device, wherein the memory device includes (a) a memory cell array including a bit line connected to a plurality of nonvolatile memory cells, wherein the nonvolatile memory cells are selectively programmable in any one of at least successive first, second, third and fourth threshold voltage states, and wherein the first, second, third and fourth threshold voltage states correspond to four different data values defined by first and second bits, wherein first bit of the first and fourth threshold voltage states is the same, and wherein the second bit of the first and second threshold voltage states is the same, (b) a main buffer unit which stores a logic value as main latch data and which includes a main sensing node which is connected to the bit line, wherein the logic value of the main latch data is selectively flipped according to a voltage level of the main sensing node, and (c) a sub-latch unit which stores a logic value as sub-latch data and which includes a sub-sensing node which is connected to the bit line, said method comprising:
a first bit program operation which includes programming a selected memory cell with an externally supplied first bit data value;
an initial read storage operation which includes driving the memory cell programmed in the first bit program step to store sub-latch data corresponding to the first bit data value in the sub-latch block;
a second bit program operation which includes driving the memory cell to program an externally supplied second bit data value in the memory cell after the initial read storage operation;
a primary verification read operation which includes driving the memory cell with a second reference voltage so as to reflect a second bit data value of the memory cell on the main sensing node after the second bit program operation;

a sub-latch driving operation which includes driving the sub-latch block so as to reflect the sub-latch data, stored in the initial read storage step, on the main sensing node; and a primary main flip operation which includes selectively flipping the main latch data according to the voltage level of the main sensing node obtained in the primary verification read operation and the sub-latch driving operation.

33. The method of claim 32, comprising using the first and second reference voltages to distinguish the first to third threshold voltage states.

34. The method of claim 32, wherein the initial read storage operation comprises:

an initial read operation which includes driving the memory cell programmed in the first bit program operation to reflect the first bit data value on the bit line; and a sub-latch storage operation which includes performing a control operation so that the sub-latch data, corresponding to the voltage level of the bit line obtained by the initial read operation, is stored in the sub-latch block.

35. The method of claim 34, wherein the initial read operation comprises:

a first reference voltage driving operation which includes driving the memory cell with a first reference voltage, the first reference voltage distinguishing the first and second threshold voltage states from each other; and a bit line reflection operation which includes reflecting the first bit data value on the bit line, the first bit data value being read at the first reference voltage driving operation.

36. The method of claim 34, wherein the sub-latch storage operation comprises:

a sub-latch initialization operation which includes initializing the sub-latch data; and a sub-latch flip operation which includes selectively flipping the sub-latch data according to the voltage level of the bit line.

37. The method of claim 36, wherein the sub-latch flip operation comprises:

maintaining the initialized sub-latch data without change if the first bit data value of the first data state is reflected on the bit line; and flipping the initialized sub-latch data if the first bit data value of the second data state is reflected on the bit line.

38. The method of claim 32, wherein the first to fourth data states are "11", "10", "00" and "01", respectively.

39. A method of operating a multi-bit nonvolatile semiconductor memory device, wherein the memory device includes (a) a memory cell array including a bit line connected to a plurality of nonvolatile memory cells, wherein the nonvolatile memory cells are selectively programmable in any one of at least successive first, second, third and fourth threshold voltage states, and wherein the first, second, third and fourth threshold voltage states correspond to four different data values defined by first and second bits, wherein first bit of the first and fourth threshold voltage states is the same, and wherein the second bit of the first and second threshold voltage states is the same, (b) a main buffer unit which stores a logic value as main latch data and which includes a main sensing node which is connected to the bit line, wherein the logic value of the main latch data is selectively flipped according to a voltage level of the main sensing node, and (c) a sub-latch unit which stores a logic value as sub-latch data and which includes a sub-sensing node which is connected to the bit line, said method comprising:

a first bit program operation which includes programming a selected memory cell with an externally supplied first bit data value;

an initial read storage operation which includes driving the memory cell programmed at the first bit program operation to store sub-latch data corresponding to the first bit data value in the sub-latch block;

a second bit program which includes driving the memory cell to program an externally supplied second bit data value in the memory cell after the initial read storage operation;

a primary verification read operation which includes driving the memory cell with a second reference voltage so as to reflect the second bit data value of the memory cell on the main sensing node after the second bit program operation;

a sub-latch driving operation which includes driving the sub-latch block so as to reflect the sub-latch data stored in the initial read storage step on the main sensing node;

a primary main flip operation which includes selectively flipping the main latch data according to the voltage level of the main sensing node obtained in the primary verification read operation and the sub-latch driving operation;

a secondary verification read operation which includes driving the memory cell with a third reference voltage so as to reflect the second bit data value of the memory cell on the main sensing node after the primary main flip operation; and a secondary main flip operation which includes selectively flipping the main latch data according to the voltage level of the main sensing node obtained in the secondary verification read step.

40. The method of claim 39, comprising using the first to third reference voltages are voltage levels to distinguish the first to fourth threshold voltage states.

41. The method of claim 39, further comprising a verification scan operation which includes generating data indicative of a pass or failure in the second bit program operation according to the main latch data obtained by execution of the primary and secondary main flip operations.

42. The method of claim 39, wherein the initial read storage operation comprises:

an initial read operation which includes driving the memory cell programmed in the first bit program operation to reflect the first bit data value on the bit line; and a sub-latch storage operation which includes storing sub-latch data, corresponding to the voltage level of the bit line obtained by execution of the initial read operation, in the sub-latch block.

43. The method of claim 42, wherein the initial read operation comprises:

a first reference voltage driving operation which includes driving the memory cell with a first reference voltage, the first reference voltage distinguishing the first and second threshold voltage states from each other; and a bit line reflection operation which includes reflecting the first bit data value on the bit line, the first bit data value being read in the first reference voltage driving step.

* * * * *